United States Patent
Shimomura

(10) Patent No.: US 9,466,725 B2
(45) Date of Patent: Oct. 11, 2016

(54) SEMICONDUCTOR DEVICE AND METHOD FOR MANUFACTURING THE SAME

(71) Applicant: Semiconductor Energy Laboratory Co., Ltd., Atsugi-shi, Kanagawa-ken (JP)

(72) Inventor: Akihisa Shimomura, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 122 days.

(21) Appl. No.: 14/156,892

(22) Filed: Jan. 16, 2014

(65) Prior Publication Data

US 2014/0203277 A1    Jul. 24, 2014

(30) Foreign Application Priority Data

Jan. 24, 2013    (JP) .................................. 2013-010829

(51) Int. Cl.
*H01L 29/10*    (2006.01)
*H01L 29/786*    (2006.01)
*H01L 29/51*    (2006.01)
(Continued)

(52) U.S. Cl.
CPC ....... *H01L 29/7869* (2013.01); *H01L 29/4916* (2013.01); *H01L 29/511* (2013.01); *H01L 29/66969* (2013.01)

(58) Field of Classification Search
CPC ....................... H01L 29/7869; H01L 29/4916
USPC ......................................................... 257/43
See application file for complete search history.

(56) References Cited

U.S. PATENT DOCUMENTS 5,731,856 A    3/1998   Kim et al.
5,744,864 A    4/1998   Cillessen et al.
(Continued)

FOREIGN PATENT DOCUMENTS

EP    1737044 A    12/2006
EP    2226847 A    9/2010
(Continued)

OTHER PUBLICATIONS

Song et al., "Short Channel Characteristics of Gallium—Indium—Zinc—Oxide Thin Film Transistors for Three-Dimensional Stacking Memory," IEEE Electron Device Letters, Jun. 1, 2008, vol. 29, No. 6, pp. 549-552.

(Continued)

*Primary Examiner* — David Vu
*Assistant Examiner* — Brandon Fox
(74) *Attorney, Agent, or Firm* — Robinson Intellectual Property Law Office; Eric J. Robinson

(57) ABSTRACT

A miniaturized transistor having high electrical characteristics can be provided with high yield. High performance, high reliability, and high productivity of a semiconductor device including the transistor can be achieved. The semiconductor device includes a gate electrode over an insulating surface; a base insulating film which is over the insulating surface and from which the gate electrode protrudes; a gate insulating film over the base insulating film and the gate electrode; an oxide semiconductor film over the gate insulating film; and a source electrode and a drain electrode in contact with an oxide semiconductor film. The thickness of the oxide semiconductor film is smaller than the difference between the thickness of the gate electrode and the thickness of the base insulating film.

20 Claims, 37 Drawing Sheets

(51) Int. Cl.
  *H01L 29/49* (2006.01)
  *H01L 29/66* (2006.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 8,058,645 B2 | 11/2011 | Jeong et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0240998 A1* | 10/2011 | Morosawa ........ H01L 29/41733 257/57 |
| 2012/0061670 A1 | 3/2012 | Suzawa et al. |
| 2012/0119205 A1* | 5/2012 | Taniguchi ......... H01L 29/78693 257/43 |
| 2014/0197408 A1* | 7/2014 | Tsuruma ............ H01L 29/7869 257/43 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 | 6/2006 |
| JP | 2006-165528 A | 6/2006 |
| JP | 2012-160679 | 8/2012 |
| WO | WO-2004/114391 | 12/2004 |

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2006, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

(56) References Cited

OTHER PUBLICATIONS

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MoO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits, 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The"Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by PEALD Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

(56) References Cited

OTHER PUBLICATIONS

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka,Y et al., "29.1: Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clarks et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

Song.I et al., "Short Channel Characteristics of Gallium—Indium—Zinc—Oxide Thin Film Transistors for Three-Dimensional Stacking Memory,", IEEE Electron Device Letters, Jun. 1, 2008, vol. 29, No. 6, pp. 549-552.

* cited by examiner untouched input voltage waveform output current waveform touched input voltage waveform output current waveform

SEMICONDUCTOR DEVICE AND METHOD FOR MANUFACTURING THE SAME

BACKGROUND OF THE INVENTION

1. Field of the Invention

The present invention relates to a product (including a machine, a manufacture, and a composition of matter) and a process (including a simple process and a production process). In particular, one embodiment of the present invention relates to, a semiconductor device, a display device, a light-emitting device, a power storage device, a driving method thereof, or a manufacturing method thereof. In particular, one embodiment of the present invention relates to a semiconductor device including an oxide semiconductor, a display device including an oxide semiconductor, or a light-emitting device including an oxide semiconductor.

2. Description of the Related Art

Transistors used for most flat panel displays typified by a liquid crystal display device and a light-emitting display device are formed using silicon semiconductors such as amorphous silicon, single crystal silicon, and polycrystalline silicon provided over glass substrates. Further, transistors formed using such silicon semiconductors are used in integrated circuits (ICs) and the like.

In recent years, attention has been drawn to a technique in which, instead of a silicon semiconductor, a metal oxide exhibiting semiconductor characteristics is used for transistors. Note that in this specification, a metal oxide exhibiting semiconductor characteristics is referred to as an oxide semiconductor.

For example, a transistor formed using zinc oxide or an In—Ga—Zn-based oxide semiconductor as an oxide semiconductor is disclosed (see Patent Document 1).

A homologous compound represented by $InMO_3(ZnO)_m$ (M is Fe, Ga, or Al, and m is a natural number) is known (see Non-Patent Document).

REFERENCE

Patent Document

[Patent Document 1] Japanese Published Patent Application No. 2006-165528

Non-Patent Document

[Non-Patent Document 1] N. Kimizuka, M. Isobe, and M. Nakamura, "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—$ZnO$ System", *J. Solid State Chem.*, 1995, Vol. 116, pp. 170-178

SUMMARY OF THE INVENTION

In a transistor including an oxide semiconductor, in the case where a material of a conductive film to be a source electrode or a drain electrode in contact with an oxide semiconductor film is more likely to be bonded to oxygen than a metal element contained in the oxide semiconductor film is, oxygen in the oxide semiconductor film is diffused to the conductive material side which is more likely to be bonded to oxygen than the metal element contained in the oxide semiconductor film is. The diffusion causes oxygen vacancy in a region of the oxide semiconductor film near the interface with the conductive film. Oxygen vacancy is also caused by damage to the top surface of the oxide semiconductor film which is caused when the conductive film to be the source electrode or the drain electrode is formed over the oxide semiconductor film. A low-resistance region is formed owing to the oxygen vacancy, so that contact resistance between the oxide semiconductor film and each of the source electrode and the drain electrode is reduced. Accordingly, conductivity is improved, resulting in high speed operation of the transistor. However, the conductive film is also in contact with a channel formation region in the oxide semiconductor film, and thus oxygen vacancy is also caused in a region of the channel formation region near the interface with the conductive film, which leads to poor electrical characteristics of the transistor.

Thus, an object of one embodiment of the present invention is to provide a semiconductor device or the like in which oxygen vacancy in a channel formation region in an oxide semiconductor film is reduced.

In order to achieve high-speed operation, low power consumption, high integration, or the like of a transistor, it is necessary to miniaturize a transistor.

Another object of one embodiment of the present invention is to provide a semiconductor device or the like which achieves high-speed response and high-speed operation by improving on characteristics (e.g., on-state current or field-effect mobility) of a miniaturized transistor, and to provide a manufacturing method thereof, in order to achieve a high-performance semiconductor device.

Further, in accordance with miniaturization of the transistor, concern about a decrease in yield of a manufacturing process rises.

Another object of one embodiment of the present invention is to provide a miniaturized transistor having high electrical characteristics with high yield.

Another object of one embodiment of the present invention is to achieve high performance, high reliability, and high productivity of a semiconductor device or the like including the transistor.

Another object of one embodiment of the present invention is to provide a novel semiconductor device or the like.

Note that one embodiment of the present invention achieves at least one of the above objects.

One embodiment of the present invention is a semiconductor device including a gate electrode over an insulating surface; a base insulating film which is over the insulating surface and from which the gate electrode protrudes; a gate insulating film over the base insulating film and the gate electrode; an oxide semiconductor film over the gate insulating film; and a source electrode and a drain electrode in contact with the oxide semiconductor film. The thickness of the oxide semiconductor film is smaller than the difference between the thickness of the gate electrode and the thickness of the base insulating film.

In the above structure, a first insulating film is provided over the source electrode and the drain electrode, and end portions of the first insulating film are aligned with an end portion of the source electrode and an end portion of the drain electrode.

In the above structure, a second insulating film is provided over the oxide semiconductor film and the first insulating film.

In the above structure, the oxide semiconductor film includes a channel formation region and a pair of low-resistance regions between which the channel formation region is positioned.

In the above structure, the oxide semiconductor film has a depressed portion.

Another embodiment of the present invention is a method for manufacturing a semiconductor device which includes the following steps: forming a gate electrode over an insulating surface; forming a gate insulating film over the insulating surface and the gate electrode; forming an oxide semiconductor film over the gate insulating film; forming a conductive film over the oxide semiconductor film; forming a first insulating film over the conductive film; planarizing the first insulating film to expose a region of the conductive film which overlaps with the gate electrode, so that a second insulating film is formed over the conductive film; and etching the conductive film using the second insulating film as a mask, so that a source electrode and a drain electrode are formed.

Another embodiment of the present invention is a method for manufacturing a semiconductor device which includes the following steps: forming a gate electrode over an insulating surface; forming a base insulating film over the insulating surface so that the gate electrode protrudes from the base insulating film; forming a gate insulating film over the base insulating film and the gate electrode; forming an oxide semiconductor film over the gate insulating film; forming a conductive film over the oxide semiconductor film; forming a first insulating film over the conductive film; planarizing the first insulating film to expose a region of the conductive film which overlaps with the gate electrode, so that a second insulating film is formed over the conductive film; and etching the conductive film using the second insulating film as a mask, so that a source electrode and a drain electrode are formed.

In the above manufacturing method, the base insulating film is formed by forming a first base insulating film over the insulating surface and the gate electrode, planarizing the first base insulating film to expose the gate electrode, and etching the planarized first base insulating film.

In the above manufacturing method, after the first insulating film is planarized, the second insulating film is formed by etching the first insulating film.

In the above manufacturing method, the first insulating film is etched so that the etched thickness of the first insulating film is greater than or equal to that of the oxide semiconductor film and smaller than that of the first insulating film which is over the exposed conductive film and overlaps with the oxide semiconductor film.

In the above manufacturing method, oxygen is added to the oxide semiconductor film using the source electrode and the drain electrode as a mask, so that a channel formation region and a pair of low-resistance regions between which the channel formation region is positioned are formed.

In the above manufacturing method, the surface of a region of the oxide semiconductor film which overlaps with the gate electrode is etched and removed using the source electrode and the drain electrode as a mask, so that a channel formation region and a pair of low-resistance regions between which the channel formation region is positioned are formed.

In the above manufacturing method, a third insulating film is formed over the oxide semiconductor film and the second insulating film.

With a structure or a manufacturing method of one embodiment of the present invention, oxygen vacancy in the channel formation region in the oxide semiconductor film can be reduced. In addition, electrical characteristics of a semiconductor device including the oxide semiconductor can be improved. Further, a miniaturized transistor having high electrical characteristics can be provided with high yield. Furthermore, also in a semiconductor device including the transistor, high performance, high reliability, and high productivity can be achieved.

DETAILED DESCRIPTION OF THE INVENTION

Figure 1A:
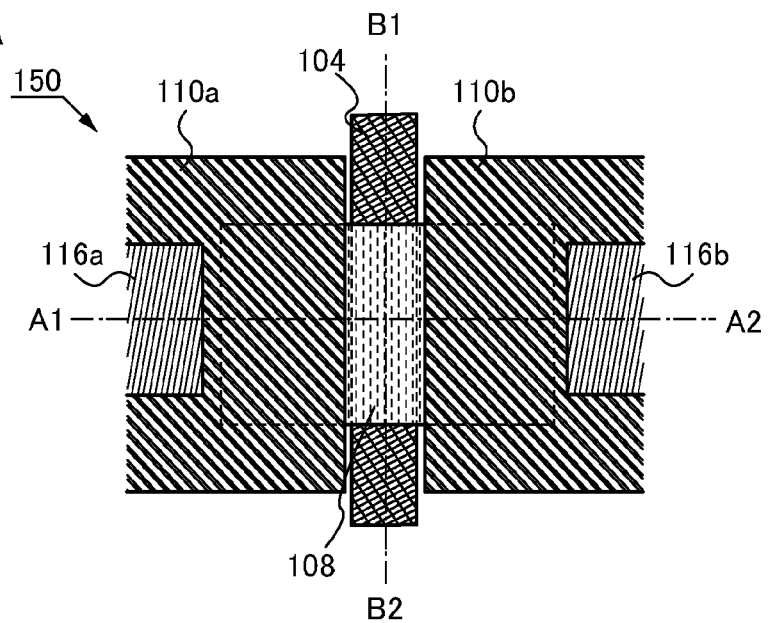
FIGS. 1A to 1C are a top view and cross-sectional views which illustrate a transistor.

Embodiments are described in detail with reference to drawings. Note that the present invention is not limited to the following description and it is readily appreciated by those skilled in the art that modes and details can be modified in various ways without departing from the spirit and the scope of the present invention. Therefore, the present invention should not be interpreted as being limited to the description of embodiments below. Note that in structures of the present invention described below, the same portions or portions having similar functions are denoted by the same reference numerals in different drawings, and description thereof is not repeated in some cases.

Note that functions of a "source" and a "drain" of a transistor are sometimes replaced with each other when a transistor of opposite polarity is used or when the direction of current flowing is changed in circuit operation, for example. Therefore, the terms "source" and "drain" can be replaced with each other in this specification.

In this specification, a term "parallel" indicates that the angle formed between two straight lines is greater than or equal to −10° and less than or equal to 10°, and accordingly includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

In this specification, trigonal and rhombohedral crystal systems are included in a hexagonal crystal system.

(Embodiment 1)

In this embodiment, an example of a transistor that is a semiconductor device of one embodiment of the present invention is described with reference to drawings.

[1-1 Transistor Structure (1)]

Figure 1B:
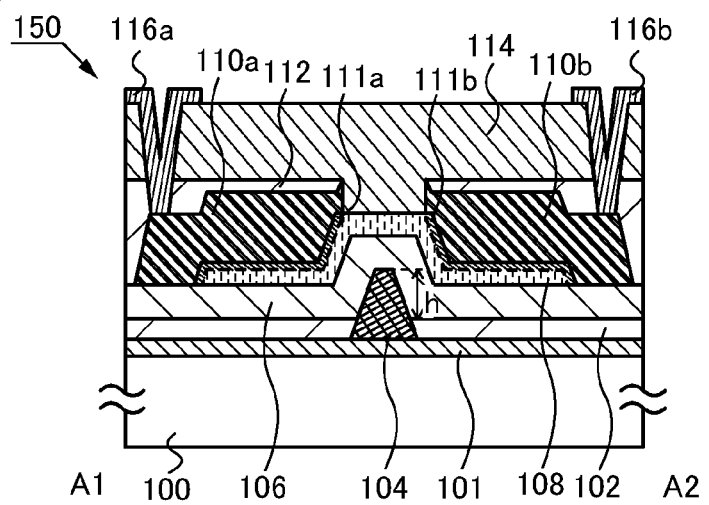
Figure 1C:
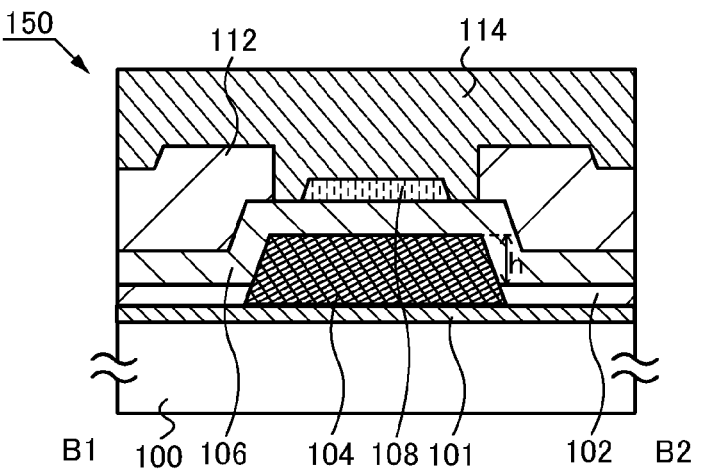

FIGS. 1A to 1C are a top view and cross-sectional views of a transistor 150 of one embodiment of the present invention. FIG. 1A is a top view, FIG. 1B is a cross-sectional view taken along dashed-dotted line A1-A2 in FIG. 1A, and FIG. 1C is a cross-sectional view taken along dashed-dotted line B1-B2 in FIG. 1A. Note that for simplification of the drawing, some components are not illustrated in the top view in FIG. 1A.

The transistor 150 in FIGS. 1A to 1C includes a base insulating film 101 over a substrate 100; a base insulating film 102 over the base insulating film 101; a gate electrode 104 which protrudes from the base insulating film 102; a gate insulating film 106 over the base insulating film 102 and the gate electrode 104; an oxide semiconductor film 108 over the gate insulating film 106; a source electrode 110a and a drain electrode 110b which are in contact with the oxide semiconductor film 108; an insulating film 112 over the source electrode 110a and the drain electrode 110b; an insulating film 114 over the oxide semiconductor film 108 and the insulating film 112; and a wiring 116a and a wiring 116b which are electrically connected to the source electrode 110a and the drain electrode 110b, respectively, through openings in the insulating film 112 and the insulating film 114. Oxygen is extracted from the oxide semiconductor film 108, so that a low-resistance region 111a and a low-resistance region 111b are formed near the interface between the oxide semiconductor film 108 and each of the source electrode 110a and the drain electrode 110b.

[1-1-1 Source Electrode 110a and Drain Electrode 110b]

The source electrode 110a and the drain electrode 110b can be formed using a conductive material which is more likely to be bonded to oxygen than a metal material included in the oxide semiconductor film is. For example, Al, Cr, Cu, Ta, Ti, Mo, W, Ti, or the like can be used. W (tungsten) having a high melting point is especially preferred because a relatively high process temperature can be employed in a later step. An example of the conductive material which is more likely to be bonded to oxygen than a metal material included in the oxide semiconductor film is includes a material to which oxygen is easily diffused. In the case where Ti is used for the source electrode 110a and the drain electrode 110b, Ti tends to be diffused by heating to the oxide semiconductor film in contact with the source electrode 110a and the drain electrode 110b, which promotes the formation of a low-resistance region. A plurality of the above materials such as Cu may be stacked over W.

[1-1-2 Low-resistance Regions 111a and 111b]

Since a material of a conductive film to be the source electrode 110a and the drain electrode 110b is more likely to be bonded to oxygen than a metal element contained in the oxide semiconductor film is, oxygen in the oxide semiconductor film 108 is diffused to the conductive material side which is more likely to be bonded to oxygen. The diffusion causes oxygen vacancy in a region of the oxide semiconductor film 108 near the interface with the conductive film. Oxygen vacancy is also caused by damage to the top surface of the oxide semiconductor film 108 which is caused when the conductive film is formed over the oxide semiconductor film 108. Regions whose resistances are reduced owing to the oxygen vacancy, i.e., the low-resistance regions 111a and 111b are formed, resulting in a reduction in the contact resistance between the oxide semiconductor film 108 and each of the source electrode 110a and the drain electrode 110b.

A channel formation region of the transistor 150 is between the low-resistance regions 111a and 111b in the oxide semiconductor film 108. The channel formation region of the transistor 150 is in contact with the conductive film until the source electrode 110a and the drain electrode 110b are formed; thus, the channel formation region of the transistor 150 has lowered resistance (in other words, the channel formation region has n-type conductivity). Thus, the impurity concentration of the oxide semiconductor film needs to be lowered so that the oxide semiconductor film is highly purified to be intrinsic. Obtaining a highly purified intrinsic oxide semiconductor film refers to making the oxide semiconductor film be an intrinsic or substantially intrinsic oxide semiconductor film. The term "substantially intrinsic" refers to the state where an oxide semiconductor film has a carrier density lower than $1 \times 10^{17}/cm^3$, preferably lower than $1 \times 10^{15}/cm^3$, further preferably lower than $1 \times 10^{13}/cm^3$.

In order that the channel formation region of the transistor 150 is a highly purified to be intrinsic, oxygen is added to the oxide semiconductor film 108. The addition of oxygen can reduces oxygen vacancy, so that a highly purified intrinsic region can be formed. Thus, a highly purified intrinsic region and low-resistance regions can be formed in a self-aligned manner.

In the case where the base insulating film 102, the gate insulating film 106, and the insulating film 114 contain excess oxygen, heat treatment can be performed to promote the release of oxygen from the base insulating film 102, the gate insulating film 106, and the insulating film 114, so that oxygen vacancy in the oxide semiconductor film 108 can be reduced. Accordingly, oxygen vacancy in the channel formation region in the oxide semiconductor film 108 is further reduced, so that the channel formation region is a highly purified intrinsic region.

Oxygen vacancy in the oxide semiconductor film 108 forms defect levels, and some of the defect levels become donor levels. Thus, by a reduction in oxygen vacancy in the oxide semiconductor film 108 (particularly, the channel region), the carrier density of the oxide semiconductor film 108 (particularly, the channel region) can be reduced, whereby the transistor can have stable electrical characteristics.

Here, the amount of oxygen released from the films by heat treatment may be higher than or equal to $1 \times 10^{18}$ atoms/cm$^3$, higher than or equal to $1 \times 10^{19}$ atoms/cm$^3$, or higher than or equal to $1 \times 10^{20}$ atoms/cm$^3$ (converted into the number of oxygen atoms) in thermal desorption spectrometry (TDS) analysis performed such that the surface temperature is higher than or equal to 100° C. and lower than or equal to 700° C., preferably higher than or equal to 100° C. and lower than or equal to 500° C.

Further, the films from which oxygen is released by heat treatment may contain a peroxide radical. Specifically, the spin density attributed to the peroxide radical is greater than or equal to $5 \times 10^{17}$ spins/cm$^3$. Note that the film containing a peroxide radical may have an asymmetric signal with a g factor of approximately 2.01 in electron spin resonance (ESR).

The insulating film containing excess oxygen may be formed using oxygen-excess silicon oxide (SiO$_x$ (X>2)). In the oxygen-excess silicon oxide (SiO$_x$ (X>2)), the number of oxygen atoms per unit volume is more than twice the number of silicon atoms per unit volume. The number of silicon atoms and the number of oxygen atoms per unit volume are measured by Rutherford backscattering spectrometry (RBS).

[1-1-3 Base Insulating Film 102, Gate Electrode 104, and Insulating Film 112]

The base insulating film 102 and the insulating film 112 are formed using a single layer selected from a silicon oxide film, a gallium oxide film, a zinc oxide film, an aluminum oxide film, a gallium zinc oxide film, a silicon nitride film, a silicon oxynitride film, an aluminum oxynitride film, and a silicon nitride oxide film or a stack of any of the films. An oxide insulating film formed by a chemical vapor deposition (CVD) method using an organosilane gas can also be used as the base insulating film 102 and the insulating film 112.

As the base insulating film 102 and the insulating film 112, a silicon oxide film formed by a CVD method using an organosilane gas is provided. As the organosilane gas, any of the following silicon-containing compound can be used: tetraethyl orthosilicate (TEOS) (chemical formula: Si(OC$_2$H$_5$)$_4$); tetramethylsilane (TMS) (chemical formula: Si(CH$_3$)$_4$); tetramethylcyclotetrasiloxane (TMCTS); octamethylcyclotetrasiloxane (OMCTS); hexamethyldisilazane (HMDS); triethoxysilane (SiH(OC$_2$H$_5$)$_3$); trisdimethylaminosilane (SiH(N(CH$_3$)$_2$)$_3$); or the like. The deposition is preferably performed at a substrate temperature of 400° C. because degassing yield can be reduced.

For the gate electrode 104, a conductive film including a material such as Al, Ti, Cr, Co, Ni, Cu, Y, Zr, Mo, Ru, Ag, Ta, or W can be used. The gate electrode 104 may be a stack of any of the above materials.

The thickness of the base insulating film 102 is smaller than the difference between the thickness of the gate electrode 104 and the thickness of the oxide semiconductor film 108. Accordingly, a conductive film to be the source electrode 110a and drain electrode 110b is formed to have a step.

The height of the step of conductive film is changed depending on the height h of a part of the gate electrode 104 which protrudes from the base insulating film 102. As the height h increases, the height of the step increases. When the gate electrode 104 having a tapered end portion is seen from the direction parallel to the surface of the substrate 100, the taper angle refers to an inclination angle formed by the side surface of the gate electrode 104 and the bottom surface thereof. The taper angle of the gate electrode 104 is preferably large because the step of the conductive film becomes steeper and the channel length of the transistor 150 can be adjusted in a wider range by etching amount of an insulating film to be the insulating film 112. When the taper angle of the gate electrode 104 is too large, it is hard to miniaturize a semiconductor device. Thus, it is preferable to adjust the taper angle of the gate electrode 104 to optimal conditions.

The insulating film to be the insulating film 112 is etched so that the etched thickness of the insulating film is greater than or equal to the thickness of the oxide semiconductor film 108 and smaller than the height h of the part of the gate electrode 104 which protrudes from the base insulating film 102. In the case where the insulating film to be the insulating film 112 is etched so that the etched thickness is smaller than the thickness of the oxide semiconductor film 108, a region of the conductive film which overlaps with the gate electrode 104 is not fully etched, so that the source electrode 110a and the drain electrode 110b cannot be separated from each other. In the case where the insulating film to be the insulating film 112 is etched so that the etched thickness is greater than or equal to the height h of the part of the gate electrode 104 which protrudes from the base insulating film 102, a region of the conductive film which overlaps with the oxide semiconductor film 108 is etched so that the source electrode 110a and the drain electrode 110b are in contact with end portions of the oxide semiconductor film 108, and the contact areas become small, whereby the effect of contact resistance becomes extremely large.

The conductive film is selectively processed by utilizing the step of the conductive film and using the planarized insulating film 112 over the conductive film as a mask, so that the source electrode 110a and the drain electrode 110b can be formed in a self-aligned manner with high positional accuracy even in the case where the transistor is miniaturized.

[1-1-4 Substrate 100]

There is no large limitation on the substrate 100. For example, a glass substrate, a ceramic substrate, a quartz substrate, or a sapphire substrate may be used as the substrate 100. Alternatively, a single crystal semiconductor substrate or a polycrystalline semiconductor substrate made of silicon, silicon carbide, or the like, a compound semiconductor substrate made of silicon germanium or the like, a silicon-on-insulator (SOI) substrate, or the like may be used as the substrate 100. Still alternatively, any of these substrates provided with a semiconductor element may be used as the substrate 100.

In the case of using a large glass substrate such as the fifth generation (1000 mm×1200 mm or 1300 mm×1500 mm); the sixth generation (1500 mm×1800 mm); the seventh generation (1870 mm×2200 mm); the eighth generation (2200 mm×2500 mm); the ninth generation (2400 mm×2800 mm); or the tenth generation (2880 mm×3130 mm) as the substrate 100, microfabrication is difficult in some cases due to the shrinkage of the substrate 100, which is caused by heat treatment or the like in a manufacturing process of the semiconductor device. Therefore, in the case where the above-described large glass substrate is used as the substrate 100, a substrate whose shrinkage due to heat treatment is as less as possible is preferably used. For example, as the substrate 100, it is possible to use a large glass substrate in which the amount of shrinkage by heat treatment for one hour at 400° C., preferably 450° C., more preferably 500° C. is less than or equal to 10 ppm, preferably less than or equal to 5 ppm, more preferably less than or equal to 3 ppm.

Still alternatively, a flexible substrate may be used as the substrate 100. As a method of providing a transistor over a flexible substrate, there is a method in which a transistor is formed over a non-flexible substrate, and then the transistor is separated and transferred to the substrate 100 which is a flexible substrate. In that case, a separation layer is preferably provided between the non-flexible substrate and the transistor.

[1-1-5 Base Insulating Film 101]

The base insulating film 101 is formed using a single layer selected from a silicon oxide film, a gallium oxide film, a zinc oxide film, an aluminum oxide film, a gallium zinc oxide film, a silicon nitride film, a silicon oxynitride film, an aluminum oxynitride film, and a silicon nitride oxide film or a stack of any of the films. The base insulating film 101 can prevent entry of impurities from the substrate 100 side. Note that the base insulating film 101 is not necessarily provided.

The base insulating film 101 can have a function of supplying oxygen to the oxide semiconductor film 108 as well as a function of preventing diffusion of an impurity from the substrate 100; thus, the base insulating film 101 is preferably an insulating film containing oxygen, further preferably an insulating film containing excess oxygen. Note that in the case where the substrate 100 is a substrate where another device is formed as described above, the base insulating film 101 has also a function as an interlayer insulating film. In that case, the base insulating film 101 is preferably subjected to planarization treatment such as chemical mechanical polishing (CMP) treatment so as to have a flat surface.

[1-1-6 Gate Insulating Film 106]

The gate insulating film 106 may be formed using a single layer or a stacked layer of an insulating film containing one or more kinds of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

The gate insulating film 106 may be a stacked film including a silicon nitride film as a first layer and a silicon oxide film as a second layer. In this case, the silicon oxide film may be a silicon oxynitride film. The silicon nitride film may be a silicon nitride oxide film. It is preferable to use a silicon oxide film whose defect density is small as the silicon oxide film. Specifically, a silicon oxide film whose spin density attributed to a signal with a g factor of 2.001 in ESR is lower than or equal to $3\times10^{17}$ spins/cm$^3$, preferably lower than or equal to $5\times10^{16}$ spins/cm$^3$ is used. As the silicon oxide film, a silicon oxide film containing excess oxygen is preferably used. As the silicon nitride film, a silicon nitride film from which a hydrogen gas and an ammonia gas are less likely to be released is used. The amount of a released hydrogen gas or a released ammonia gas may be measured by TDS.

[1-1-7 Oxide Semiconductor Film 108]

The oxide semiconductor film 108 includes at least indium. The oxide semiconductor film 108 may include zinc in addition to indium, for example.

The influence of impurities in the oxide semiconductor film 108 is described below. In order to obtain stable electrical characteristics of a transistor, it is effective to reduce the concentration of impurities in the oxide semiconductor film 108 so that the oxide semiconductor film 108 becomes intrinsic or substantially intrinsic. Specifically, the carrier density of the oxide semiconductor film is preferably set to lower than $1\times10^{17}$/cm$^3$, lower than $1\times10^{15}$/cm$^3$, or lower than $1\times10^{13}$/cm$^3$. In the oxide semiconductor film, a light element, a semimetal element, a metal element, and the like (lower than 1 atomic %), other than main components serve as impurities. For example, hydrogen, nitrogen, carbon, silicon, and germanium serve as impurities in the oxide semiconductor film.

Further, in the oxide semiconductor film 108, hydrogen and nitrogen form donor levels, which increase carrier density. The concentration of hydrogen in the oxide semiconductor film 108, which is measured by secondary ion mass spectrometry (SIMS), is set to lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$. The concentration of nitrogen in the oxide semiconductor film 108, which is measured by SIMS, is set to be lower than $5\times10^{19}$ atoms/cm$^3$, preferably lower than or equal to $5\times10^{18}$ atoms/cm$^3$, more preferably lower than or equal to $1\times10^{18}$ atoms/cm$^3$, still more preferably lower than or equal to $5\times10^{17}$ atoms/cm$^3$.

It is preferable to reduce the concentrations of hydrogen and nitrogen in the gate insulating film 106 which is in contact with the oxide semiconductor film 108 in order to reduce the concentrations of hydrogen and nitrogen in the oxide semiconductor film 108.

Further, the concentration of alkali metal or alkaline earth metal of the oxide semiconductor film 108, which is measured by SIMS, is set lower than or equal to $1\times10^{18}$ atoms/cm$^3$, preferably lower than or equal to $2\times10^{16}$ atoms/cm$^3$. This is because an alkali metal and an alkaline earth metal might generate carriers when bonded to an oxide semiconductor, in which case the off-state current of the transistor might be increased.

A transistor in which a highly purified oxide semiconductor film is used for a channel formation region as described above has an extremely small off-state current, and the off-state current standardized on the channel width of the transistor can be as low as several yoktoamperes per micrometer to several zeptoamperes per micrometer.

Here, a structure of an oxide semiconductor film is described. An oxide semiconductor film is classified roughly into a single-crystal oxide semiconductor film and a non-single-crystal oxide semiconductor film. The non-single-crystal oxide semiconductor film includes any of an amorphous oxide semiconductor film, a microcrystalline oxide semiconductor film, a polycrystalline oxide semiconductor film, a c-axis aligned crystalline oxide semiconductor film, and the like.

The amorphous oxide semiconductor film has disordered atomic arrangement and no crystalline component. A typical example thereof is an oxide semiconductor film in which no crystal part exists even in a microscopic region, and the whole of the film is amorphous.

The microcrystalline oxide semiconductor film includes a microcrystal (also referred to as nanocrystal) with a size greater than or equal to 1 nm and less than 10 nm, for example. Thus, the microcrystalline oxide semiconductor film has a higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of the crystal parts each fit inside a cube whose one side is less than 100 nm Thus, there is a case where a crystal part included in the CAAC-OS film fits inside a cube whose one side is less than 10 nm, less than 5 nm, or less than 3 nm The density of defect states of the CAAC-OS film is lower than that of the microcrystalline oxide semiconductor film. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the $InGaZnO_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axes of the crystals are aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an $InGaZnO_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appears at around 31° and a peak of 2θ do not appear at around 36°.

In a transistor including the CAAC-OS film, change in electrical characteristics due to irradiation with visible light or ultraviolet light is small. Thus, the transistor has high reliability.

Note that an oxide semiconductor film may be a stacked film including two or more kinds of an amorphous oxide semiconductor film, a microcrystalline oxide semiconductor film, and a CAAC-OS film, for example.

For example, a CAAC-OS film can be deposited by sputtering with a polycrystalline oxide semiconductor sputtering target. When ions collide with the sputtering target, a crystal region included in the sputtering target may be separated from the target along the a-b plane, and a sputtered particle having a plane parallel to the a-b plane (flat-plate-like sputtered particle or a pellet-like sputtered particle) might be separated from the sputtering target. In that case, the flat-plate-like sputtered particle reaches a substrate while maintaining their crystal state, whereby the CAAC-OS film can be formed.

For the deposition of the CAAC-OS film, the following conditions are preferably used.

By reducing the amount of impurities entering the CAAC-OS layer during the deposition, the crystal state can be prevented from being broken by the impurities. For example, impurities (e.g., hydrogen, water, carbon dioxide, or nitrogen) which exist in the deposition chamber may be reduced. Furthermore, impurities in a deposition gas may be reduced. Specifically, a film formation gas whose dew point is −80° C. or lower, preferably −100° C. or lower, more preferably −120° C. or lower is used.

By increasing the substrate heating temperature during the deposition, migration of a sputtered particle is likely to occur after the sputtered particle reaches a substrate surface. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like sputtered particle reaches the substrate, migration occurs on the substrate surface, so that a flat plane of the sputtered particle is attached to the substrate.

Furthermore, it is preferable that the proportion of oxygen in the deposition gas be increased and the power be optimized in order to reduce plasma damage at the deposition. The proportion of oxygen in the deposition gas is higher than or equal to 30 vol %, preferably 100 vol %.

As an example of the sputtering target, an In—Ga—Zn—O compound target is described below.

The In—Ga—Zn—O compound target, which is polycrystalline, is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. Note that X, Y, and Z are each a given positive number. The kinds of powder and the molar ratio for mixing powder may be determined as appropriate depending on the desired sputtering target.

Note that when silicon and carbon are contained in the oxide semiconductor film 108 at a high concentration, the crystallinity of the oxide semiconductor film 108 is lowered in some cases. In order not to lower the crystallinity of the oxide semiconductor film 108, the concentration of silicon in the oxide semiconductor film 108 is preferably set lower than $1\times10^{19}$ atoms/cm$^3$, preferably lower than $5\times10^{18}$ atoms/cm$^3$, further preferably lower than $2\times10^{18}$ atoms/cm$^3$. Moreover, in order not to lower the crystallinity of the oxide semiconductor film 108, the concentration of carbon in the oxide semiconductor film 108 is set to be lower than $1\times10^{19}$ atoms/cm$^3$, preferably lower than $5\times10^{18}$ atoms/cm$^3$, further preferably lower than $2\times10^{18}$ atoms/cm$^3$.

As described above, in the case where the oxide semiconductor film 108 in which a channel is formed has high crystallinity and the density of states due to an impurity or a defect is low, a transistor including the oxide semiconductor film 108 has stable electrical characteristics.

[1-1-8 Insulating Film 114]

The insulating film 114 may be formed using a single layer or a stacked layer of an insulating film containing one or more kinds of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

The insulating film 114 may be, for example, a stacked film including a silicon oxide film as a first layer and a silicon nitride film as a second layer. In that case, the silicon oxide film may be a silicon oxynitride film. The silicon nitride film may be a silicon nitride oxide film. It is preferable to use a silicon oxide film whose defect density is small as the silicon oxide film. Specifically, a silicon oxide film whose spin density attributed to a signal with a g factor of 2.001 in ESR is less than or equal to $3\times10^{17}$ spins/cm$^3$, preferably less than or equal to $5\times10^{16}$ spins/cm$^3$ is used. As the silicon nitride film, a silicon nitride film from which a hydrogen gas and an ammonia gas are less likely to be released is used. The amount of a released hydrogen gas or a released ammonia gas may be measured by TDS. Further, a silicon nitride film which does not penetrate or hardly penetrate hydrogen, water, and oxygen is used as the silicon nitride film.

The insulating film 114 may be, for example, a stacked film including a first silicon oxide film as a first layer, a second silicon oxide film as a second layer, a silicon nitride film as a third layer. In that case, one of or both the first and second silicon oxide films may be a silicon oxynitride film. The silicon nitride film may be a silicon nitride oxide film. It is preferable to use a silicon oxide film whose defect density is small as the first silicon oxide film. Specifically, a silicon oxide film whose spin density attributed to a signal with a g factor of 2.001 in ESR is less than or equal to $3\times10^{17}$ spins/cm$^3$, preferably less than or equal to $5\times10^{16}$ spins/cm$^3$ is used. As the second silicon oxide film, a silicon oxide film containing excess oxygen is preferably used. As the silicon nitride film, a silicon nitride film from which a hydrogen gas and an ammonia gas are less likely to be released is used. Further, a silicon nitride film which does not penetrate or hardly penetrate hydrogen, water, and oxygen is used as the silicon nitride film. The amount of released hydrogen gas or a released ammonia gas may be measured by TDS.

In the case where at least one of the gate insulating film 106 and the insulating film 114 includes an insulating film containing excess oxygen, oxygen vacancy in the oxide semiconductor film 108 is reduced, so that stable electrical characteristics of a transistor can be achieved.

[1-1-9 Wirings 116a and 116b]

The wiring 116a and 116b can be formed using a material similar to that of the gate electrode 104.

As described above, the conductive film is selectively processed by utilizing the step of the conductive film and using the planarized insulating film 112 over the conductive film as a mask, so that the source electrode 110a and the drain electrode 110b can be formed in a self-aligned manner with high positional accuracy even in the case where the transistor is miniaturized. Oxygen is added to the oxide semiconductor film 108 using the source electrode 110a and the drain electrode 110b as a mask, so that oxygen vacancy in the oxide semiconductor film 108 is reduced and the channel formation region can be highly intrinsic. Thus, a channel is formed in the oxide semiconductor film 108; thus, the transistor has stable electrical characteristics and high field-effect mobility.

[1-2 Fabrication Method of Transistor Structure (1)]

A method for manufacturing a transistor is described here with reference to FIGS. 2A to 2C, FIGS. 3A to 3C, FIGS. 4A to 4C, FIGS. 5A to 5C.

First, the substrate 100 is prepared.

Next, the base insulating film 101 is formed. The base insulating film 101 has a function of inhibiting diffusion of impurities from the substrate 100. Then, a conductive film serving as the gate electrode 104 is deposited. As the conductive film to be the gate electrode 104, any of the above-described conductive films can be deposited by sputtering, CVD, molecular beam epitaxy (MBE), atomic layer deposition (ALD), or pulsed laser deposition (PLD).

Next, the conductive film to be the gate electrode 104 is partly etched to form the gate electrode 104.

Figure 2A:
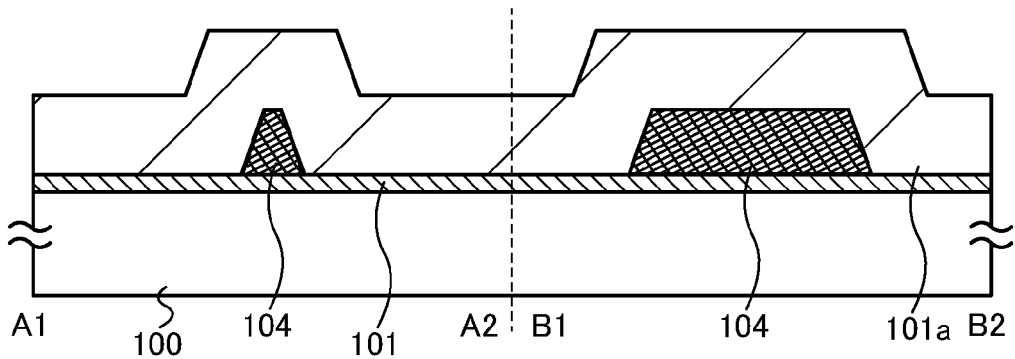
FIGS. 2A to 2C illustrate a method for manufacturing a transistor.

Next, the base insulating film 101a is formed (see FIG. 2A). An oxide insulating film formed by a CVD method using an organosilane gas, typically a silicon oxide film, can be used as the base insulating film 101a.

As the base insulating film 101a, a silicon oxide film formed by a CVD method using an organosilane gas is provided. As the organosilane gas, any of the following silicon-containing compound can be used: tetraethyl orthosilicate (TEOS) (chemical formula: $Si(OC_2H_5)_4$); tetramethylsilane (TMS) (chemical formula: $Si(CH_3)_4$); tetramethylcyclotetrasiloxane (TMCTS); octamethylcyclotetrasiloxane (OMCTS); hexamethyldisilazane (HMDS); triethoxysilane ($SiH(OC_2H_5)_3$); trisdimethylaminosilane ($SiH(N(CH_3)_2)_3$); or the like. The deposition is preferably performed at a substrate temperature of 400° C. because degassing yield can be reduced.

Figure 2B:
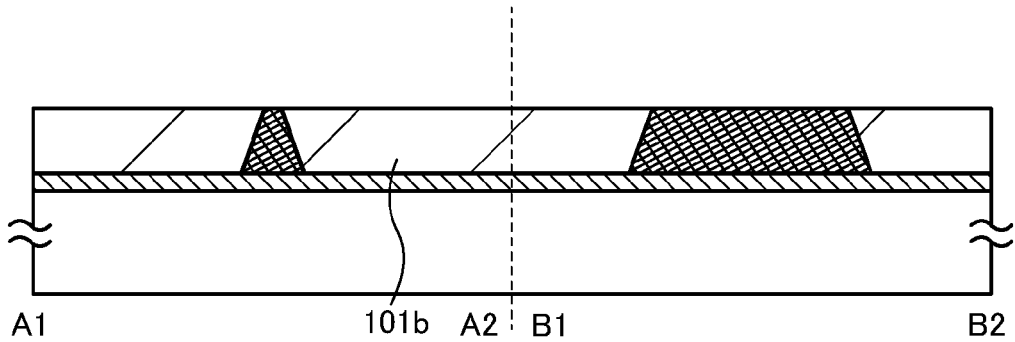

Next, planarization treatment is performed on the base insulating film 101a to expose the top surface of the gate electrode 104, so that a base insulating film 101b is formed (see FIG. 2B). As the planarization treatment, CMP treatment, etching (dry etching or wet etching), and plasma treatment can be given, and they may be employed in combination. When the planarization treatment is combined with etching treatment, plasma treatment, or the like, the order of steps is not particularly limited and may be set as appropriate depending on the materials, the thicknesses, and the surface roughness of the base insulating film. Alternatively, a large part of the base insulating film may be removed by CMP treatment and other part of the base insulating film may be removed by dry etching treatment.

Note that the CMP treatment may be performed only once or plural times. When the CMP treatment is performed plural times, first polishing is preferably performed with a high polishing rate followed by final polishing with a low polishing rate. By performing polishing steps with different polishing rates in combination, the planarity of the surface of the base insulating film can be further improved.

Figure 2C:
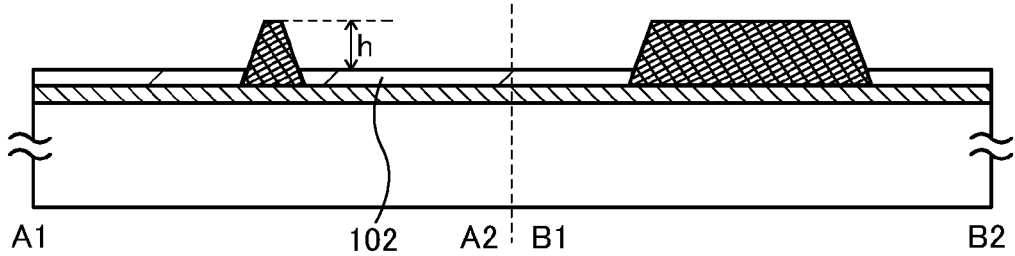

Next, the base insulating film 101b is etched under conditions where the base insulating film 101b is selectively etched, so that the base insulating film 102 is formed (see FIG. 2C). In such a manner, the gate electrode 104 protruding from the base insulating film 102 can be formed. As the height h of the part of the gate electrode 104 which protrudes from the base insulating film 102 increases, the height of the step of the conductive film to be the source electrode 110a and the drain electrode 110b increases.

Next, the gate insulating film 106 is formed. The gate insulating film 106 may be formed in such a manner that any of the above-described insulating films is formed by a sputtering method, a CVD method, an MBE method, an ALD method, or a PLD method.

Figure 3A:
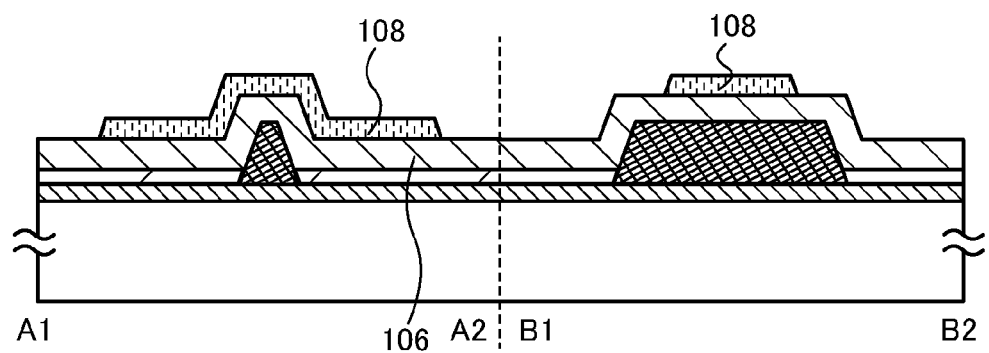
FIGS. 3A to 3C illustrate a method for manufacturing a transistor.

Next, an oxide semiconductor film is formed and then is partly etched, so that the oxide semiconductor film 108 is formed (see FIG. 3A). As the oxide semiconductor film, the above-described oxide semiconductor film can be formed by a sputtering method, a CVD method, an MBE method, an ALD method, or a PLD method.

In the case where the oxide semiconductor film 108 is formed by a sputtering method, a power supply device for generating plasma can be an RF power supply device, an AC power supply device, a DC power supply device, or the like as appropriate.

As a sputtering gas, a rare atmosphere (typically argon), an oxygen atmosphere, or a mixed gas of a rare gas and oxygen is used as appropriate. In the case of using the mixed gas of a rare gas and oxygen, the proportion of oxygen is preferably higher than that of a rare gas.

Further, a target may be appropriately selected in accordance with the composition of the oxide semiconductor film 108.

In the case of using a sputtering method, at least the oxide semiconductor film 108 can become a CAAC-OS film by the following method. Specifically, the oxide semiconductor film 108 is formed by a heat treatment where the substrate temperature is set higher than or equal to 150° C. and lower than or equal to 500° C., preferably higher than or equal to 150° C. and lower than or equal to 450° C., and further preferably higher than or equal to 200° C. and lower than or equal to 350° C.

Next, first heat treatment is preferably performed. The first heat treatment is performed at a temperature higher than or equal to 250° C. and lower than or equal to 650° C., preferably higher than or equal to 300° C. and lower than or equal to 500° C. The first heat treatment is performed in an inert gas atmosphere, in an atmosphere containing an oxidizing gas at 10 ppm or more, 1% or more, or 10% or more, or under reduced pressure. Alternatively, the first heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. The first heat treatment enables the crystallinity of the oxide semiconductor film 108 to be improved, and in addition, impurities such as water, hydrogen, nitrogen, and carbon to be removed from the gate insulating film 106 and the oxide semiconductor film 108.

Figure 3B:
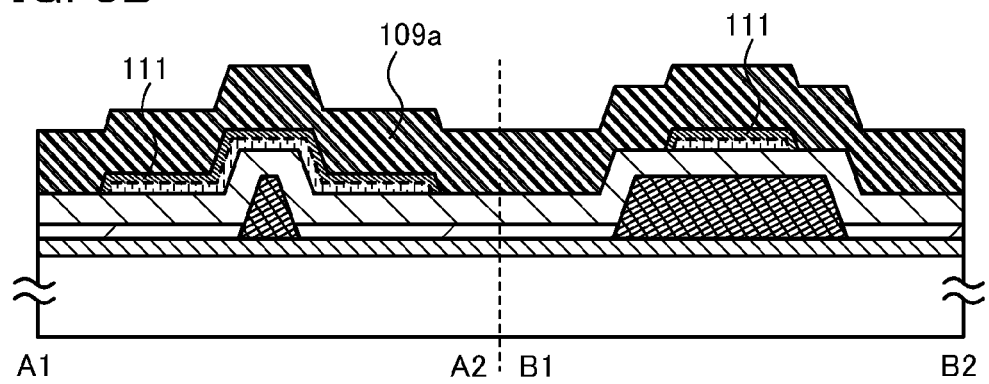

Then, a conductive film 109a to be the source electrode 110a and the drain electrode 110b is formed (see FIG. 3B). The conductive film 109a may be formed using the above-described materials of the source electrode 110a and the drain electrode 110b by a sputtering method, a CVD method, an MBE method, an ALD method, or a PLD method.

A material of the conductive film 109a is more likely to be bonded to oxygen than a metal element contained in the oxide semiconductor film 108 is; therefore, oxygen in the oxide semiconductor film 108 is diffused to the conductive material side which is more likely to be bonded to oxygen than the metal element contained in the oxide semiconductor film 108 is (to the conductive film 109a side). The diffusion causes oxygen vacancy in a region of the oxide semiconductor film 108 near the interface with the conductive film 109a. Oxygen vacancy is also caused by damage to the top surface of the oxide semiconductor film 108 which is caused when the conductive film 109a is formed over the oxide semiconductor film 108. The low-resistance region 111 is formed because of the oxygen vacancy.

Figure 3C:
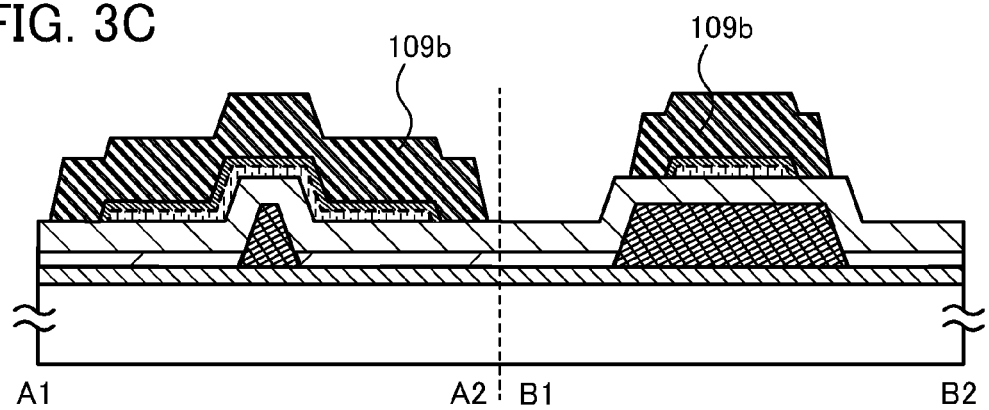

Next, part of the conductive film 109a is etched so that a conductive film 109b is formed (see FIG. 3C).

Figure 4A:
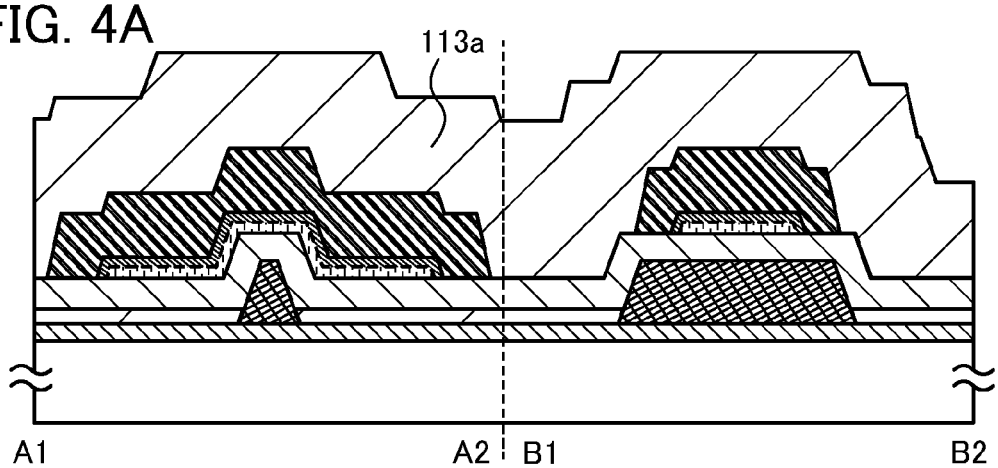
FIGS. 4A to 4C illustrate a method for manufacturing a transistor.

Next, the insulating film 113a is formed over the gate insulating film 106 and the conductive film 109b (see FIG. 4A). An insulating film 113a can be formed using a material and a method which are similar to those of the base insulating film 101a.

Figure 4B:
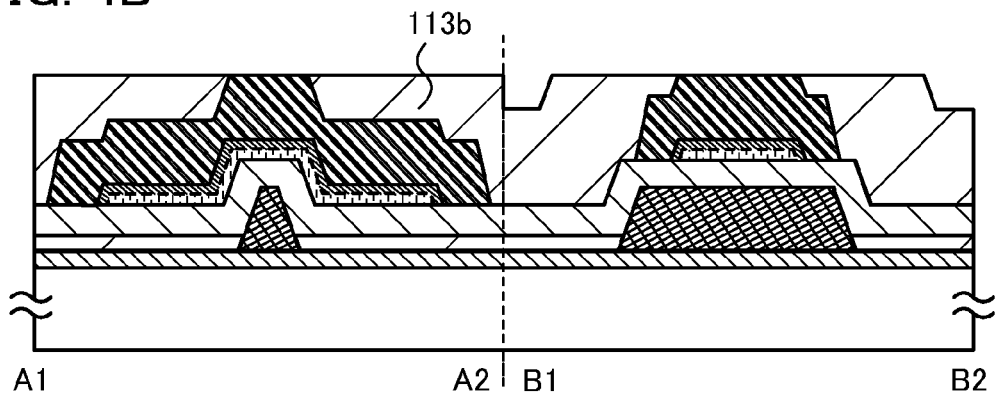

Next, planarization treatment is performed on the insulating film 113a to expose the conductive film 109b, so that an insulating film 113b is formed (see FIG. 4B). The planarization treatment can be performed by a method similar to that of the base insulating film 101b.

Figure 4C:
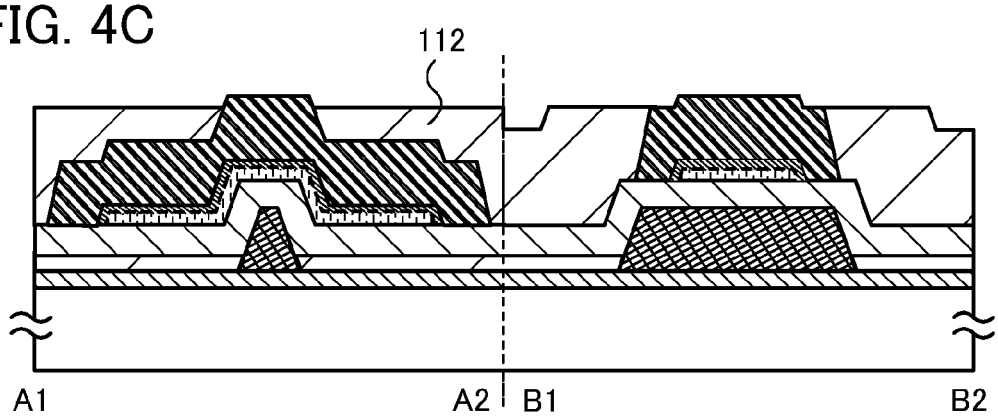

Next, the insulating film 113b is etched to the step of the conductive film 109b that is farthest from the oxide semiconductor film 108 (in other words, the insulating film 113b is etched by the amount of the thickness of the oxide semiconductor film 108), so that the insulating film 112 is formed (see FIG. 4C).

The insulating film 113b to be the insulating film 112 is etched so that the etched thickness of the insulating film 113b is greater than or equal to the thickness of the oxide semiconductor film 108 and smaller than the height h of the part of the gate electrode 104 which protrudes from the base insulating film 102. In the case where the insulating film 113b is etched so that the etched thickness is smaller than the thickness of the oxide semiconductor film 108, a region of the conductive film which overlaps with the gate electrode 104 is not fully etched, so that the source electrode 110a and the drain electrode 110b cannot be separated from each other. In the case where the insulating film 113b is etched so that the etched thickness is greater than or equal to the height h of the part of the gate electrode 104 which protrudes from the base insulating film 102, a region of the conductive film 109b which overlaps with the oxide semiconductor film 108 is etched so that the source electrode 110a and the drain electrode 110b are in contact with end portions of the oxide semiconductor film 108, and the contact area becomes small, whereby the effect of contact resistance becomes extremely large.

Figure 5A:
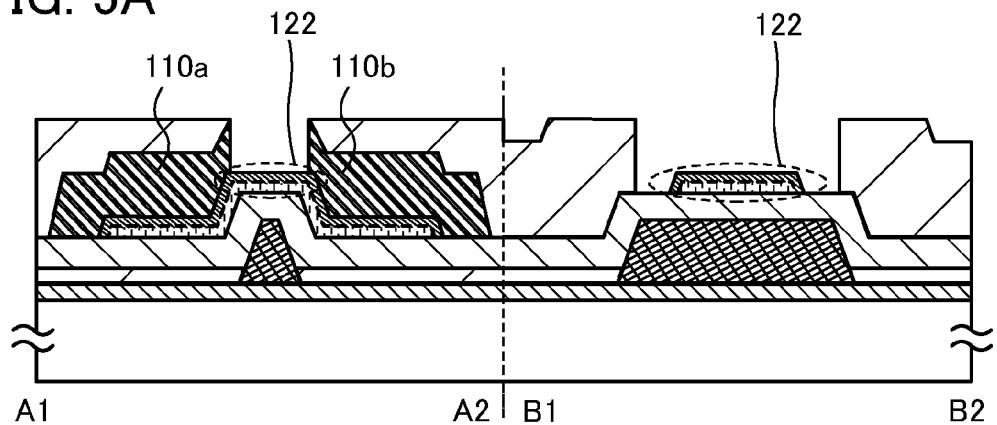
FIGS. 5A to 5C illustrate a method for manufacturing a transistor.

Next, a region of the conductive film 109b which overlaps with the gate electrode 104 is etched using the insulating film 112 as a mask, so that the source electrode 110a and the drain electrode 110b are formed (see FIG. 5A).

The conductive film 109b is selectively processed by utilizing the step of the conductive film 109b and using the planarized insulating film 112 as a mask, so that the source electrode 110a and the drain electrode 110b can be formed in a self-aligned manner with high positional accuracy even in the case where the transistor is miniaturized. Further, in FIG. 5A, end portions of the insulating film 112 are aligned with an end portion of the source electrode 110a and an end portion of the drain electrode 110b; however, the present invention is not limited to this.

Figure 5B:
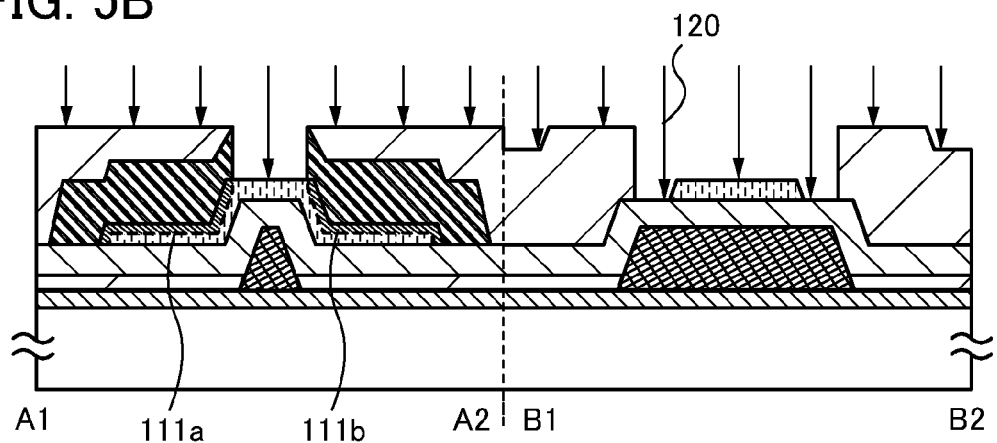

Next, oxygen 120 is added to a region 122 of the oxide semiconductor film 108 which overlaps with the gate electrode 104 (see FIG. 5B).

Oxygen can be added by an ion doping method or an ion implantation method. Alternatively, as a method for adding oxygen, a plasma immersion ion implantation method may be used. By a plasma immersion ion implantation method, oxygen can be added efficiently even when the region 122 has an uneven shape. Alternatively, oxygen can be added by a method other than an ion doping method, an ion implantation method, or the like. For example, oxygen can be added in such a manner that plasma is generated in an oxygen atmosphere and then the region 122 is subjected to plasma treatment in the oxygen atmosphere. As an apparatus for generating plasma, a dry etching apparatus, a plasma CVD apparatus, a high-density plasma CVD apparatus, or the like can be used.

The oxygen 120 added to the region 122 is one or more of an oxygen radial, an oxygen atom, and an oxygen ion. The oxygen 120 may be added to at least part of the region 122, typically, any of the surface of the region 122, the inside of the region 122, and the interface between the region 122 and the gate insulating film 106.

In the case where the oxygen 120 is added to the region 122 by an ion doping method or an ion implantation method, the amount of oxygen is larger than or equal to $5 \times 10^{19}/cm^3$ and smaller than or equal to $5 \times 10^{21}/cm^3$. In this case, when the oxygen 120 has high energy, the region 122 of the oxide semiconductor film 108 is damaged and physical defects are caused. Therefore, the oxygen 120 preferably has such energy which does not cause damage on the oxide semiconductor film 108.

As a result, the oxygen vacancy in the region 122 is reduced, so that the channel formation region can be highly intrinsic. At the same time, the low-resistance regions 111a and 111b can be formed.

The timing of adding the oxygen 120 is not limited to this, and the oxygen 120 may be added after the subsequent formation of the insulating film 114.

Then, second heat treatment is preferably performed. The description of the first heat treatment can be referred to for the second heat treatment. The second heat treatment can remove impurities such as hydrogen and water from the oxide semiconductor film 108. Hydrogen easily moves especially in the oxide semiconductor film 108; thus, reducing hydrogen by the second heat treatment enables a transistor to have stable electrical characteristics. Note that water is a compound containing hydrogen and thus might serve as an impurity in the oxide semiconductor film 108.

Next, the insulating film 114 serving as an oxide insulating film is formed over the oxide semiconductor film 108 and the insulating film 112.

In the case where the insulating film 114 contains excess oxygen, the excess oxygen is easily released from the insulating film 114 by heat treatment, so that oxygen vacancy in the oxide semiconductor film 108 can be reduced. In this case, oxygen is supplied from the insulating film 114 to the oxide semiconductor film 108; thus, treatment for adding oxygen is not necessarily performed. Thus, oxygen vacancy in the channel formation region in the oxide semiconductor film 108 is further reduced, so that the channel formation region is a highly purified intrinsic region.

Figure 5C:
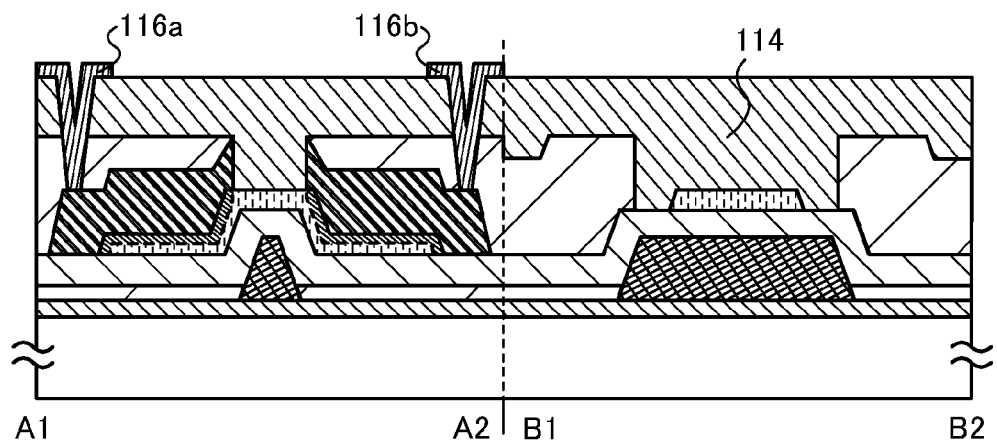

Next, openings reaching the source electrode 110a and the drain electrode 110b are formed in the insulating film 112 and the insulating film 114, and the wiring 116a and the wiring 116b which are electrically connected to the source electrode 110a and the drain electrode 110b, respectively, are formed in the openings (see FIG. 5C).

Next, third heat treatment is preferably performed. The third heat treatment can be performed under a condition similar to that of the first heat treatment. By the third heat treatment, excess oxygen is easily released from the gate insulating film 106 and the insulating film 114, so that oxygen vacancy in the oxide semiconductor film 108 can be reduced. Thus, the oxygen vacancy in the channel formation region in the oxide semiconductor film 108 is further reduced, so that the channel formation region is a highly purified intrinsic region.

[2-1 Transistor Structure (2)]

Figure 6A:
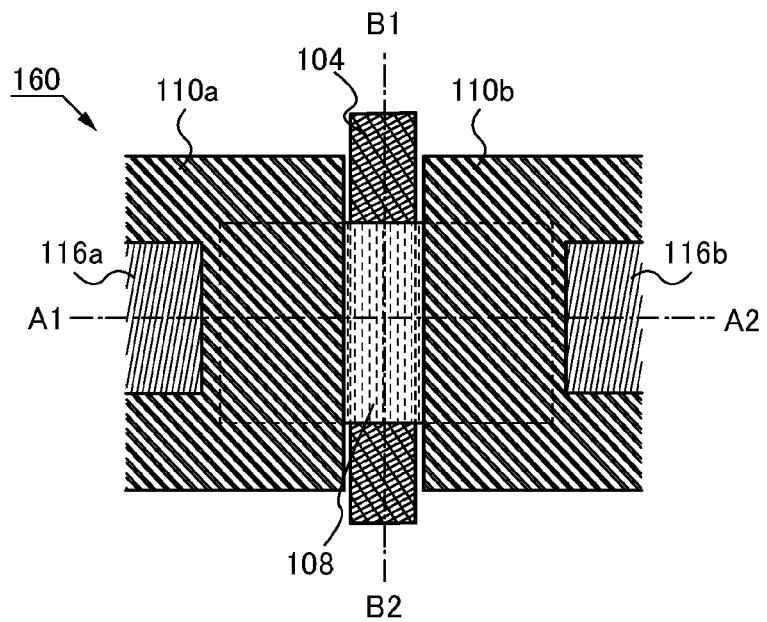
FIGS. 6A to 6C are a top view and cross-sectional views which illustrate a transistor.
Figure 6B:
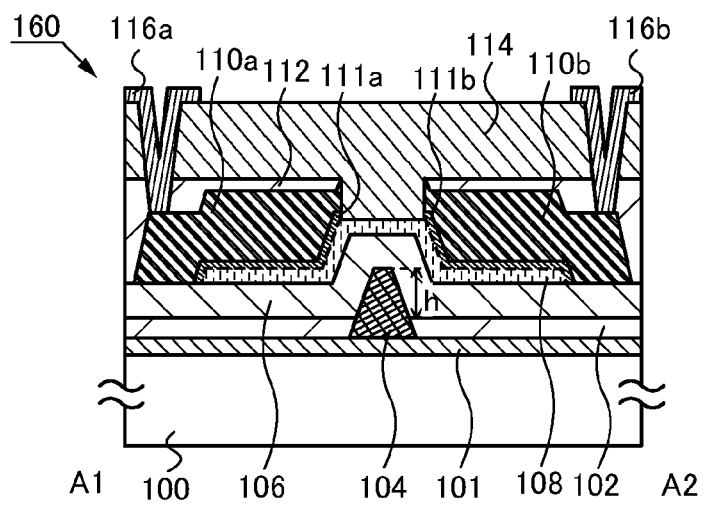
Figure 6C:
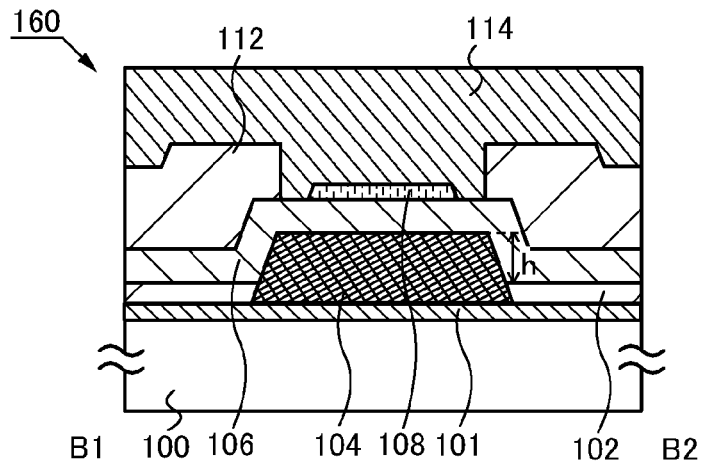

Further, another structure of the transistor is shown in FIGS. 6A to 6C. FIGS. 6A to 6C are a top view and cross-sectional views of a transistor 160 of one embodiment of the present invention. FIG. 6A is a top view, FIG. 6B is a cross-sectional view taken along dashed-dotted line A1-A2 in FIG. 6A, and FIG. 6C is a cross-sectional view taken along dashed-dotted line B1-B2 in FIG. 6A. Note that for simplification of the drawing, some components are not illustrated in the top view in FIG. 6A.

The transistor 160 in FIGS. 6A to 6C is different from the transistor 150 in FIGS. 1A to 1C in that the oxide semiconductor film 108 is partly etched to have a depressed portion.

[2-2 Fabrication Method of Transistor Structure (2)]

Figure 7A:
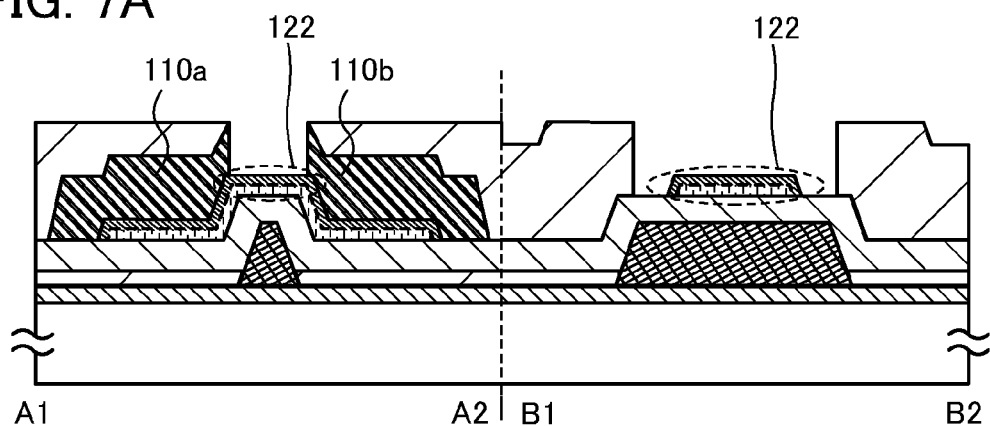
FIGS. 7A to 7C illustrate a method for manufacturing a transistor.
Figure 7B:
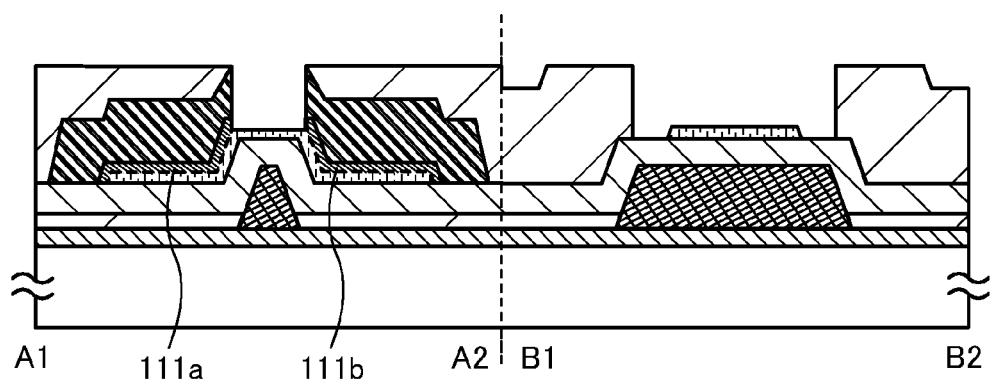
Figure 7C:
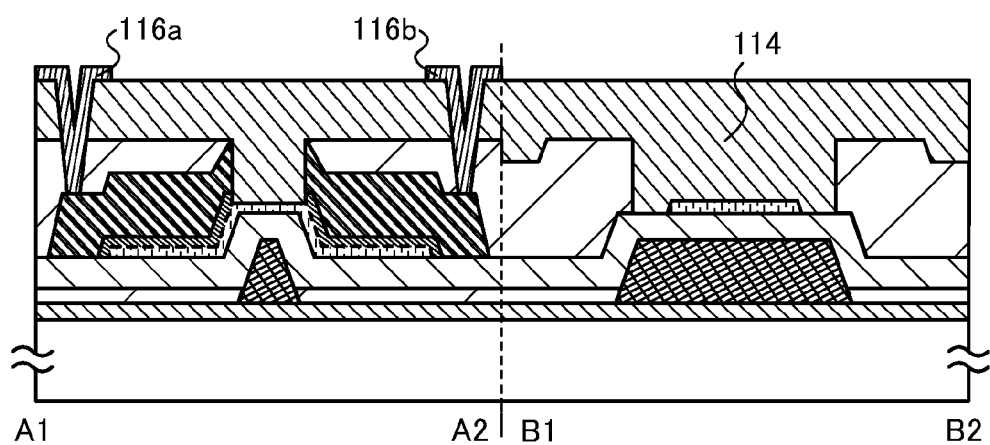

A method for manufacturing a transistor is described here with reference to FIGS. 7A to 7C.

As illustrated in FIG. 7A, the steps up to formation of the source electrode 110a and the drain electrode 110b by etching the region of the conductive film 109b which overlaps with the gate electrode 104 using the insulating film 112 as a mask can be performed in a manner similar to the manufacturing steps of the transistor 150 (up to FIG. 5A).

Next, a region of the low-resistance region 111 which overlaps with the gate electrode 104 is etched and removed, so that the region 122 can be a channel formation region. At the same time, the low-resistance regions 111a and 111b are formed (see FIG. 7B).

Then, second heat treatment is preferably performed. The description in the above embodiment can be referred to for the second heat treatment.

Next, the insulating film 114 serving as the oxide insulating film is formed over the oxide semiconductor film 108 and the insulating film 112. After that, openings reaching the source electrode 110a and the drain electrode 110b are formed in the insulating film 112 and the insulating film 114, and the wiring 116a and the wiring 116b which are electrically connected to the source electrode 110a and the drain electrode 110b, respectively, are formed in the openings (see FIG. 7C).

Next, third heat treatment is preferably performed. The description in the above embodiment can be referred to for the third heat treatment.

[3 Transistor Structure (3)]

Figure 8A:
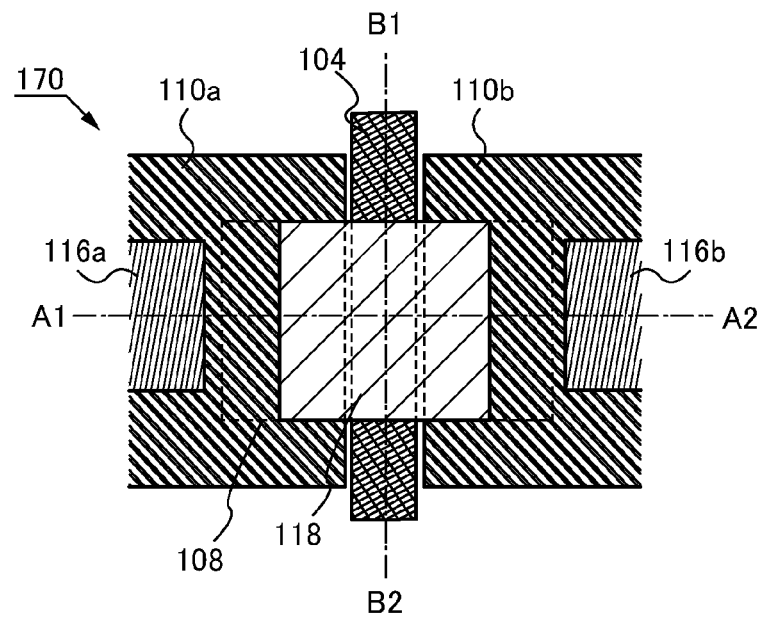
FIGS. 8A to 8C are a top view and cross-sectional views which illustrate a transistor.
Figure 8B:
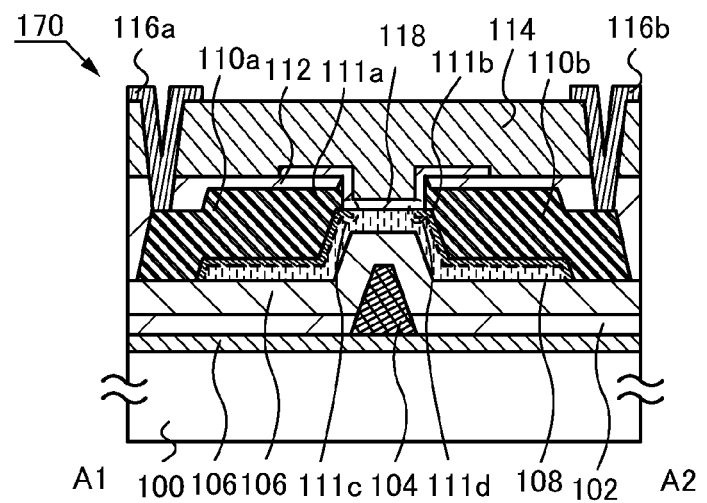
Figure 8C:
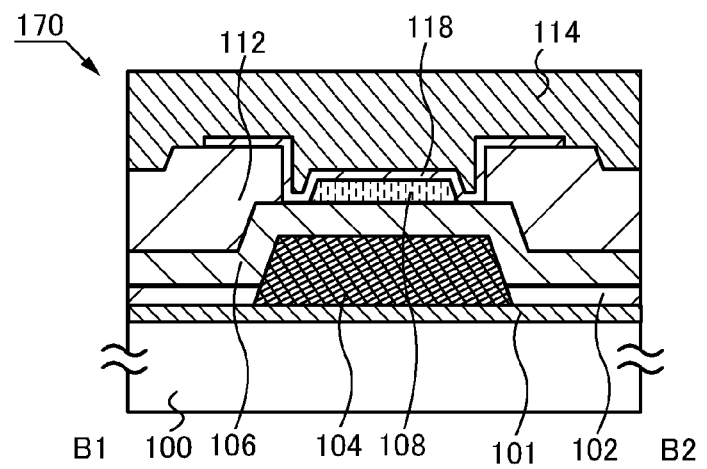

FIGS. 8A to 8C illustrate another transistor structure. FIGS. 8A to 8C are a top view and cross-sectional views of a transistor 170. FIG. 8A is a top view. FIG. 8B is a cross-sectional view along dashed-dotted line A1-A2 of FIG. 8A. FIG. 8C is a cross-sectional view along dashed-dotted line B1-B2 of FIG. 8A. Note that for simplification of the drawing, some components are not illustrated in the top view in FIG. 8A.

The transistor 170 in FIGS. 8A to 8C includes the base insulating film 101 over the substrate 100; the base insulating film 102 over the base insulating film 101; the gate electrode 104 which protrudes from the base insulating film 102; the gate insulating film 106 over the base insulating film 102 and the gate electrode 104; the oxide semiconductor film 108 over the gate insulating film 106; the source electrode 110a and the drain electrode 110b which are in contact with the oxide semiconductor film 108; the insulating film 112 over the source electrode 110a and the drain electrode 110b; an insulating film 118 over the oxide semiconductor film 108 and the insulating film 112; the insulating film 114 over the insulating film 112 and the insulating film 118; and the wiring 116a and the wiring 116b which are electrically connected to the source electrode 110a and the drain electrode 110b, respectively, through openings in the insulating film 112 and the insulating film 114. Oxygen is extracted from the oxide semiconductor film 108, so that the low-resistance regions 111a and 111b are formed near the interface between the oxide semiconductor film 108 and each of the source electrode 110a and the drain electrode 110b in a self-aligned manner.

The transistor 170 in FIGS. 8A to 8C is different from the transistor 150 in FIGS. 1A to 1C in that the insulating film 118 is formed over the oxide semiconductor film 108 and the insulating film 112. For the material of the insulating film 118, the material of the gate insulating film 106 can be referred to.

Figure 31:
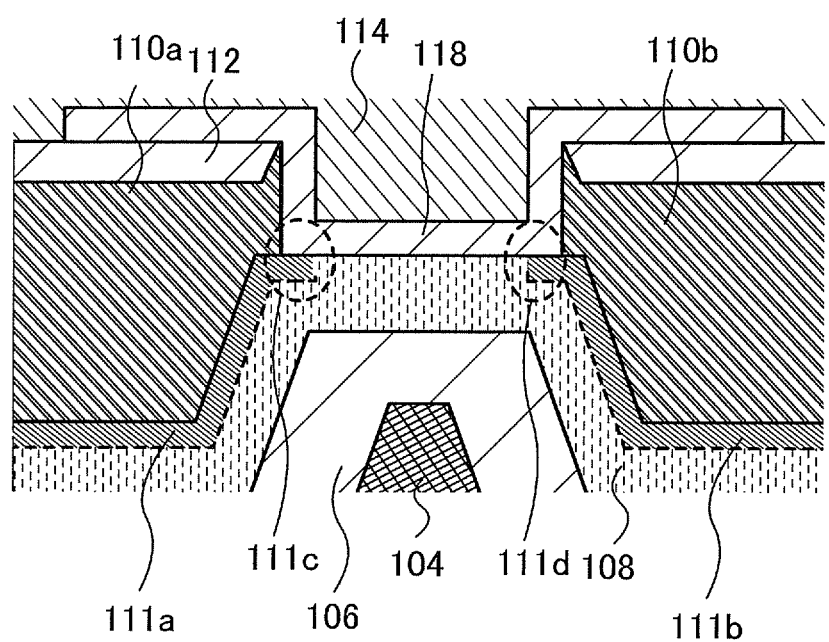
FIG. 31 is an enlarged cross-sectional view of a transistor.

After the insulating film 118 is formed, oxygen is added to the region 122 of the oxide semiconductor film 108 which overlaps with the gate electrode 104 (see FIG. 5A). At this time, oxygen is added to a region 111c and a region 111d in FIG. 31 which is a partially enlarged view of FIG. 8B, and the regions 111c and 111d have a higher resistance than the that of the low-resistance regions 111a and 111b. Less oxygen is added to the regions 111c and 111d than the center portion of the region 122 because the insulating film 118 has a great thickness.

The insulating film 118 is provided in the above manner, whereby an oxide semiconductor film 108 in which a channel of the transistor is formed can be apart from the gate insulating film 106, the transistor can have high field-effect mobility and stable electrical characteristics, a region having a higher resistance than that of the low-resistance region 111 can be formed, and an electric field generated in the vicinity of the drain in the channel length direction is relaxed.

[4 Transistor Structure (4)]

Figure 32A:
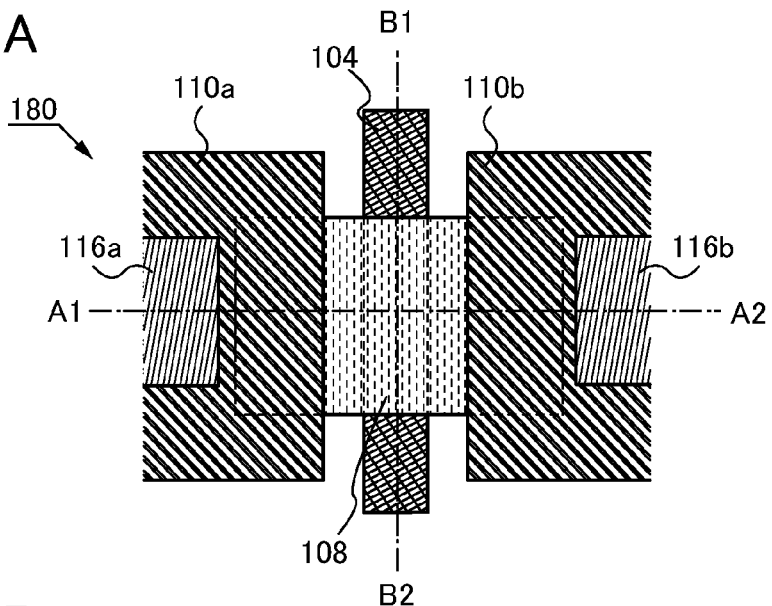
FIGS. 32A to 32C are a top view and cross-sectional views which illustrate a transistor.
Figure 32B:
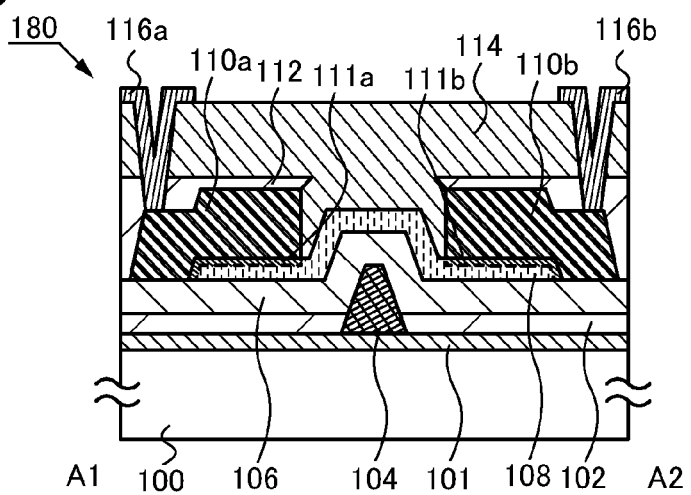
Figure 32C:
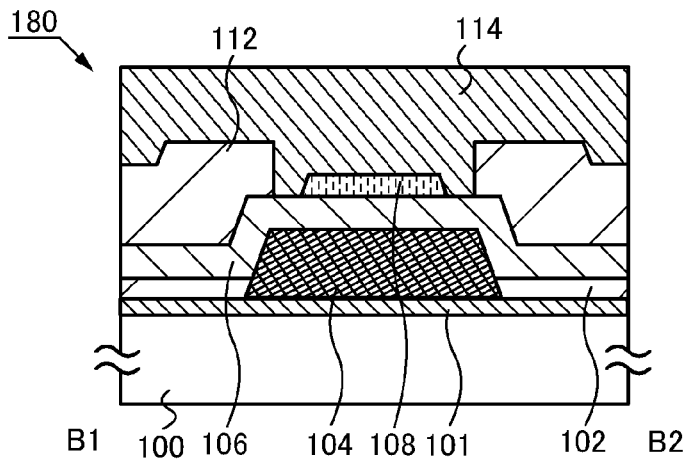

FIGS. 32A to 32C illustrate another transistor structure. FIGS. 32A to 32C are a top view and cross-sectional views of a transistor 180. FIG. 32A is a top view. FIG. 32B is a cross-sectional view along dashed-dotted line A1-A2 of FIG. 32A. FIG. 32C is a cross-sectional view along dashed-dotted line B1-B2 of FIG. 32A. Note that for simplification of the drawing, some components are not illustrated in the top view in FIG. 32A.

The transistor 180 in FIGS. 32A to 32C is different from the transistor 150 in FIGS. 1A to 1C in the shapes of the source electrode 110a and the drain electrode 110b.

When the conductive film 109b to be the source electrode 110a and the drain electrode 110b is etched, the insulating film 112 serving as a mask slightly recedes, and the source electrode 110a and the drain electrode 110b have such shapes as in FIG. 32B in some cases.

This embodiment can be combined with any of the other embodiments in this specification as appropriate.

(Embodiment 2)

In this embodiment, the transistor having a structure partially different from that in Embodiment 1 is described with reference to drawings.

[5-1 Transistor Structure (5)]

Figure 33A:
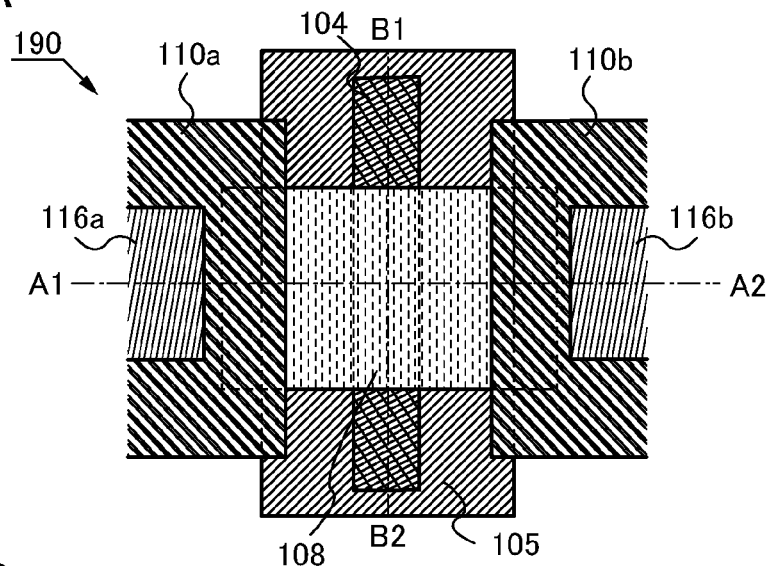
FIGS. 33A to 33C are a top view and cross-sectional views which illustrate a transistor.
Figure 33B:
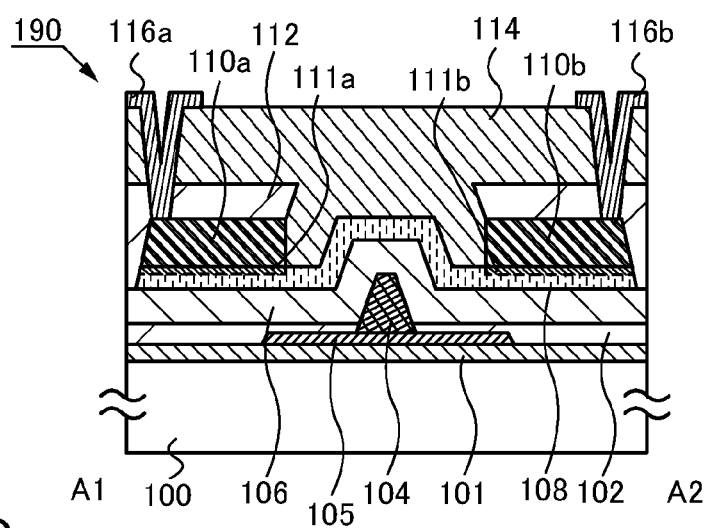
Figure 33C:
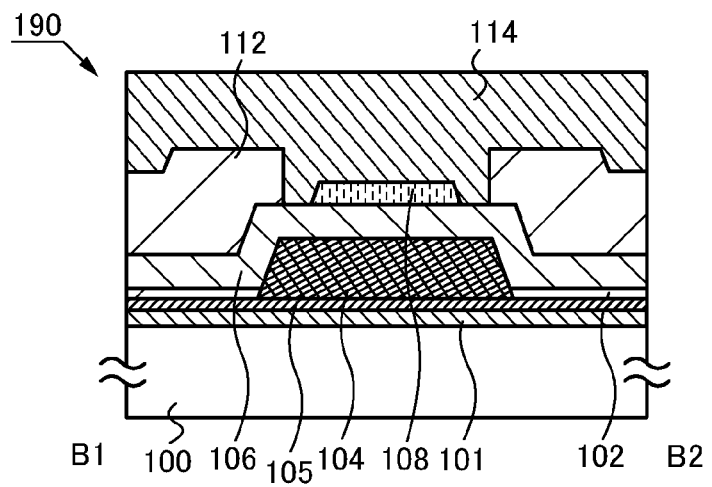

FIGS. 33A to 33C illustrate a top view and cross-sectional views of a transistor 190. FIG. 33A is a top view. FIG. 33B is a cross-sectional view along dashed-dotted line A1-A2 of FIG. 33A. FIG. 33C is a cross-sectional view along dashed-dotted line B1-B2 of FIG. 33A. Note that for simplification of the drawing, some components are not illustrated in the top view in FIG. 33A.

The transistor 190 in FIGS. 33A to 33C includes the base insulating film 101 over the substrate 100; the conductive film 105 over the base insulating film 101; the base insulating film 102 over the base insulating film 101 and the conductive film 105; the gate electrode 104 which protrudes from the base insulating film 102; the gate insulating film 106 over the base insulating film 102 and the gate electrode 104; the oxide semiconductor film 108 over the gate insulating film 106; the source electrode 110a and the drain electrode 110b which are in contact with the oxide semiconductor film 108; the insulating film 112 over the source electrode 110a and the drain electrode 110b; the insulating film 114 over the oxide semiconductor film 108 and the insulating film 112; and the wiring 116a and the wiring 116b which are electrically connected to the source electrode 110a and the drain electrode 110b, respectively, through openings in the insulating film 112 and the insulating film 114. Oxygen is extracted from the oxide semiconductor film 108, so that the low-resistance regions 111a and 111b are formed near the interface between the oxide semiconductor film 108 and each of the source electrode 110a and the drain electrode 110b.

For the material of the conductive film 105, the material of the gate electrode 104 can be referred to.

[5-2 Fabrication Method of Transistor Structure (5)]

Here, a fabrication method of a transistor is described here with reference to FIGS. 34A to 34C, FIGS. 35A to 35C, FIGS. 36A to 36C, and FIGS. 37A and 37B.

First, the substrate 100 is prepared. Next, the base insulating film 101 is formed. Then, the conductive film 105 serving as part of a gate electrode and the gate electrode 104 are formed. After that, the base insulating film 101a is formed (see FIG. 34A).

Figure 34A:
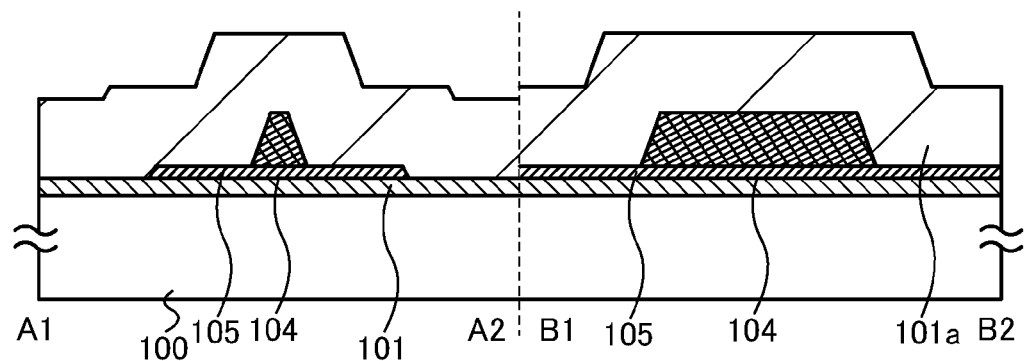
FIGS. 34A to 34C illustrate a method for manufacturing a transistor.
Figure 34B:
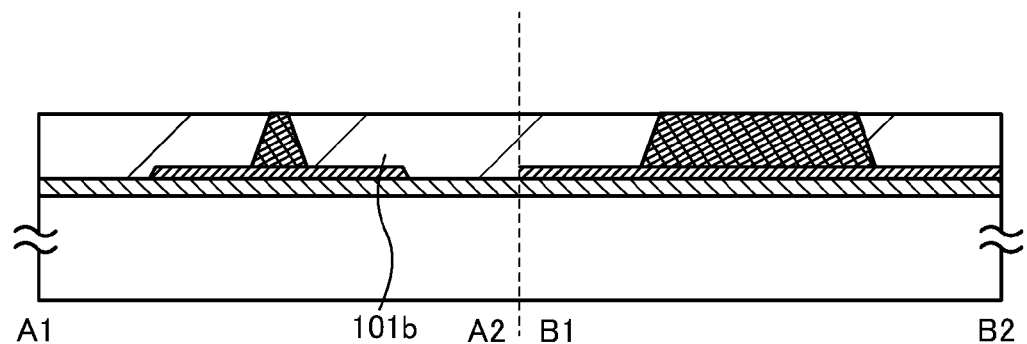

Next, planarization treatment is performed on the base insulating film 101a to expose the top surface of the gate electrode 104, so that the base insulating film 101b is formed (see FIG. 34B).

Figure 34C:
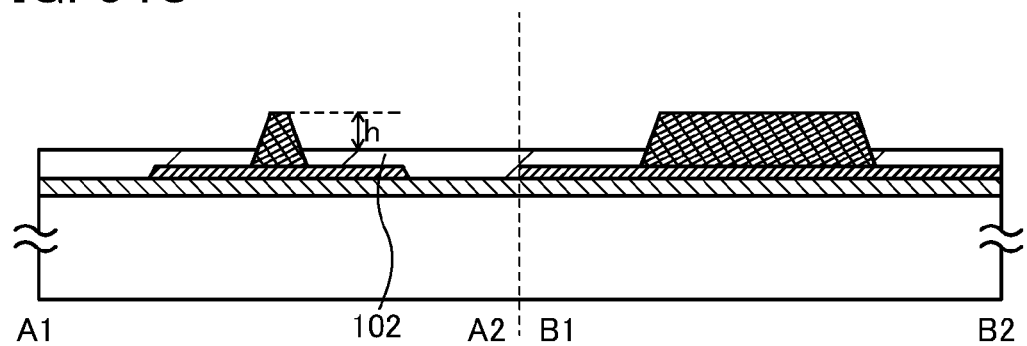

Next, the base insulating film 101b is etched under conditions where the base insulating film 101b is selectively etched, so that the base insulating film 102 is formed (see FIG. 34C). In such a manner, a structure in which the gate electrode 104 protrudes from the base insulating film 102 can be formed. As the height h of the part of the gate electrode 104 which protrudes from the base insulating film 102 increases, the height of the step of the conductive film to be the source electrode 110a and the drain electrode 110b increases.

Figure 35A:
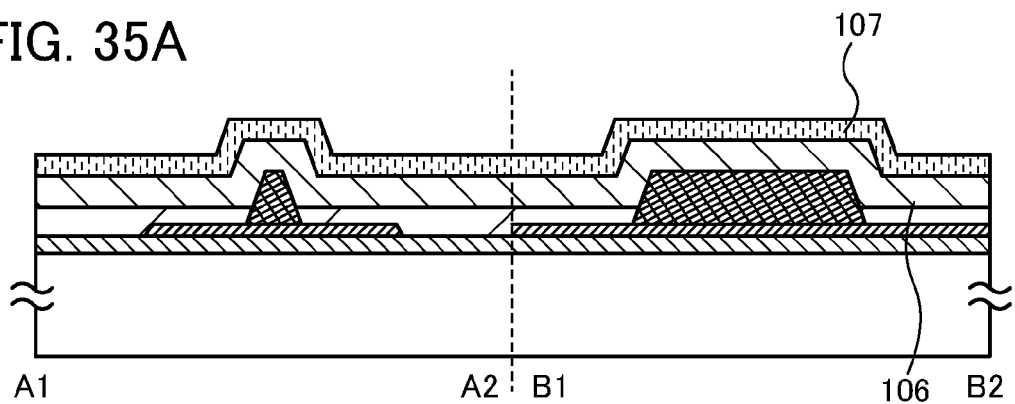
FIGS. 35A to 35C illustrate a method for manufacturing a transistor.
Figure 35B:
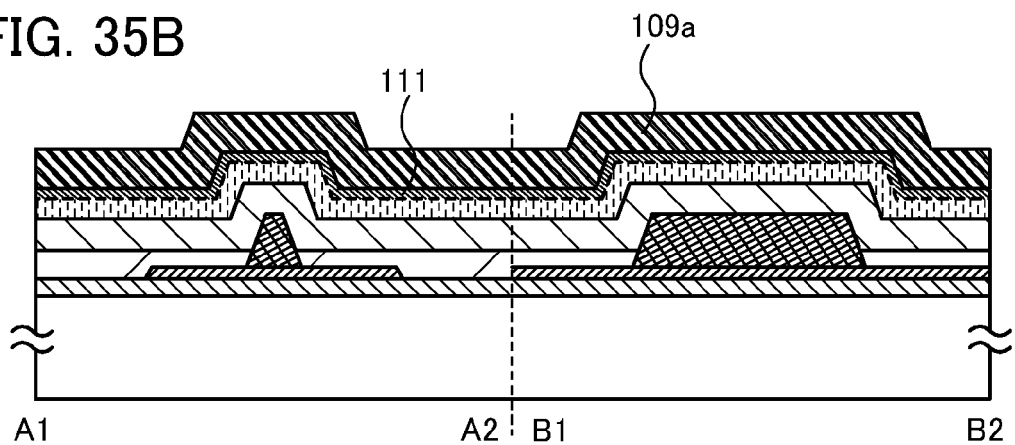

Next, the gate insulating film 106 and an oxide semiconductor film 107 are formed (see FIG. 35A). For the material of the oxide semiconductor film 107, the material of the oxide semiconductor film 108 in Embodiment 1 can be referred to.

Next, first heat treatment is preferably performed. The description of Embodiment 1 can be referred to for the first heat treatment. Next, the conductive film 109a to be the source electrode 110a and the drain electrode 110b is formed (see FIG. 35B).

A material of the conductive film 109a is more likely to be bonded to oxygen than a metal element contained in the oxide semiconductor film 107 is; therefore, oxygen in the oxide semiconductor film 107 is diffused to the conductive material side which is more likely to be bonded to oxygen than the metal element contained in the oxide semiconductor film 107 is (to the conductive film 109a side). The diffusion causes oxygen vacancy in a region of the oxide semiconductor film 107 near the interface with the conductive film 109a. Oxygen vacancy is also caused by damage to the top surface of the oxide semiconductor film 107 which is caused when the conductive film 109a is formed over the oxide semiconductor film 107. The low-resistance region 111 is formed because of the oxygen vacancy.

Figure 35C:
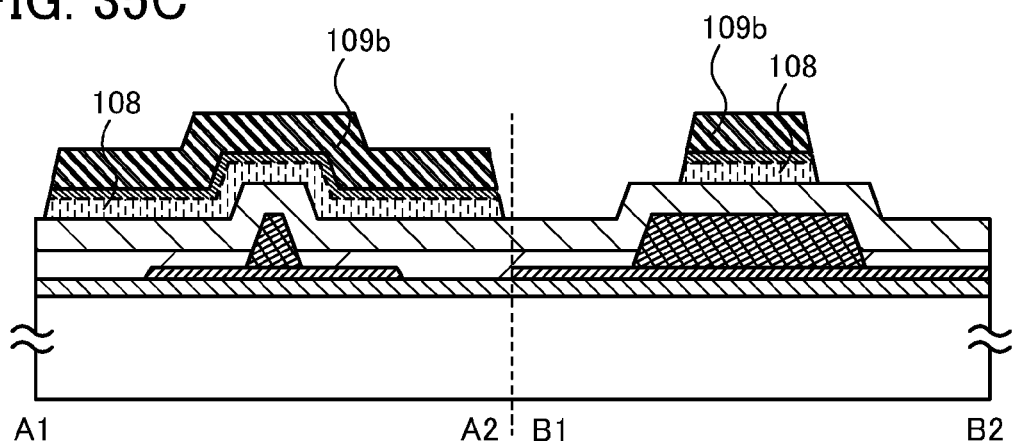

Next, part of the conductive film 109a and part of the oxide semiconductor film 107 are etched, so that the conductive film 109b and the oxide semiconductor film 108 are formed (see FIG. 35C).

Figure 36A:
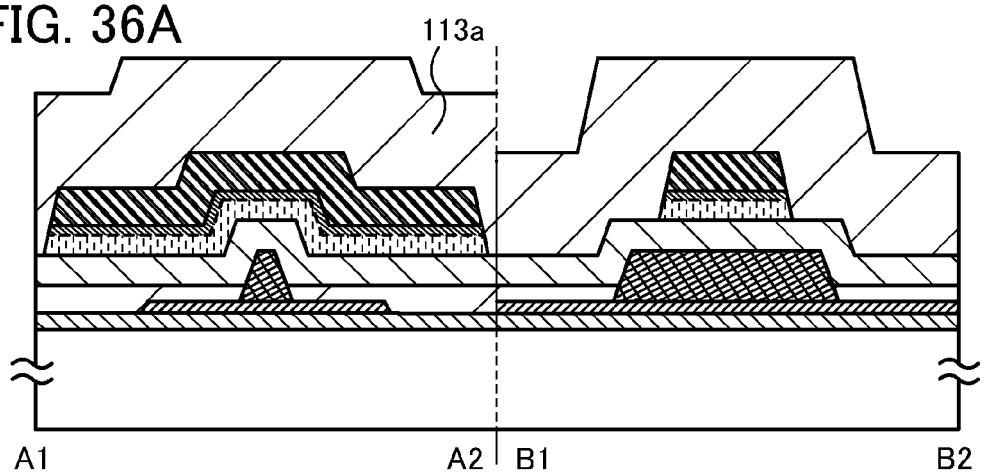
FIGS. 36A to 36C illustrate a method for manufacturing a transistor.

Then, the insulating film 113a is formed over the gate insulating film 106 and the conductive film 109b (see FIG. 36A).

Figure 36B:
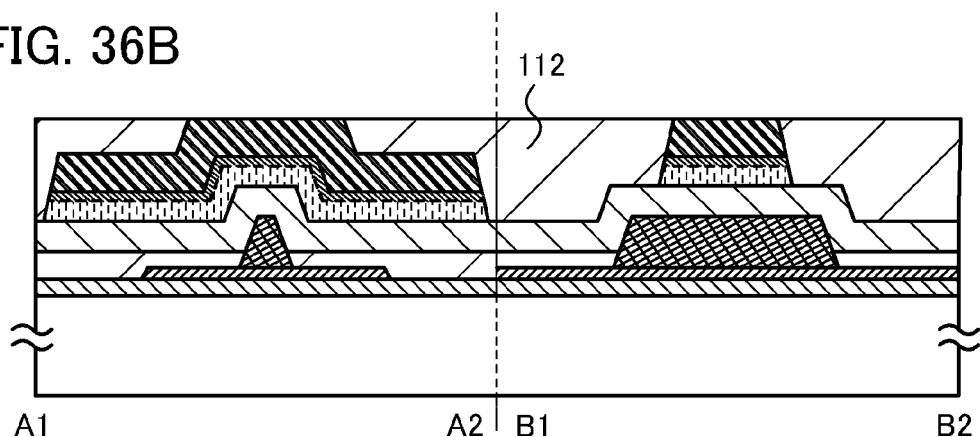

After that, planarization treatment is performed on the insulating film 113a to expose the conductive film 109b, so that the insulating film 112 is formed (see FIG. 36B).

Figure 36C:
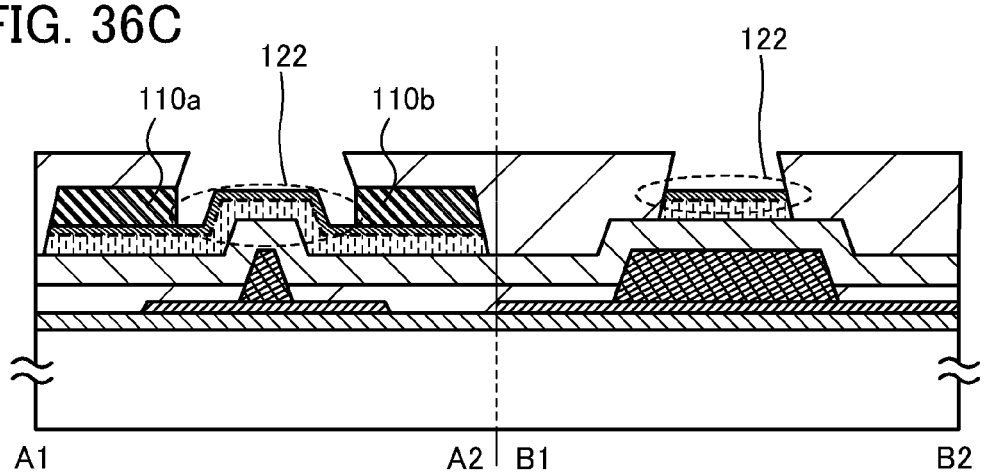

Next, the conductive film 109b overlapping with the region 122 is etched using the insulating film 112 as a mask, so that the source electrode 110a and the drain electrode 110b are formed (see FIG. 36C).

The conductive film 109b is selectively processed by utilizing the step of the conductive film 109b and using the planarized insulating film 112 as a mask, so that the source electrode 110a and the drain electrode 110b can be formed in a self-aligned manner with high positional accuracy even in the case where the transistor is miniaturized.

Figure 37A:
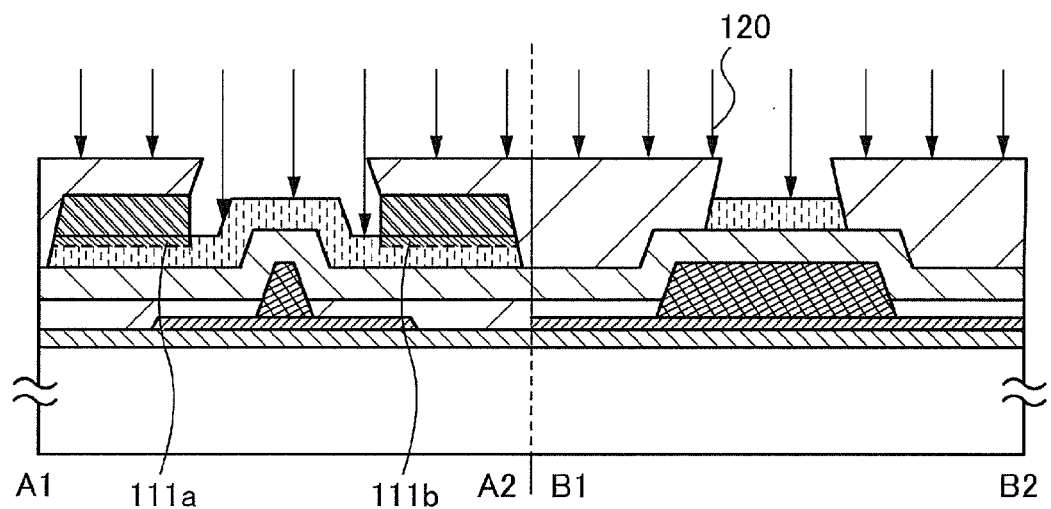
FIGS. 37A and 37B illustrate a method for manufacturing a transistor.
Figure 37B:
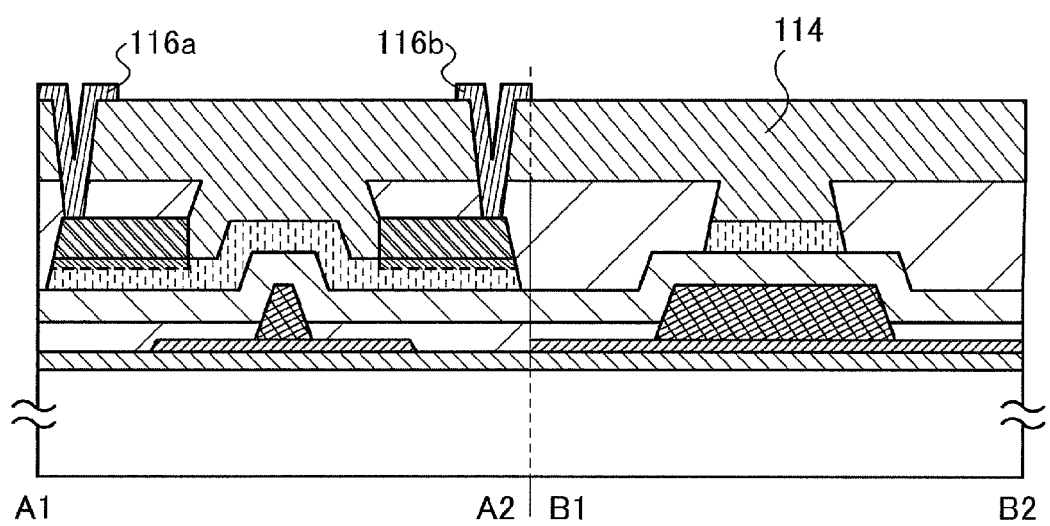

Next, the oxygen 120 is added to the region 122 of the oxide semiconductor film 108 (see FIG. 37A). As a result, the oxygen vacancy in the region 122 is reduced, so that the channel formation region can be highly intrinsic. At the same time, the low-resistance regions 111a and 111b can be formed.

Then, second heat treatment is preferably performed. The description of the first heat treatment can be referred to for the second heat treatment.

Next, the insulating film 114 serving as an oxide insulating film is formed over the oxide semiconductor film 108 and the insulating film 112. Then, openings reaching the source electrode 110a and the drain electrode 110b are formed in the insulating film 112 and the insulating film 114, and the wirings 116a and 116b electrically connected to the source electrode 110a and the drain electrode 110b, respectively, are formed in the openings (see FIG. 37B).

Next, third heat treatment is preferably performed. The third heat treatment can be performed under a condition similar to that of the first heat treatment.

This embodiment can be combined with any of the other embodiments in this specification as appropriate.

(Embodiment 3)

In this embodiment, the transistor having a structure partially different from that in Embodiment 1 is described with reference to drawings.

[6-1 Transistor Structure (6)]

Figure 9A:
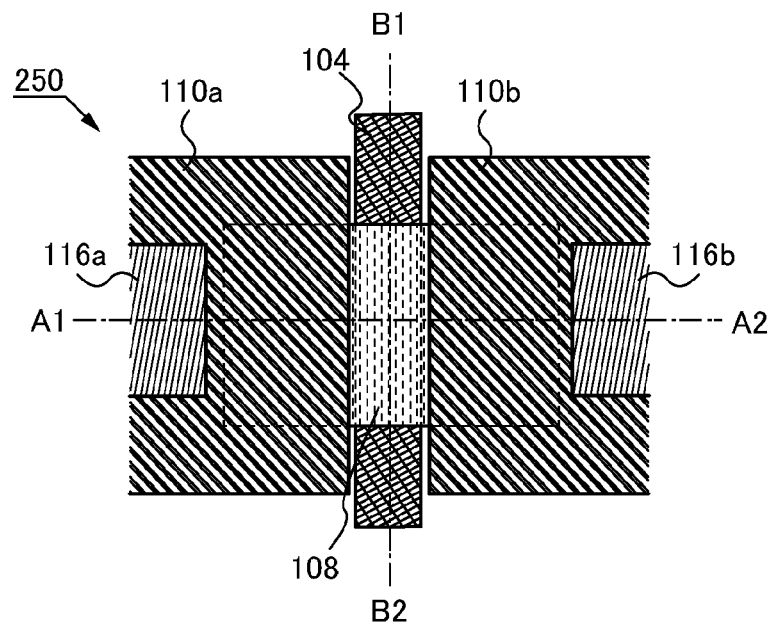
FIGS. 9A to 9C are a top view and cross-sectional views which illustrate a transistor.
Figure 9B:
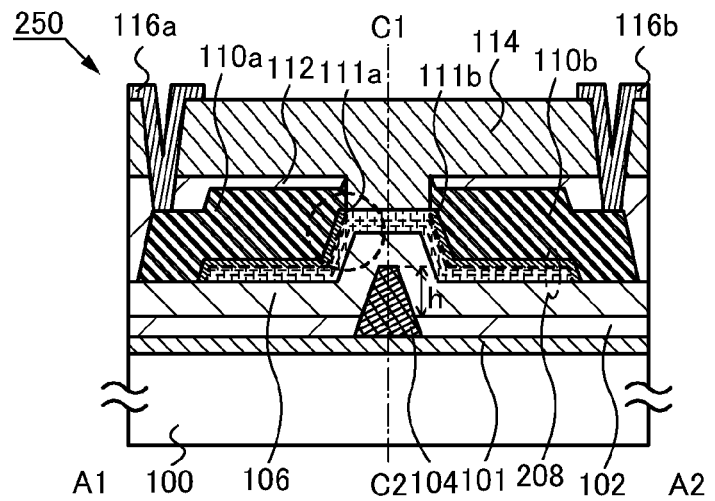
Figure 9C:
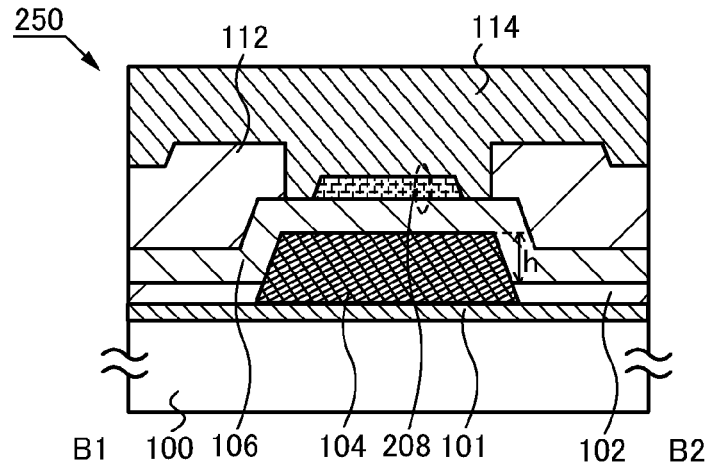
Figure 10:
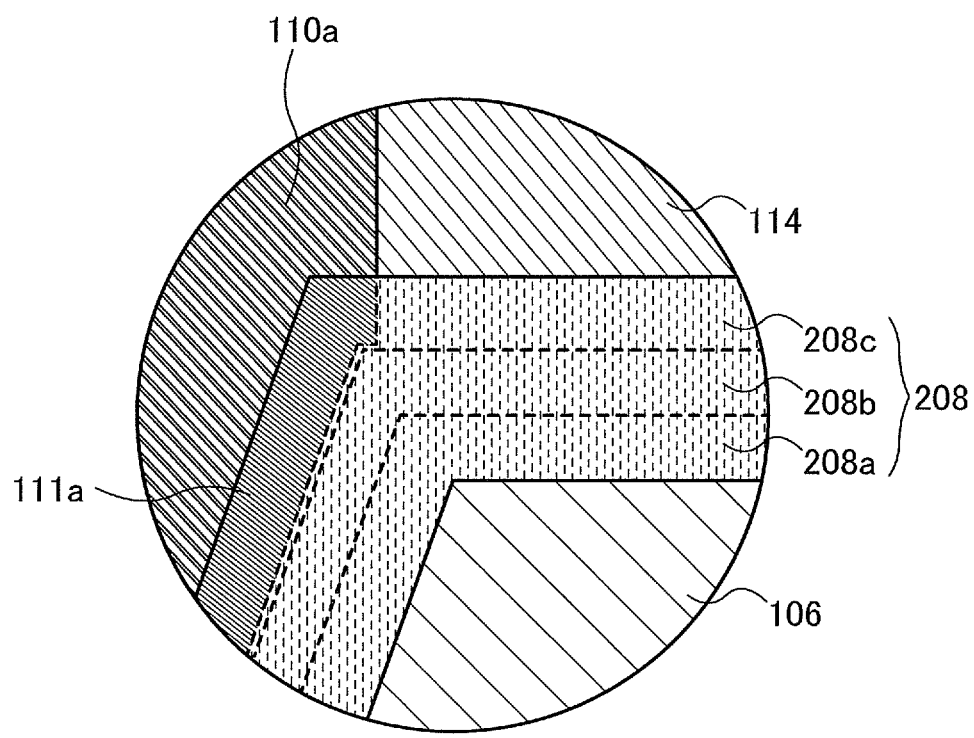
FIG. 10 is an enlarged cross-sectional view of a multilayer film.

FIGS. 9A to 9C illustrate a top view and cross-sectional views of a transistor 250. FIG. 9A is a top view. FIG. 9B is a cross-sectional view along dashed-dotted line A1-A2 of FIG. 9A. FIG. 9C is a cross-sectional view along dashed-dotted line B1-B2 of FIG. 9A. FIG. 10 is an enlarged view of a region surrounded by a dashed-line circle in FIG. 9B. Note that for simplification of the drawing, some components are not illustrated in the top view in FIG. 9A.

The transistor 250 in FIGS. 9A to 9C includes the base insulating film 101 over the substrate 100; the base insulating film 102 over the base insulating film 101; the gate electrode 104 which protrudes from the base insulating film 102; the gate insulating film 106 over the base insulating film 102 and the gate electrode 104; a multilayer film 208 over the gate insulating film 106; the source electrode 110a and the drain electrode 110b which are in contact with the multilayer film 208; the insulating film 112 over the source electrode 110a and the drain electrode 110b; the insulating film 114 over the multilayer film 208 and the insulating film 112; and the wiring 116a and the wiring 116b which are electrically connected to the source electrode 110a and the drain electrode 110b, respectively, through openings in the insulating film 112 and the insulating film 114. Oxygen is extracted from the multilayer film 208, so that the low-resistance regions 111a and 111b are formed near the interface between the multilayer film 208 and each of the source electrode 110a and the drain electrode 110b.

[6-1-1 Multilayer Film 208]

The multilayer film 208 includes an oxide film 208a, the oxide semiconductor film 208b, and an oxide film 208c. The multilayer film 208 overlaps with the gate electrode 104 with the gate insulating film 106 provided therebetween. In this embodiment, in the multilayer film 208, the oxide film 208a is provided in contact with the gate insulating film 106, the oxide semiconductor film 208b is provided over the oxide film 208a, and the oxide film 208c is provided over the oxide semiconductor film 208b. The stacked structure of the multilayer film 208 is not limited to this: for example, the oxide semiconductor film 208b may be provided in contact with the gate insulating film 106 and the oxide film 208c may be provided over oxide semiconductor film 208b.

In FIG. 9A, a distance between the source electrode 110a and the drain electrode 110b in a region overlapping with the gate electrode 104 is referred to as a channel length. Note that in the case where the transistor includes the source region and the drain region, a distance between the low-resistance regions 111a and 111b in the region overlapping with the gate electrode 104 may be referred to as a channel length.

In the multilayer film 208, a region which overlaps with the gate electrode 104 and is sandwiched between the source electrode 110a and the drain electrode 110b is referred to as a channel formation region (see FIG. 9B). Further, a region through which current mainly flows in the channel formation region is referred to as a channel region. Here, the channel region refers to a portion of the oxide semiconductor film 208b in the channel formation region.

In the multilayer film 208, boundaries between the oxide semiconductor film 208b and each of the oxide film 208a and the oxide film 208c are not clearly observed in some cases depending on the materials used for the oxide film 208a, the oxide semiconductor film 208b, and the oxide film 208c. Thus, in FIGS. 9B and 9C and FIG. 10, the boundaries between the oxide semiconductor film 208b and each of the oxide film 208a and the oxide film 208c are represented by dashed lines.

The oxide film 208a, the oxide semiconductor film 208b, and the oxide film 208c each include one of or both In and Ga. Typically, an In—Ga oxide (an oxide containing In and Ga), an In—Zn oxide (an oxide containing In and Zn), and an In-M-Zn oxide (an oxide contains In, an element M, and Zn, and the element M is one or more kinds of elements selected from Al, Ti, Ga, Y, Zr, La, Ce, Nd, and Hf.) can be used. The oxide semiconductor film 108 in Embodiment 1 can be referred to for the oxide semiconductor film 208b.

Further, the oxide films 208a and 208c, which are in contact with the oxide semiconductor film 208b, are each preferably formed using a material including one or more kinds of metal elements included in the oxide semiconductor film 208b. The use of such a material reduces an interface state between the oxide semiconductor film 208b and each of the oxide film 208a and the oxide film 208c. Thus, scattering or capture of carriers at the interface is less likely to occur, so that the field-effect mobility of the transistor can be improved. Further, variation in threshold voltage of the transistor can be reduced.

The oxide film 208a, the oxide semiconductor film 208b, and the oxide film 208c are successively formed under an inert gas atmosphere, an oxidation gas atmosphere, or a reduced pressure without exposure to the air during the formation steps, which reduces the interface state between the oxide semiconductor film 208b and the oxide film 208a and the interface state between the oxide semiconductor film 208b and the oxide film 208c.

The thickness of the oxide film 208a is greater than or equal to 3 nm and less than or equal to 50 nm, preferably greater than or equal to 3 nm and less than or equal to 20 nm The thickness of the oxide semiconductor film 208b is greater than or equal to 3 nm and less than or equal to 200 nm, preferably greater than or equal to 3 nm and less than or equal to 100 nm, more preferably greater than or equal to 3 nm and less than or equal to 50 nm. The thickness of the oxide film 208c is greater than or equal to 3 nm and less than or equal to 100 nm, preferably greater than or equal to 3 nm and less than or equal to 50 nm.

In the transistor 250 described in this embodiment, the source electrode 110a and the drain electrode 110b are in contact with the oxide film 208c. In order to reduce connection resistance between the source electrode 110a and the oxide semiconductor film 208b and between the drain electrode 110b and the oxide semiconductor film 208b, the oxide film 208c is preferably formed as thin as possible.

When each of the oxide semiconductor film 208b and the oxide film 208a is an In-M-Zn oxide, the oxide film 208a contains In, M, and Zn at an atomic ratio of $x_1:y_1:z_1$, and the oxide semiconductor film 208b contains In, M, and Zn at an atomic ratio of $x_2:y_2:z_2$, the oxide film 208a and the oxide semiconductor layer 208b are formed such that $y_1/x_1$ is larger than $y_2/x_2$. Note that the element M is a metal element whose bonding strength to oxygen is larger than that of In, and Al, Ti, Ga, Y, Zr, Sn, La, Ce, Nd, and Hf can be given as examples. Preferably, the oxide semiconductor film 208b and the oxide film 208a are formed such that $y_1/x_1$ is 1.5 times or more as large as $y_2/x_2$. Further preferably, the oxide semiconductor film 208b and the oxide film 208a are formed such that $y_1/x_1$ is twice or more as large as $y_2/x_2$. Still further preferably, the oxide semiconductor film 208b and the oxide film 208a are formed such that $y_1/x_1$ is three times or more as large as $y_2/x_2$. At this time, $y_1$ is preferably greater than or equal to $x_1$ in the oxide semiconductor film 208b, in which case stable electrical characteristics of a transistor can be achieved. However, when $y_1$ is three times or more as large as $x_1$, the field-effect mobility of the transistor is reduced; accordingly, $y_1$ is preferably smaller than three times $x_1$. When the oxide film 208a has the above structure, the oxide film 208a can be a film in which oxygen vacancies are less likely to occur than in the oxide semiconductor film 208b.

When the oxide semiconductor film 208b is an In-M-Zn oxide, it is preferable that, in the atomic ratio between In and M in the case where Zn and O are not taken into consideration, the proportion of In be greater than or equal to 25 atomic % and the proportion of M be less than 75 atomic %, and it is more preferable that, in the atomic ratio between In and M in the case where Zn and O are not taken into consideration, the proportion of In be greater than or equal to 34 atomic % and the proportion of M be less than 66 atomic %. When the oxide film 208a is an In-M-Zn oxide, it is preferable that, in the atomic ratio between In and M in the case where Zn and O are not taken into consideration, the proportion of In be less than 50 atomic % and the proportion of M be greater than or equal to 50 atomic %, and it is more preferable that, in the atomic ratio between In and M in the case where Zn and O are not taken into consideration, the proportion of In be less than 25 atomic % and the proportion of M be greater than or equal to 75 atomic %.

For example, the oxide semiconductor film 208b is formed using an In—Ga—Zn oxide having an atomic ratio of In:Ga:Zn=1:1:1 or 3:1:2 and the oxide film 208a is formed using an In—Ga—Zn oxide having an atomic ratio of In:Ga:Zn=1:3:4, 1:3:2, 1:6:2, 1:6:4, 1:6:10, 1:9:6, or 1:9:0. Note that the proportion of each atom in the atomic ratio of each of the oxide semiconductor film 208b and the oxide film 208a may vary within a range of ±20%.

When each of the oxide semiconductor film 208b and the oxide film 208c is an In-M-Zn oxide, the oxide film 208c contains In, M, and Zn at an atomic ratio of $x_1:y_1:z_1$, and the oxide semiconductor film 208b contains In, M, and Zn at an atomic ratio of $x_2:y_2:z_2$, the oxide film 208c and the oxide semiconductor layer 208b are formed such that $y_1/x_1$ is larger than $y_2/x_2$. Note that the element M is a metal element whose bonding strength to oxygen is larger than that of In, and Al, Ti, Ga, Y, Zr, Sn, La, Ce, Nd, and Hf can be given as examples. Preferably, the oxide semiconductor film 208b and the oxide film 208c are formed such that $y_1/x_1$ is 1.5 times or more as large as $y_2/x_2$. Further preferably, the oxide semiconductor film 208b and the oxide film 208c are formed such that $y_1/x_1$ is twice or more as large as $y_2/x_2$. Still further preferably, the oxide semiconductor film 208b and the oxide film 208c are formed such that $y_1/x_1$ is three times or more as large as $y_2/x_2$. At this time, $y_1$ is preferably greater than or equal to $x_1$ in the oxide semiconductor film 208b, in which case stable electrical characteristics of a transistor can be achieved. However, when $y_1$ is three times or more as large as $x_1$, the field-effect mobility of the transistor is reduced; accordingly, $y_1$ is preferably smaller than three times $x_1$. When the oxide film 208c has the above structure, the oxide film 208c can be a film in which oxygen vacancies are less likely to occur than in the oxide semiconductor film 208b.

When the oxide semiconductor film 208b is an In-M-Zn oxide, it is preferable that, in the atomic ratio between In and M in the case where Zn and O are not taken into consideration, the proportion of In be greater than or equal to 25 atomic % and the proportion of M be less than 75 atomic %, and it is more preferable that, in the atomic ratio between In and M in the case where Zn and O are not taken into consideration, the proportion of In be greater than or equal to 34 atomic % and the proportion of M be less than 66 atomic %. When the oxide film 208c is an In-M-Zn oxide, it is preferable that, in the atomic ratio between In and M in the case where Zn and O are not taken into consideration, the proportion of In be less than 50 atomic % and the proportion of M be greater than or equal to 50 atomic %, and it is more preferable that, in the atomic ratio between In and M in the case where Zn and O are not taken into consideration, the proportion of In be less than 25 atomic % and the proportion of M be greater than or equal to 75 atomic %.

For example, the oxide semiconductor film 208b is formed using an In—Ga—Zn oxide having an atomic ratio of In:Ga:Zn=1:1:1 or 3:1:2 and the oxide film 208c is formed using an In—Ga—Zn oxide having an atomic ratio of In:Ga:Zn=1:3:4, 1:3:2, 1:6:2, 1:6:4, 1:6:10, 1:9:6, or 1:9:0. Note that the proportion of each atom in the atomic ratio of each of the oxide semiconductor film 208b and the oxide film 208c may vary within a range of ±20%.

In order to give stable electrical characteristics to the transistor including the multilayer film 208, it is preferable that the oxygen vacancy and the impurity concentration in the oxide semiconductor film 208b be reduced and the oxide semiconductor film 208b be an intrinsic or substantially intrinsic semiconductor film. In particular, the channel formation region in the oxide semiconductor film 208b is preferably regarded as intrinsic or substantially intrinsic. Specifically, the carrier density of the oxide semiconductor film 208b is smaller than $1\times10^{17}/cm^3$, smaller than $1\times10^{15}/cm^3$, or smaller than $1\times10^{13}/cm^3$.

In the oxide semiconductor film 208b, hydrogen, nitrogen, carbon, silicon, and metal elements other than main components serve as impurities. In order to reduce the concentration of impurities in the oxide semiconductor film 208b, it is preferable to reduce the concentration of impurities in the oxide films 208a and 208c which are close to the oxide semiconductor film 208b to a value almost equal to that in the oxide semiconductor film 208b.

In particular, when silicon is contained in the oxide semiconductor film 208b at a high concentration, an impurity level caused by silicon is formed in the oxide semiconductor film 208b. The impurity level serves as a trap level, and may degrade electrical characteristics of a transistor. In order to reduce degradation of electrical characteristics of the transistor, the silicon concentration of the oxide semiconductor film 208b is smaller than $1\times10^{19}$ atoms/cm$^3$, preferably smaller than $5\times10^{18}$ atoms/cm$^3$, more preferably smaller than $1\times10^{18}$ atoms/cm$^3$. Further, the silicon concentration at the interface between the oxide semiconductor film 208b and each of the oxide film 208a and the oxide film 208c is also in the above range.

Note that as the gate insulating film of the transistor, an insulating film containing silicon is used in many cases; therefore, it is preferable that a region of the oxide semiconductor film, which serves as a channel, be not in contact with the gate insulating film for the above-described reason. In the case where a channel is formed at the interface between a gate insulating film and an oxide semiconductor film, scattering of carriers occurs at the interface, whereby the field-effect mobility of a transistor is reduced in some cases. Also from the view of the above, it is preferable that a region of the oxide semiconductor film, which serves as a channel, be apart from the gate insulating film.

Therefore, when the multilayer film 208 has the stacked-layer structure of the oxide film 208a, the oxide semiconductor film 208b, and the oxide film 208c, the oxide semiconductor film 208b in which a channel of the transistor is formed can be apart from the gate insulating film, so that the transistor can have high field effect mobility and stable electrical characteristics.

Further, hydrogen and nitrogen in the oxide semiconductor film 208b form donor levels, which increase carrier density. In order to make the oxide semiconductor film 208b intrinsic or substantially intrinsic, the concentration of hydrogen in the oxide semiconductor film 208b, which is measured by SIMS, is set to be lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$. The concentration of nitrogen in the oxide semiconductor film 208b, which is measured by SIMS, is set to be lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Note that when silicon and carbon are contained in the oxide semiconductor film 208b at a high concentration, the crystallinity of the oxide semiconductor film 208b is lowered in some cases. In order not to lower the crystallinity of the oxide semiconductor film 208b, the concentration of silicon in the oxide semiconductor film 208b is preferably set lower than $1\times10^{19}$ atoms/cm$^3$, preferably lower than $5\times10^{18}$ atoms/cm$^3$, further preferably lower than $1\times10^{18}$ atoms/cm$^3$. Moreover, in order not to lower the crystallinity of the oxide semiconductor film 208b, the concentration of carbon in the oxide semiconductor film 208b is set to be lower than $1\times10^{19}$ atoms/cm$^3$, preferably lower than $5\times10^{18}$ atoms/cm$^3$, further preferably lower than $1\times10^{18}$ atoms/cm$^3$.

Further, since the band gap of an oxide semiconductor is 2 eV or higher, in a transistor including an oxide semiconductor, leakage current when the transistor is off (also referred to as off-state current) is extremely small. Specifically, in a transistor whose channel length is 3 μm and channel width is 10 μm, the off-state current can be lower than $1\times10^{-20}$ A, preferably lower than $1\times10^{-22}$ A, further preferably lower than $1\times10^{-24}$ A. In other words, the on/off ratio of the transistor can be greater than or equal to 20 digits and less than or equal to 150 digits.

Localized levels of the multilayer film 208 are described below. By reducing the density of localized levels of the multilayer film 208, a transistor including the multilayer film 208 can have stable electrical characteristics. The localized levels of the multilayer film 208 can be measured by a constant photocurrent method (CPM).

In order that the transistor has stable electrical characteristics, the absorption coefficient due to the localized levels of the multilayer film 208 measured by CPM is preferably lower than $1\times10^{-3}$ cm$^{-1}$, further preferably lower than $3\times10^{-4}$ cm$^{-1}$. Further, when the absorption coefficient due to the localized levels of the multilayer film 208 measured by CPM is lower than $1\times10^{-3}$ cm$^{-1}$, preferably lower than $3\times10^{-4}$ cm$^{-1}$, the field-effect mobility of the transistor can be increased. In order that the absorption coefficient due to the localized levels of the multilayer film 208 measured by CPM is lower than $1\times10^{-3}$ cm$^{-1}$, preferably lower than $3\times10^{-4}$ cm$^{-1}$, the concentration of silicon, germanium, carbon, hafnium, titanium, and the like in the oxide semiconductor film 208b which form localized levels is preferably lower than $2\times10^{18}$ atoms/cm$^3$, further preferably lower than $2\times10^{17}$ atoms/cm$^3$.

In the CPM measurement, the amount of light with which a surface of the sample between terminals is irradiated is adjusted so that a photocurrent value is kept constant in the state where voltage is applied between electrodes provided in contact with the multilayer film 208 that is the sample, and then an absorption coefficient is derived from the amount of the irradiation light at each wavelength. In the CPM measurement, when the sample has a defect, the absorption coefficient of energy which corresponds to a level at which the defect exists (calculated from a wavelength) is increased. The increase in the absorption coefficient is multiplied by a constant, whereby the defect density of the sample can be obtained.

The localized levels measured by CPM probably result from an impurity or a defect. In other words, a transistor which includes the multilayer film having a small absorption coefficient due to the localized levels measured by CPM can have stable electrical characteristics.

[6-1-1a Energy Band Diagram of Multilayer Film 208]

Figure 11A:
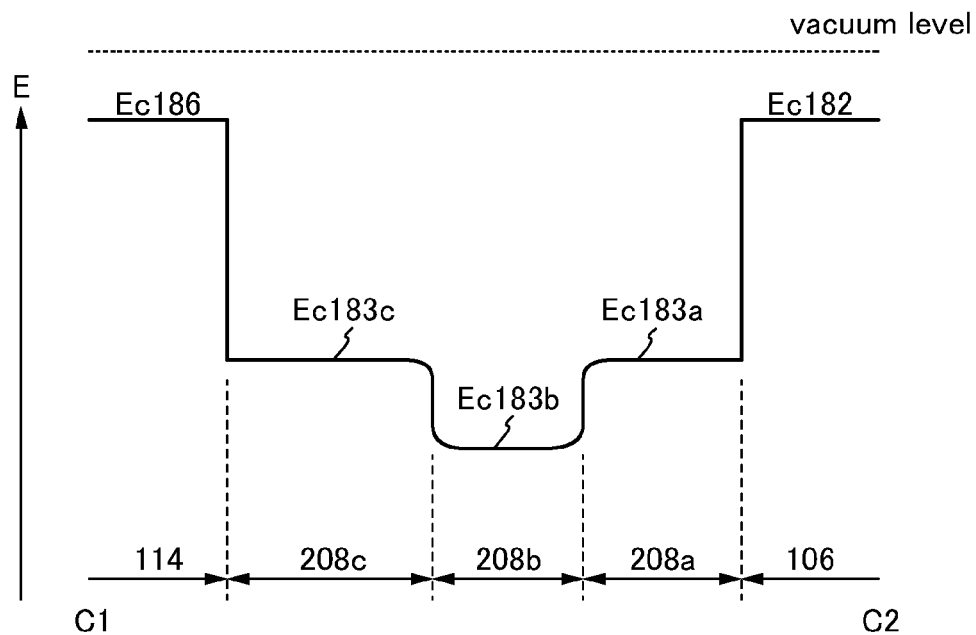
FIGS. 11A and 11B each illustrate an energy band structure of a multilayer film.
Figure 11B:
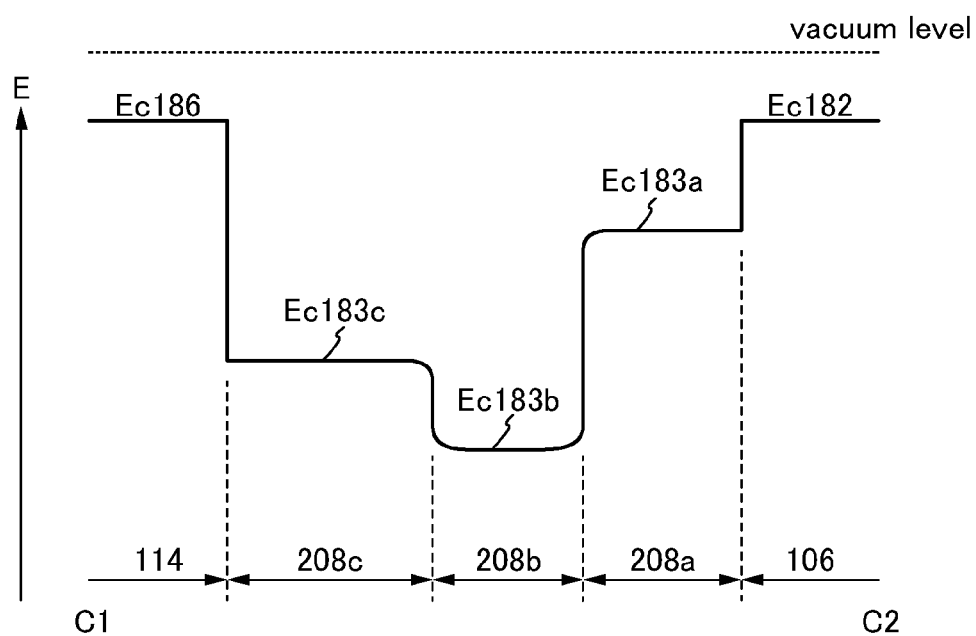

A function and an effect of the multilayer film 208 in this embodiment are described below with reference to energy band diagrams of FIGS. 11A and 11B. FIGS. 11A and 11B each show the energy band structure along dashed-dotted line C1-C2 in FIG. 9B.

In FIGS. 11A and 11B, Ec182, Ec183a, Ec183b, Ec183c, and Ec186 represent the energies of the conduction band bottoms of the gate insulating film 106, the oxide film 208a, the oxide semiconductor film 208b, the oxide film 208c, and the insulating film 114, respectively.

Here, the energy difference between the vacuum level and the conduction band bottom (the difference is also referred to as electron affinity) corresponds to a value obtained by subtracting an energy gap from the energy difference between the vacuum level and the valence band top (the difference is also referred to as an ionization potential). Note that the energy gap can be measured using a spectroscopic ellipsometer (UT-300 manufactured by HORIBA JOBIN YVON SAS.). Note that the energy difference between the vacuum level and the valence band top can be measured using an ultraviolet photoelectron spectroscopy (UPS) device (VersaProbe manufactured by ULVAC-PHI, Inc.).

Since the gate insulating film 106 and the insulating film 114 are insulators, Ec182 and Ec186 are closer to the vacuum level (have a smaller electron affinity) than Ec183a, Ec183b, and Ec183c.

Further, Ec183a and Ec183c are closer to the vacuum level than Ec183b is. Specifically, the energy difference between Ec183b and Ec183a and the energy difference between Ec183b and Ec183c are each greater than or equal to 0.05 eV and less than or equal to 2 eV. Preferably, the lower limit of each of the energy differences is greater than or equal to 0.1 eV, more preferably greater than or equal to 0.15 eV. Preferably, the upper limit of each of the energy differences is less than or equal to 0.5 eV, more preferably less than or equal to 0.4 eV.

As illustrated in FIGS. 11A and 11B, there is no barrier between the oxide semiconductor film 208b and the oxide film 208a and between the oxide semiconductor film 208b and the oxide film 208c, and the energy of the conduction band bottom smoothly varies. In other words, the energy of the conduction band bottom successively varies. This is because the oxide films 208a and 208c each contain an element common to the oxide semiconductor film 208b, and oxygen moves between the oxide semiconductor film 208b and the oxide film 208a and between the oxide semiconductor film 208b and the oxide film 208c to form a mixed layer.

Thus, it can be said that no state or few states exist at the interface between the oxide semiconductor film 208b and the oxide film 208a and the interface between the oxide semiconductor film 208b and the oxide film 208c. Accordingly, electrons transfer mainly through the oxide semiconductor film 208b in the multilayer film 208 having the above energy band structure. That is, the channel region is formed in the oxide semiconductor film 208b. Therefore, even when a state exists at an interface with the insulating film that is the outside of the multilayer film 208, the state hardly influences the transfer of the electrons because the level exists apart from the channel region. In addition, since no state or few states exist between the layers included in the multilayer film 208, the transfer of electrons is not interrupted in the channel region. Accordingly, the oxide semiconductor film 208b of the multilayer film 208 has high electron mobility.

In order to obtain the energy band structure shown in FIG. 11A, the oxide semiconductor film 208b is formed using an In—Ga—Zn oxide having an atomic ratio of In:Ga:Zn=1:1:1 and the oxide films 208a and 208c are each formed using an In—Ga—Zn oxide having an atomic ratio of In:Ga:Zn=1:3:2.

Note that the band gaps of the oxide films 208a and 208c are each preferably wider than the band gap of the oxide semiconductor film 208b.

The energy band diagram of the transistor 250 is not limited to that in FIG. 11A. The oxide film 208a may be formed using a material of which the energy of the conduction band bottom is closer to the vacuum level than the energy of the conduction band bottom of the oxide film 208c is (see FIG. 11B).

In order to obtain the energy band structure shown in FIG. 11B, in the case where the oxide semiconductor film 208b is formed using an In—Ga—Zn oxide having an atomic ratio of In:Ga:Zn=1:1:1 and the oxide film 208c is formed using an In—Ga—Zn oxide having an atomic ratio of In:Ga:Zn=1:3:2, the oxide film 208a may be formed using an In—Ga—Zn oxide having an atomic ratio of, for example, In:Ga:Zn=1:6:4 or 1:9:4.

In this manner, in the case of the energy band structure shown in FIGS. 11A and 11B, the oxide semiconductor film 208b in the multilayer film 208 can have high electron mobility, variation in the threshold voltage can be reduced, so that the transistor 250 having favorable electrical characteristics can be achieved.

As described above, the conductive film is selectively processed by utilizing the step of the conductive film and using the planarized insulating film 112 over the conductive film as a mask, so that the source electrode 110a and the drain electrode 110b can be formed in a self-aligned manner with high positional accuracy even in the case where the transistor is miniaturized. Oxygen is added to the multilayer film 208 using the source electrode 110a and the drain electrode 110b as a mask, so that oxygen vacancy in the oxide semiconductor film 208b included in the multilayer film 208 is reduced and the channel formation region can be highly intrinsic. Thus, a channel is formed in the oxide semiconductor film 208b; as a result, the transistor has stable electrical characteristics and high field-effect mobility.

[6-2 Fabrication Method of Transistor Structure (6)]

The fabrication method of transistor structure (1) described in Embodiment 1 can be referred to for the method for manufacturing the transistor 250 described in this embodiment except for the step of forming the multilayer film 208.

The multilayer film 208 can be formed as follows. The gate insulating film 106 is formed. Next, over the gate insulating film 106, a multilayer film is formed by forming an oxide film which is to be processed into the oxide film 208a, forming an oxide semiconductor film which is to be processed into the oxide semiconductor film 208b over the oxide film, and forming an oxide film which is to be processed into the oxide film 208c over the oxide semiconductor film. A resist mask is formed over the multilayer film and then part of the multilayer film is selectively etched using the resist mask, so that the multilayer film 208 including the oxide film 208a, the oxide semiconductor film 208b and the oxide film 208c is formed.

Note that the etching for forming the multilayer film 208 can be performed by one of or both a dry etching method and a wet etching method.

A chlorine-based gas typified by chlorine ($Cl_2$), boron trichloride ($BCl_3$), silicon tetrachloride ($SiCl_4$), carbon tetrachloride ($CCl_4$), or the like can be used as an etching as for the dry etching of the multilayer film 208. As a plasma source in the case where the etching of the multilayer film 208 is performed by a dry etching method, a capacitively coupled plasma (CCP), an inductively coupled plasma (ICP), an electron cyclotron resonance (ECR) plasma, a helicon wave plasma (HWP), a microwave-excited surface wave plasma (SWP), or the like can be used. In particular, with ICP, ECR, HWP, and SWP, a high density plasma can be generated. In the case of the etching according to the dry etching method (hereinafter also referred to as a "dry etching"), the etching conditions (the amount of electric power applied to a coil-shaped electrode, the amount of electric power applied to an electrode on a substrate side, the temperature of the electrode on the substrate side, and the like) are adjusted as appropriate so that the film can be etched into a desired shape.

In the case where the multilayer film 208 is etched by a wet etching method, a solution obtained by mixing phosphoric acid, acetic acid, and nitric acid, a solution containing oxalic acid, a solution containing phosphoric acid, or the like can be used as the etchant. Alternatively, ITO-07N (produced by KANTO CHEMICAL CO., INC.) may be used.

Note that the first heat treatment is preferably performed at least before or after the etching step for forming the multilayer film 208. Embodiment 1 can be referred to for the first heat treatment.

Embodiment 1 can also be referred to for the steps up to formation of the gate insulating film 106 and the steps after formation of the conductive film to be the source electrode 110a and the drain electrode 110b.

[7 Transistor Structure (7)]

Figure 12A:
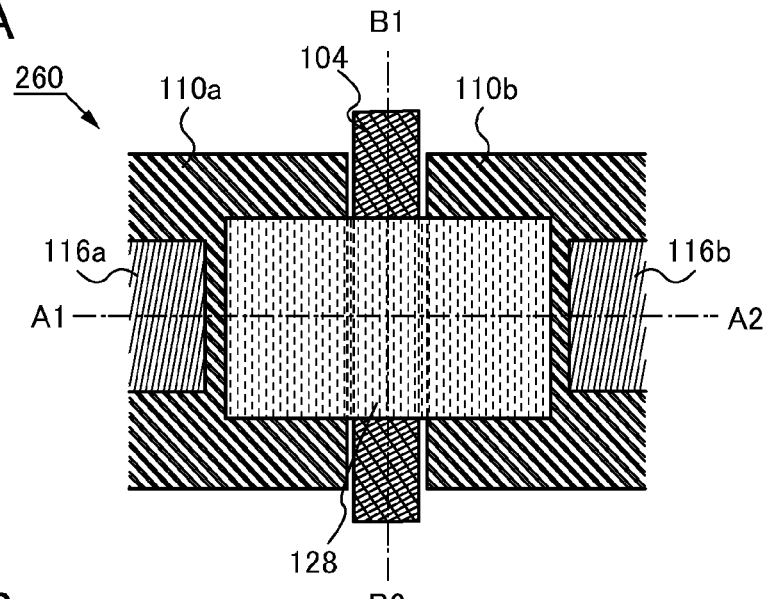
FIGS. 12A to 12C are a top view and cross-sectional views which illustrate a transistor.
Figure 12B:
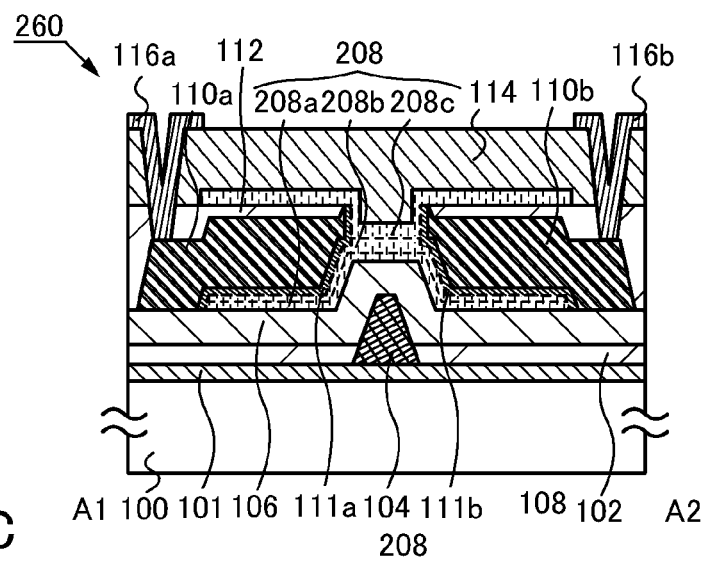
Figure 12C:
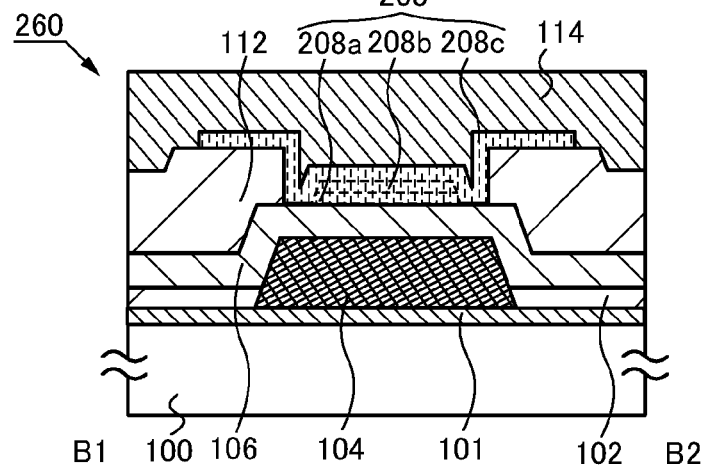

Further, FIG. 12B illustrates another transistor structure. FIGS. 12A to 12C are a top view and cross-sectional views which illustrate a transistor of one embodiment of the present invention. FIG. 12A is a top view. FIG. 12B is a cross-sectional view along dashed-dotted line A1-A2 of FIG. 12A. FIG. 12C is a cross-sectional view along dashed-dotted line B1-B2 of FIG. 12A. Note that for simplification of the drawing, some components are not illustrated in the top view in FIG. 12A.

A transistor 260 in FIGS. 12A to 12C includes the base insulating film 101 over the substrate 100; the base insulating film 102 over the base insulating film 101; the gate electrode 104 which protrudes from the base insulating film 102; the gate insulating film 106 over the base insulating film 102 and the gate electrode 104; the oxide film 208a over the gate insulating film 106; the oxide semiconductor film 208b over the oxide film 208a; the source electrode 110a and the drain electrode 110b which are in contact with the oxide semiconductor film 208b; the insulating film 112 over the source electrode 110a and the drain electrode 110b; the oxide film 208c over the oxide semiconductor film 208b and the insulating film 112; the insulating film 114 over the oxide film 208c and the insulating film 112; and the wiring 116a and the wiring 116b which are electrically connected to the source electrode 110a and the drain electrode 110b, respectively, through openings in the insulating film 112 and the insulating film 114. The oxide film 208a, the oxide semiconductor film 208b, and the oxide film 208c are collectively referred to as the multilayer film 208. Oxygen is extracted from the multilayer film 208, so that the low-resistance regions 111a and 111b are formed near the interface between the multilayer film 208 and each of the source electrode 110a and the drain electrode 110b.

In the case where the oxide film 208c is formed over the oxide semiconductor film 208b and the insulating film 112 as described above, the source electrode 110a and the drain electrode 110b are in contact with the oxide semiconductor film 208b in which a channel is formed, so that contact resistance can be reduced.

This embodiment can be combined with any of the other embodiments in this specification as appropriate.

(Embodiment 4)
[Display Device]

The transistor described in the above embodiments can be used in a display device. Further, with the above-described transistor, part or all of a driver circuit which includes the transistor can be formed over a substrate where a pixel portion is formed, whereby a system-on-panel can be formed. Structural examples of a display device in which the above transistor can be used are described with reference to FIG. 13, FIGS. 14A to 14C, FIGS. 15A and 15B, FIG. 16, and FIGS. 17A to 17C.

As a display element provided in the display device, a liquid crystal element (also referred to as a liquid crystal display element), a light-emitting element (also referred to as a light-emitting display element), or the like can be used. A light-emitting element includes, in its category, an element whose luminance is controlled by current or voltage, and specifically an inorganic electroluminescent (EL) element, an organic EL element, and the like. Furthermore, a display medium whose contrast is changed by an electric effect, such as electronic ink, can be used as the display element. A display device including an EL element and a display device including a liquid crystal element are described below as examples of the display device.

The display device described below includes, in its category, a panel in which a display element is sealed and a module in which an IC such as a controller is mounted on the panel.

The display device described below refers to an image display device or a light source (including a lighting device). The display device includes any of the following modules in its category: a module provided with a connector such as an FPC or TCP; a module in which a printed wiring board is provided at the end of TCP; and a module in which an integrated circuit (IC) is mounted directly on a display element by a COG method.

The display devices described below can be provided with an input means (a touch sensor) capable of contact or proximity sensing of an object (not shown). For example, as the input means capable of contact sensing, touch sensors of various types such as a resistive type, a capacitive type, an infrared ray type, an electromagnetic induction type, and a surface acoustic wave type can be used. As the input means capable of proximity sensing, an infrared camera or the like can be used.

The input means may be provided over a display device described below to form what is called an on-cell display device or may be provided integrally with a display device described below to form what is called an in-cell display device.

[EL Display Device]

Here, a display device including an EL element (also called an EL display device) is described.

Figure 13:
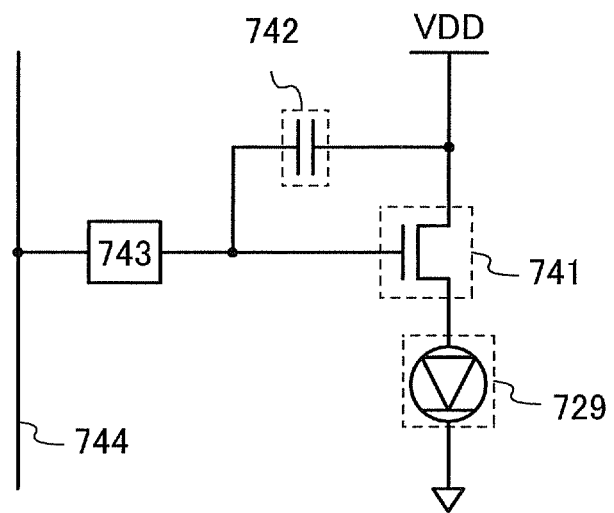
FIG. 13 illustrates an example of a pixel circuit which can be used for a display device.

FIG. 13 is an example of a circuit diagram of a pixel in the EL display device.

The EL display device illustrated in FIG. 13 includes a switching element 743, a transistor 741, a capacitor 742, and a light-emitting element 729.

A gate of the transistor 741 is electrically connected to one terminal of the switching element 743 and one terminal of the capacitor 742. A source of the transistor 741 is electrically connected to one terminal of the light-emitting element 729. A drain of the transistor 741 is electrically connected to the other terminal of the capacitor 742 and is supplied with a power supply potential VDD. The other terminal of the switching element 743 is electrically connected to a signal line 744. The other terminal of the light-emitting element 729 is supplied with a fixed potential. Note that the fixed potential is a ground potential GND or lower.

Note that as the transistor 741, the transistor described in the above embodiment is used. The transistor has stable electrical characteristics. Thus, the EL display device can have high display quality.

As the switching element 743, a transistor is preferably used. When the transistor is used as the switching element, the area of a pixel can be reduced, so that the EL display device can have high resolution. Alternatively, the transistor described in the above embodiment may be used as the switching element 743. When the above transistor is used as the switching element 743, the switching element 743 can be formed in the same process as the transistor 741, so that the productivity of the EL display device can be improved.

Figure 14A:
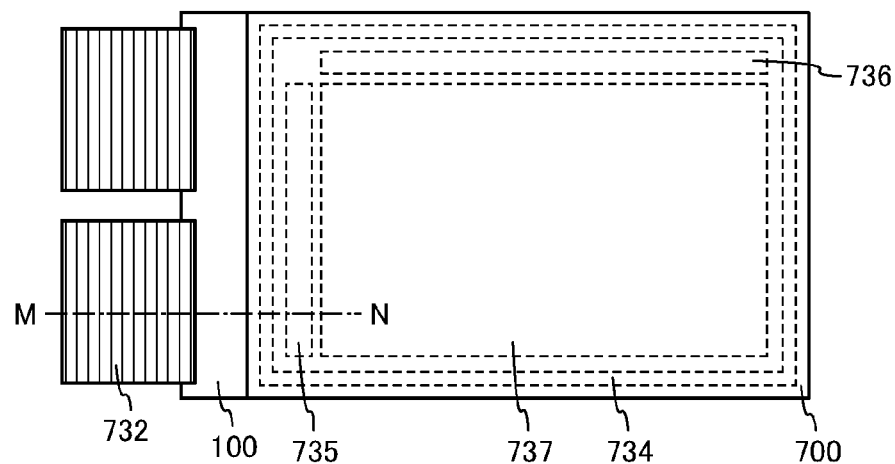
FIGS. 14A to 14C illustrate an example of a display device.

FIG. 14A is a top view of an EL display device. The EL display device includes the substrate 100, a substrate 700, a sealant 734, a driver circuit 735, a driver circuit 736, a pixel 737, and an FPC 732. The sealant 734 is provided between the substrate 100 and the substrate 700 so as to surround the pixel 737, the driver circuit 735 and the driver circuit 736. Note that the driver circuit 735 and/or the driver circuit 736 may be provided outside the sealant 734.

Figure 14B:
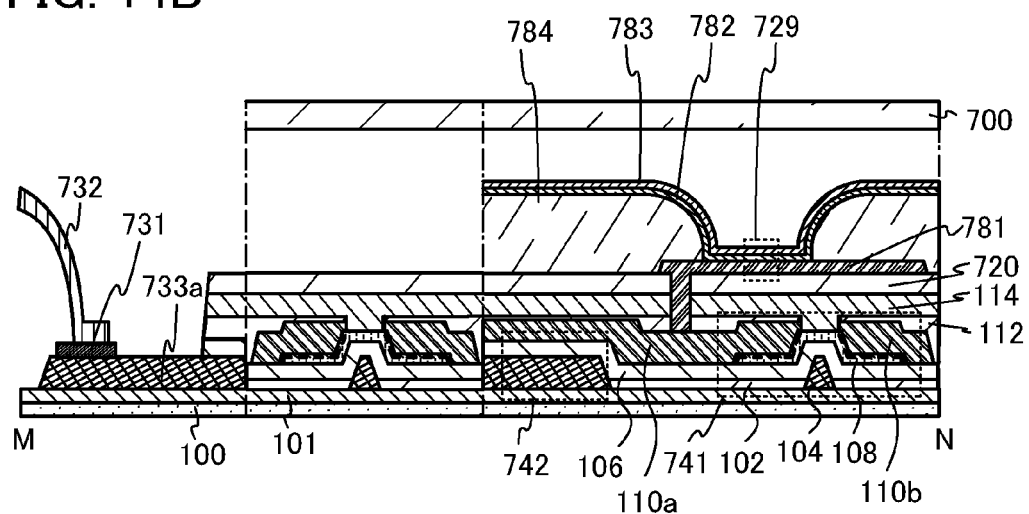

FIG. 14B is a cross-sectional view of the EL display device taken along dashed-dotted line M-N in FIG. 14A. The FPC 732 is connected to a wiring 733a via a terminal 731. Note that the wiring 733a is formed in the same layer as the gate electrode 104.

Note that FIG. 14B shows an example in which the transistor 741 and the capacitor 742 are provided in the same plane. With such a structure, the capacitor 742 can be formed in the same plane as a gate electrode, a gate insulating film, and a source electrode (drain electrode), which are included in the transistor 741. When the transistor 741 and the capacitor 742 are provided in the same plane in this manner, the number of manufacturing steps of the EL display device can be reduced; thus the productivity can be improved.

FIG. 14B illustrates an example in which the transistor illustrated in FIGS. 1A to 1C is used as the transistor 741. Therefore, for components of the transistor 741 which are not particularly described below, the description on FIGS. 1A to 1C is referred to.

An insulating film 720 is provided over the transistor 741 and the capacitor 742.

Here, an opening reaching the source electrode 110a of the transistor 741 is provided in the insulating films 720, 114, and 112.

A partition 784 having an opening reaching the electrode 781 is provided over an electrode 781.

A light-emitting layer 782 in contact with the electrode 781 through the opening provided in the partition 784 is provided over the partition 784.

An electrode 783 is provided over the light-emitting layer 782.

A region where the electrode 781, the light-emitting layer 782, and the electrode 783 overlap with one another serves as the light-emitting element 729.

The insulating film 720 is formed using a material selected from aluminum nitride, aluminum oxide, aluminum nitride oxide, aluminum oxynitride, magnesium oxide, silicon nitride, silicon oxide, silicon nitride oxide, silicon oxynitride, gallium oxide, germanium oxide, yttrium oxide, zirconium oxide, lanthanum oxide, neodymium oxide, hafnium oxide, and tantalum oxide. Alternatively, a resin film of a polyimide resin, an acrylic resin, an epoxy resin, a silicone resin, or the like may be used.

Figure 14C:
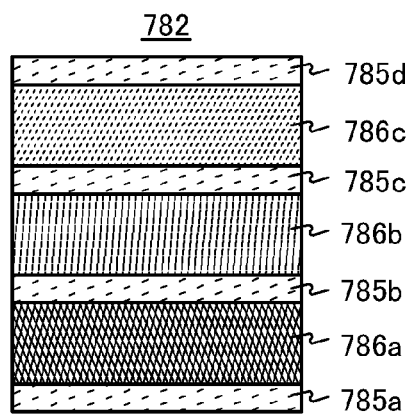

The light-emitting layer 782 is not limited to a single layer, and may be a stack including a plurality of kinds of light-emitting layers and the like. For example, a structure illustrated in FIG. 14C may be employed. FIG. 14C illustrates a structure in which an intermediate layer 785a, a light-emitting layer 786a, an intermediate layer 785b, a light-emitting layer 786b, an intermediate layer 785c, a light-emitting layer 786c, and an intermediate layer 785d are stacked in this order. In that case, when light-emitting layers emitting light of appropriate colors are used as the light-emitting layer 786a, the light-emitting layer 786b, and the light-emitting layer 786c, the light-emitting element 729 with a high color rendering property or higher emission efficiency can be formed.

A plurality of kinds of light-emitting layers may be stacked to obtain white light. Although not illustrated in FIG. 14B, white light may be extracted through coloring layers.

Although the structure in which three light-emitting layers 786 and four intermediate layers 785 are provided is shown here, the structure is not limited thereto. The number of light-emitting layers and the number of intermediate layers can be changed as appropriate. For example, the light-emitting layer 782 can be formed with only the intermediate layer 785a, the light-emitting layer 786a, the intermediate layer 785b, the light-emitting layer 786b, and the intermediate layer 785c. Alternatively, the light-emitting layer 782 may be formed with the intermediate layer 785a, the light-emitting layer 786a, the intermediate layer 785b, the light-emitting layer 786b, the light-emitting layer 786c, and the intermediate layer 785d; the intermediate layer 785c may be omitted.

Further, the intermediate layer may have a stacked-layer structure including a hole-injection layer, a hole-transport layer, an electron-transport layer, an electron-injection layer, or the like. Note that not all of these layers need to be provided in the intermediate layer. Any of these layers may be selected as appropriate to form the intermediate layer. Note that layers having similar functions may be provided. Further, an electron-relay layer or the like may be added as appropriate in the intermediate layer, in addition to a carrier generation layer.

The electrode 781 can be formed using a conductive film having visible light permeability. Having visible light permeability means having an average transmittance of 70% or more, particularly 80% or more in the visible light region (e.g., the range of wavelength of from 400 nm to 800 nm).

As the electrode 781, for example, an oxide film such as an In—Zn—W oxide film, an In—Sn oxide film, an In—Zn oxide film, an indium oxide film, a zinc oxide film, or a tin oxide film may be used. The above oxide film may contain a minute amount of Al, Ga, Sb, F, or the like. Further, a metal thin film having a thickness which enables light to be transmitted (preferably, approximately 5 nm to 30 nm) can also be used. For example, an Ag film, an Mg film, or an Ag—Mg alloy film with a thickness of 5 nm may be used.

The electrode 781 is preferably a film which efficiently reflects visible light. For example, a film containing lithium, aluminum, titanium, magnesium, lanthanum, silver, silicon, or nickel can be used as the electrode 781.

The electrode 783 can be formed using any of the films for the electrode 781. Note that when the electrode 781 has visible light permeability, it is preferable that the electrode 783 efficiently reflects visible light. When the electrode 781 efficiently reflects visible light, it is preferable that the electrode 783 have visible light permeability.

Positions of the electrode 781 and the electrode 783 are not limited to the structure illustrated in FIG. 14B, and the electrode 781 and the electrode 783 may be replaced with each other. It is preferable to use a conductive film having a high work function for the electrode which serves as an anode and a conductive film having a low work function for the electrode which serves as a cathode. Note that in the case where a carrier generation layer is provided in contact with the anode, a variety of conductive films can be used for the anode regardless of their work functions.

For the partition 784, the description of the insulating film 720 is referred to.

In the display device, a black matrix (light-blocking film), an optical member (optical substrate) such as a polarizing member, a retardation member, or an anti-reflection member, and the like are provided as appropriate. For example, circular polarization may be obtained by using a polarizing substrate and a retardation substrate.

The transistor 741 connected to the light-emitting element 729 has stable electrical characteristics. Thus, a display device having high display quality can be provided.

Figure 15A:
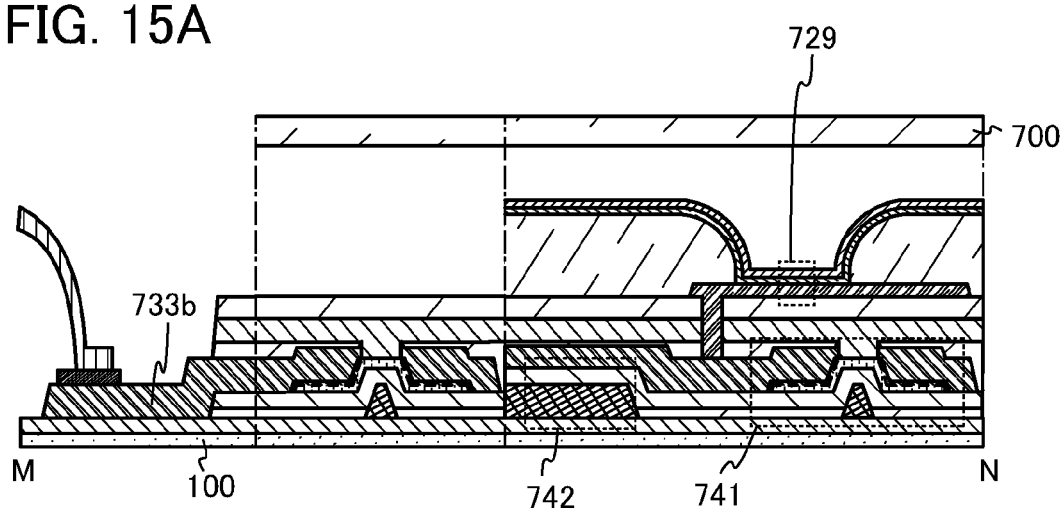
FIGS. 15A and 15B each illustrate an example of a display device.
Figure 15B:
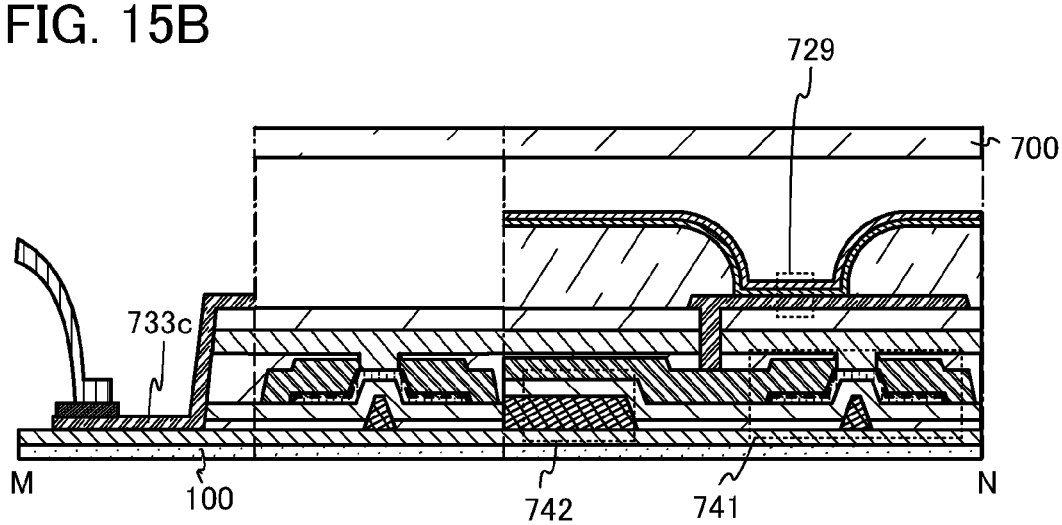

FIGS. 15A and 15B each illustrate an example of a cross section of an EL display device which is partly different from that in FIG. 14B. Specifically, the difference lies in a wiring connected to the FPC 732. In FIG. 15A, a wiring 733b is connected to the FPC 732 via the terminal 731. The wiring 733b is formed in the same layer as the source electrode 110a and the drain electrode 110b. In FIG. 15B, a wiring 733c is connected to the FPC 732 via the terminal 731. The wiring 733c is formed in the same layer as the electrode 781.

[Liquid Crystal Display Device]

Next, a display device including a liquid crystal element (also called a liquid crystal display device) is described.

Figure 16:
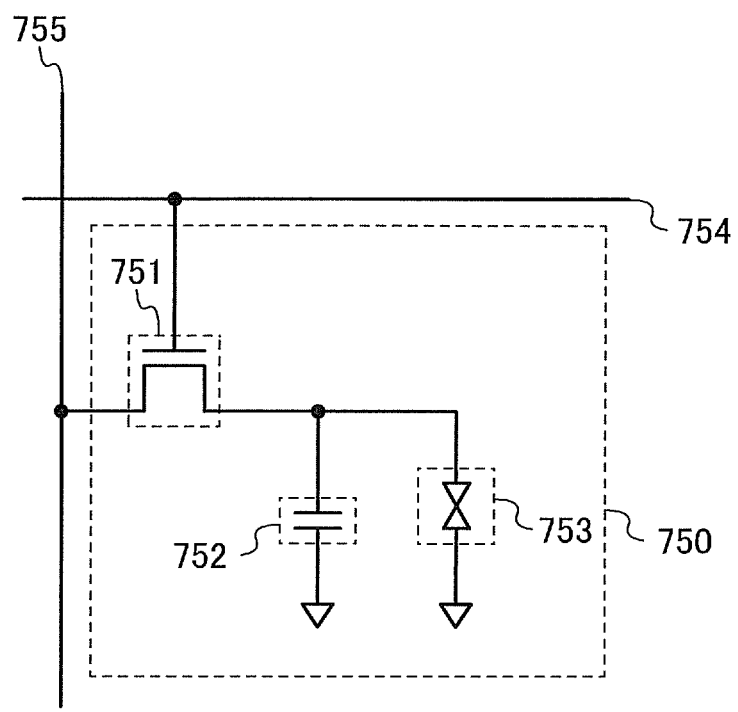
FIG. 16 illustrates an example of a pixel circuit which can be used for a display device.

FIG. 16 is a circuit diagram showing a structural example of a pixel of the liquid crystal display device. A pixel 750 illustrated in FIG. 16 includes a transistor 751, a capacitor 752, and an element 753 in which liquid crystal is injected between a pair of electrodes (hereinafter also referred to as liquid crystal element).

One of a source and a drain of the transistor 751 is electrically connected to a signal line 755, and a gate of the transistor 751 is electrically connected to a scan line 754.

One of electrodes of the capacitor 752 is electrically connected to the other of the source and the drain of the transistor 751, and the other of the electrodes of the capacitor 752 is electrically connected to a wiring for supplying a common potential.

One of electrodes of the liquid crystal element 753 is electrically connected to the other of the source and the drain of the transistor 751, and the other of the electrodes of the liquid crystal element 753 is electrically connected to a wiring for supplying a common potential. Note that the common potential supplied to the wiring to which the other of the electrodes of the capacitor 752 is electrically connected may be different from the common potential supplied to the other of the electrodes of the liquid crystal element 753.

Figure 17A:
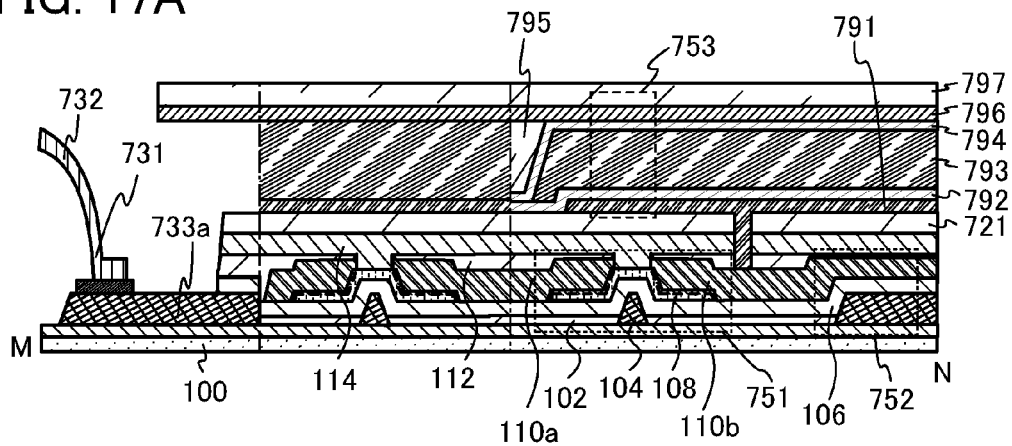
FIGS. 17A to 17C each illustrate an example of a display device.

Note that a top view of the liquid crystal display device is roughly similar to that of the EL display device. FIG. 17A is a cross-sectional view of the liquid crystal display device taken along dashed-dotted line M-N in FIG. 14A. In FIG. 17A, the FPC 732 is connected to the wiring 733a via the terminal 731. Note that the wiring 733a is formed in the same layer as the gate electrode 104.

Note that FIG. 17A illustrates an example in which the transistor 751 and the capacitor 752 are provided in the same plane. With such a structure, the capacitor 752 can be formed in the same plane as a gate electrode, a gate insulating film, and a source electrode (drain electrode), which are included in the transistor 751. When the transistor 751 and the capacitor 752 are provided in the same plane in this manner, the number of manufacturing steps of the liquid crystal display device can be reduced; thus, the productivity can be increased.

As the transistor 751, the transistor described above can be used. In FIG. 17A, the transistor illustrated in FIGS. 1A to 1C is used as the transistor 751. Therefore, for components of the transistor 751 which are not particularly described below, the description of FIGS. 1A to 1C is referred to.

Note that the transistor 751 can be a transistor having extremely small off-state current. Thus, the charge held in the capacitor 752 is unlikely to be leaked and voltage applied to the liquid crystal element 753 can be retained for a long time. Thus, by turning off the transistor 751 when an image with little motion or a still image is displayed, power for the operation of the transistor 751 is not needed. As a result, the power consumption of the liquid crystal display device can be low.

The size of the capacitor 752 provided in the liquid crystal display device is set considering the leakage current of the transistor 751 provided in the pixel portion, or the like so that charge can be held for a predetermined period. By using the transistor 751, it is enough to provide a capacitor having a capacitance that is ⅓ or less, preferably ⅕ or less of a liquid crystal capacitance of each pixel; therefore, the aperture ratio of a pixel can be increased.

An insulating film 721 is provided over the transistor 751 and the capacitor 752.

Here, an opening reaching the drain electrode 110*b* of the transistor 751 is provided in the insulating films 721, 114, and 112.

An electrode 791 is provided over the insulating film 721. The electrode 791 is in contact with the drain electrode 110*b* of the transistor 751 through the opening provided in the insulating film 721, the insulating film 114, and the insulating film 112.

An insulating film 792 serving as an alignment film is provided over the electrode 791.

A liquid crystal layer 793 is provided over the insulating film 792.

An insulating film 794 serving as an alignment film is provided over the liquid crystal layer 793.

A spacer 795 is provided over the insulating film 794.

An electrode 796 is provided over the spacer 795 and the insulating film 794.

A substrate 797 is provided over the electrode 796.

For the insulating film 721, the description of the insulating film 720 is referred to. Alternatively, a resin film of a polyimide resin, an acrylic resin, an epoxy resin, a silicone resin, or the like may be used.

For the liquid crystal layer 793, a thermotropic liquid crystal, a low-molecular liquid crystal, a polymer liquid crystal, a polymer-dispersed liquid crystal, a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions.

Note that as the liquid crystal layer 793, a liquid crystal exhibiting a blue phase may be used. In that case, the structure without the insulating films 792 and 794 serving as alignment films may be employed.

The electrode 791 can be formed using a conductive film having a transmitting property with respect to visible light.

As the electrode 791, for example, an oxide film such as an In—Zn—W oxide film, an In—Sn oxide film, an In—Zn oxide film, an indium oxide film, a zinc oxide film, or a tin oxide film may be used. The above oxide film may contain a minute amount of Al, Ga, Sb, F, or the like. Further, a metal thin film having a thickness which enables light to be transmitted (preferably, approximately 5 nm to 30 nm) can also be used.

Alternatively, the electrode 791 is preferably a film which efficiently reflects visible light. For example, a film containing aluminum, titanium, chromium, copper, molybdenum, silver, tantalum, or tungsten can be used as the electrode 791.

The electrode 796 can be formed using any of the films described above as the electrode 791. On the other hand, in the case where the electrode 791 has visible light permeability, it is preferable that the electrode 796 efficiently reflect visible light. When the electrode 791 efficiently reflects visible light, it is preferable that the electrode 796 have visible light permeability.

Positions of the electrode 791 and the electrode 796 are not limited to the structure illustrated in FIG. 17A, and the electrode 791 and the electrode 796 may be replaced with each other.

Each of the insulating films 792 and 794 may be formed using an organic compound or an inorganic compound.

The spacer 795 may be formed using an organic compound or an inorganic compound. Note that the spacer 795 can have a variety of shapes such as a columnar shape and a spherical shape.

A region where the electrode 791, the insulating film 792, the liquid crystal layer 793, the insulating film 794, and the electrode 796 overlap with one another functions as the liquid crystal element 753.

As the substrate 797, a glass substrate, a resin substrate, a metal substrate, or the like can be used. The substrate 797 may have flexibility.

Figure 17B:
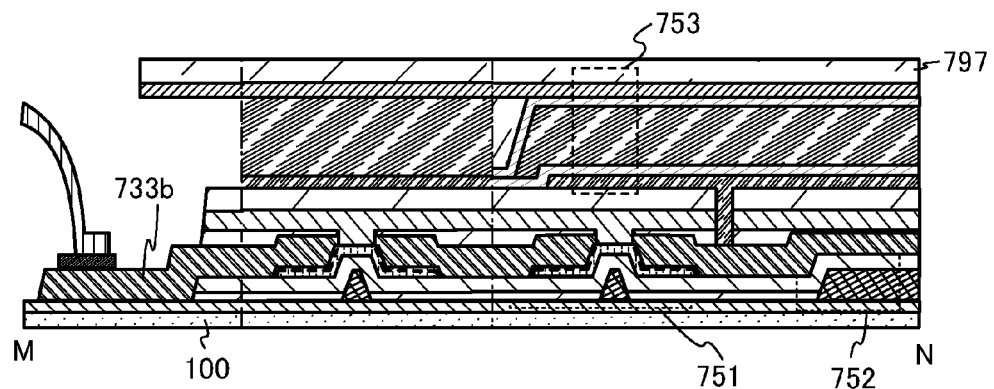
Figure 17C:
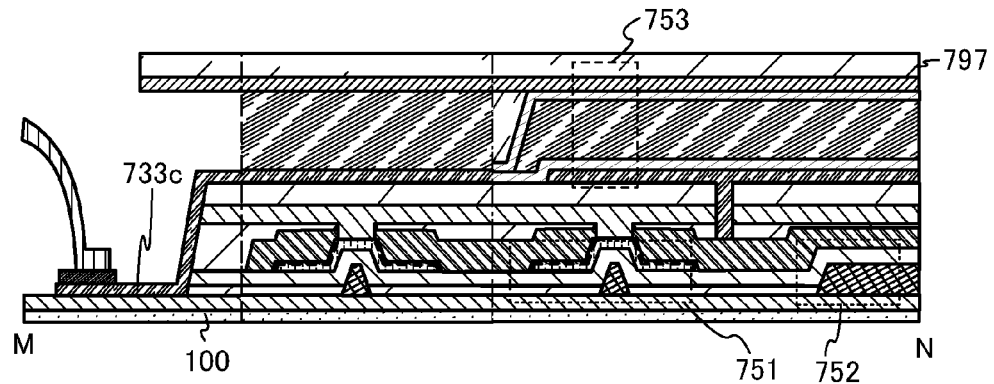

FIGS. 17B and 17C each illustrate an example of a cross section of a liquid crystal display device which is partly different from that in FIG. 17A. Specifically, the difference lies in a wiring connected to the FPC 732. In FIG. 17B, the wiring 733*b* is connected to the FPC 732 via the terminal 731. The wiring 733*b* is formed in the same layer as the source electrode 110*a* and the drain electrode 110*b*. In FIG. 17C, the wiring 733*c* is connected to the FPC 732 via the terminal 731. The wiring 733*c* is formed in the same layer as the electrode 791.

The transistor 751 connected to the liquid crystal element 753 has stable electrical characteristics. Thus, a liquid crystal display device having high display quality can be provided. Further, since the off-state current of the transistor 751 can be extremely low, a liquid crystal display device with low power consumption can be provided.

In the liquid crystal display device, the operation mode can be selected as appropriate. For example, as the driving method, there are a vertical electric field method where voltage is applied perpendicular to a substrate and a horizontal electric field method where voltage is applied in parallel to a substrate. Specifically, a TN mode, a VA mode, an MVA mode, a PVA mode, an ASM mode, a TBA mode, an OCB mode, an FLC mode, an AFLC mode, an FFS mode, or the like can be used.

In the liquid crystal display device, a black matrix (a light-blocking layer), an optical member (an optical substrate) such as a polarizing member, a retardation member, or an anti-reflection member, and the like are provided as appropriate. For example, circular polarization may be employed by using a polarizing substrate and a retardation substrate. In addition, a backlight, a side light, or the like may be used as a light source.

In addition, it is possible to employ a time-division display method (field-sequential driving method) with the use of a plurality of light-emitting diodes (LEDs) for a backlight. A field-sequential driving method enables color display without using a coloring layer.

As a display method in the pixel portion, a progressive method, an interlace method, or the like is employed. Further, color elements controlled in a pixel at the time of color display are not limited to three colors: R, G, and B (R, G, and B correspond to red, green, and blue, respectively). For example, R, G, B, and W (W corresponds to white), or R, G, B, and one or more of yellow, cyan, magenta, and the like can be used. Further, the sizes of display regions may be different between respective dots of color elements. However, one embodiment of the present invention is not limited to a color liquid crystal display device and can be applied to a monochrome liquid crystal display device.

Here, a structural example of an input means (a touch sensor) for which the transistor of one embodiment of the present invention is used and capable of proximity or contact sensing of an object is described.

Here, the case of using a capacitive type is described. Examples of the capacitive touch sensor are typically of a surface capacitive type, a projected capacitive type, and the like. Further, examples of the projected capacitive type are of a self capacitive type, a mutual capacitive type, and the like mainly in accordance with the difference in the driving method. The use of a mutual capacitive type is preferable because multiple points can be sensed simultaneously.

[Example of Detection Method of Sensor]

Figure 18A:
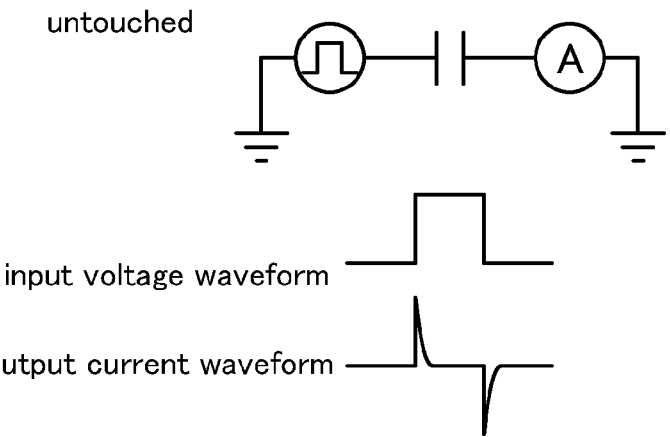
FIGS. 18A to 18C illustrate a touch sensor.
Figure 18B:
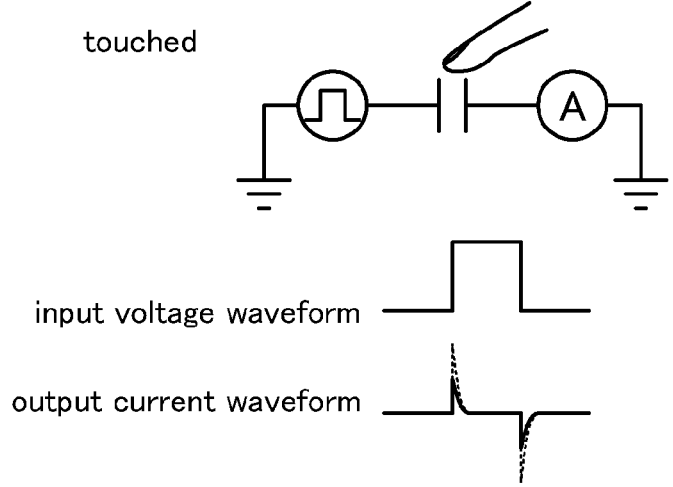

FIGS. 18A and 18B are schematic diagrams illustrating structures of a mutual capacitive touch sensor and input and output waveforms. The touch sensor includes a pair of electrodes. Capacitance is formed between the pair of electrodes. Input voltage is input to one of the pair of electrodes. Further, a detection circuit which detects current flowing in the other electrode (or a potential of the other electrode) is provided.

For example, in the case where a rectangular wave is used as an input voltage waveform as illustrated in FIG. 18A, a waveform having a sharp peak is detected as an output current waveform.

Further, in the case where a conductive object is close to or touches a capacitor as illustrated in FIG. 18B, the capacitance value between the electrodes is decreased; accordingly, the current value is decreased.

By detecting a change in capacitance by using a change in output current (or potential) with respect to input voltage in this manner, the proximity or contact of an object can be detected.

[Structure Example of Touch Sensor]

Figure 18C:
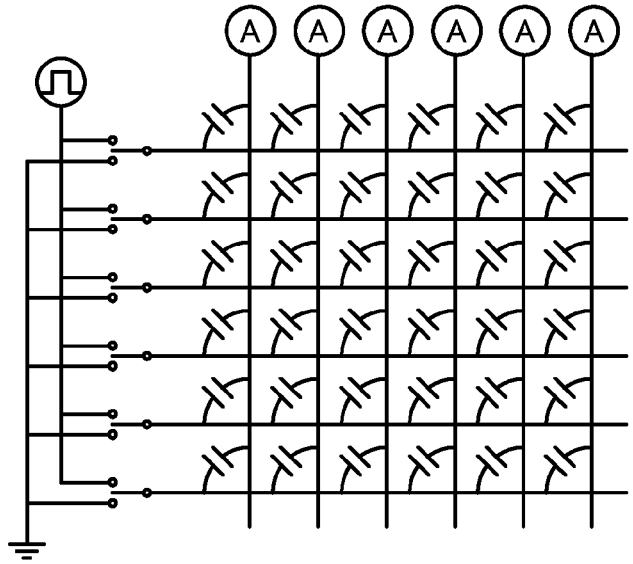

FIG. 18C illustrates a structure example of a touch sensor provided with a plurality of capacitors arranged in a matrix.

The touch sensor includes a plurality of wirings extending in the X direction (the horizontal direction of this figure) and a plurality of wirings extending in the Y direction (the vertical direction of this figure) which intersect with the plurality of wirings. Capacitance is formed between two wirings intersecting with each other.

One of input voltage and a common potential (including a grounded potential and a reference potential) is input to each of the wirings extending in the X direction. Further, a detection circuit (e.g., a source meter or a sense amplifier) is electrically connected to the wirings extending in the Y direction and can detect current (or potential) flowing through the wirings.

The touch sensor is capable of two-dimensional sensing of an object in such a manner that the touch sensor sequentially scans the plurality of wirings extending in the X direction so that input voltage is input and detects a change in current (or potential) flowing through the wirings extending in the Y direction.

[Structure Example of Touch Panel]

A structure example of a touch panel including a touch sensor and a display portion including a plurality of pixels and a case where the touch panel is incorporated in an electronic appliance are described below.

Figure 19A:
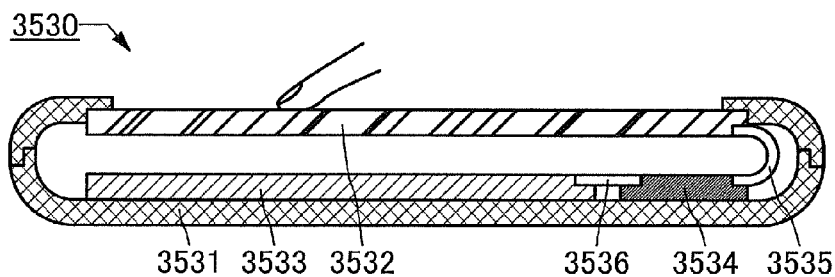
FIGS. 19A to 19E illustrate structure examples of an electronic device and touch panels.

FIG. 19A is a schematic cross-sectional view of an electronic appliance including a touch panel.

An electronic appliance 3530 includes a housing 3531 and at least a touch panel 3532, a battery 3533, and a control portion 3534, which are provided in the housing 3531. The touch panel 3532 is electrically connected to the control portion 3534 through a wiring 3535. The control portion 3534 controls image display on a display portion and the sensing operation of the touch sensor. The battery 3533 is electrically connected to the control portion 3534 through a wiring 3536 to supply electric power to the control portion 3534.

The touch panel 3532 is provided so that its surface is not covered. An image can be displayed on the exposed surface of the touch panel 3532 and the proximity or the contact of an object can be detected.

FIGS. 19B to 19E each illustrate a structure example of a touch panel.

Figure 19B:
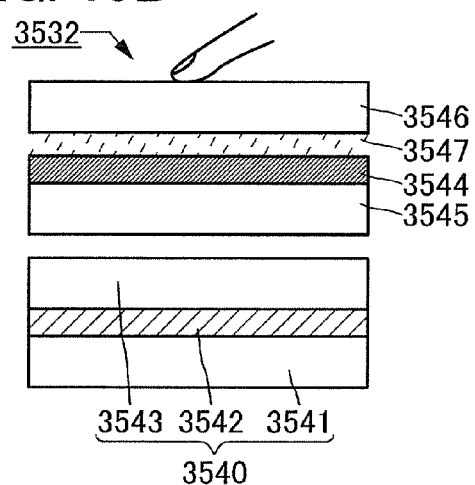

The touch panel 3532 illustrated in FIG. 19B includes a display panel 3540 in which a display portion 3542 is provided between a first substrate 3541 and a second substrate 3543, a third substrate 3545 provided with a touch sensor 3544, and a protective substrate 3546.

As the display panel 3540, a variety of display devices such as a display device including a liquid crystal element or an organic electroluminescence (EL) element and an electronic paper can be used. Note that the touch panel 3532 may additionally include a backlight, a polarizing plate, and the like in accordance with the structure of the display panel 3540.

An object comes in contact with or close to one of the surfaces of the protective substrate 3546; thus, the mechanical strength of at least the surface is preferably high. For example, a tempered glass which has been subjected to physical or chemical treatment by an ion exchange method, a thermal tempering method, or the like and has a surface to which compressive stress has been applied can be used as the protective substrate 3546. Alternatively, a flexible substrate with a coated surface, such as a plastic substrate, can be used. Note that a protective film or an optical film may be provided over the protective substrate 3546.

The touch sensor 3544 is provided on at least one of the surfaces of the third substrate 3545. Alternatively, a pair of electrodes included in the touch sensor 3544 may be formed on both surfaces of the third substrate 3545. A flexible film may be used as the third substrate 3545 for thickness reduction of the touch panel. The touch sensor 3544 may be held between a pair of substrates (provided with a film).

Although the protective substrate 3546 and the third substrate 3545 provided with the touch sensor 3544 are bonded to each other by a bonding layer 3547 in FIG. 19B, the protective substrate 3546 and the third substrate 3545 are not necessarily bonded to each other. The third substrate 3545 and the display panel 3540 may be bonded to each other by the bonding layer 3547.

In the touch panel 3532 illustrated in FIG. 19B, the display panel and the substrate provided with the touch sensor are separately provided. The touch panel having such a structure can also be referred to as an externally attached touch panel. In such a structure, the display panel and the substrate provided with the touch sensor are separately formed and then they are overlapped with each other, so that the display panel can have a touch sensor function. Thus, the touch panel can be easily manufactured without a special manufacturing process.

Figure 19C:
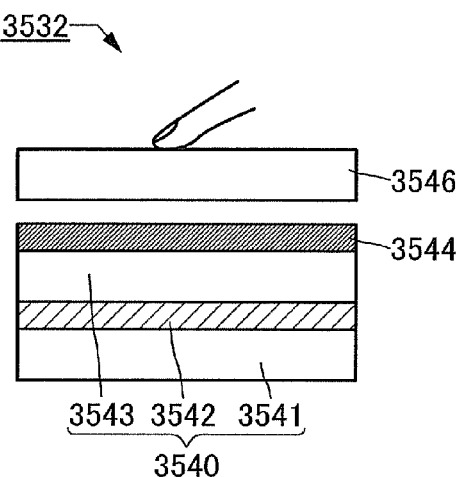

In the touch panel 3532 illustrated in FIG. 19C, the touch sensor 3544 is provided on a surface of the second substrate 3543 which is on the protective substrate 3546 side. The touch panel having such a structure can also be referred to as an on-cell touch panel. With such a structure, the number of substrates needed can be reduced, which results in reductions in the thickness and weight of the touch panel.

Figure 19D:
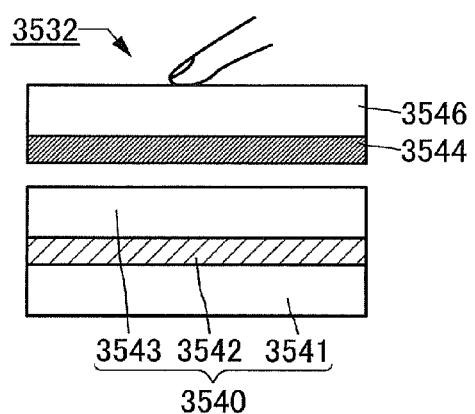

In the touch panel 3532 illustrated in FIG. 19D, the touch sensor 3544 is provided on one of the surfaces of the protective substrate 3546. With such a structure, the display panel and the touch sensor can be separately manufactured; thus, the touch panel can be easily manufactured. Furthermore, the number of substrates needed can be reduced, which results in reductions in the thickness and weight of the touch panel.

Figure 19E:
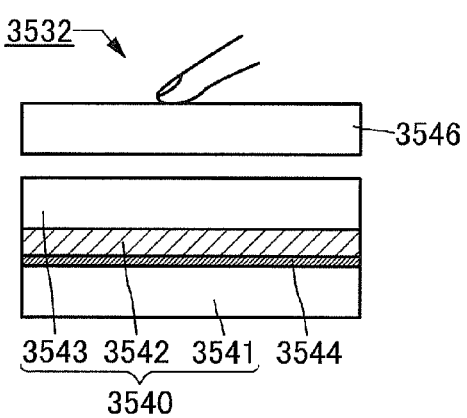

In the touch panel 3532 illustrated in FIG. 19E, the touch sensor 3544 is provided between the pair of substrates in the display panel 3540. The touch panel having such a structure can also be referred to as an in-cell touch panel. With such a structure, the number of substrates needed can be reduced, which results in reductions in the thickness and weight of the touch panel. Such a touch panel can be achieved, for example, in such a manner that a circuit functioning as a touch sensor is formed using a transistor, a wiring, an electrode, and the like included in the display portion 3542 on the first substrate 3541 or the second substrate 3543. Further, in the case of using an optical touch sensor, a photoelectric conversion element may be provided.

[Structure Example of in-Cell Touch Panel]

A structure example of a touch panel incorporating a touch sensor into a display portion including a plurality of pixels is described below. Here, an example in which a liquid crystal element is used as a display element provided in the pixel is described.

Figure 20A:
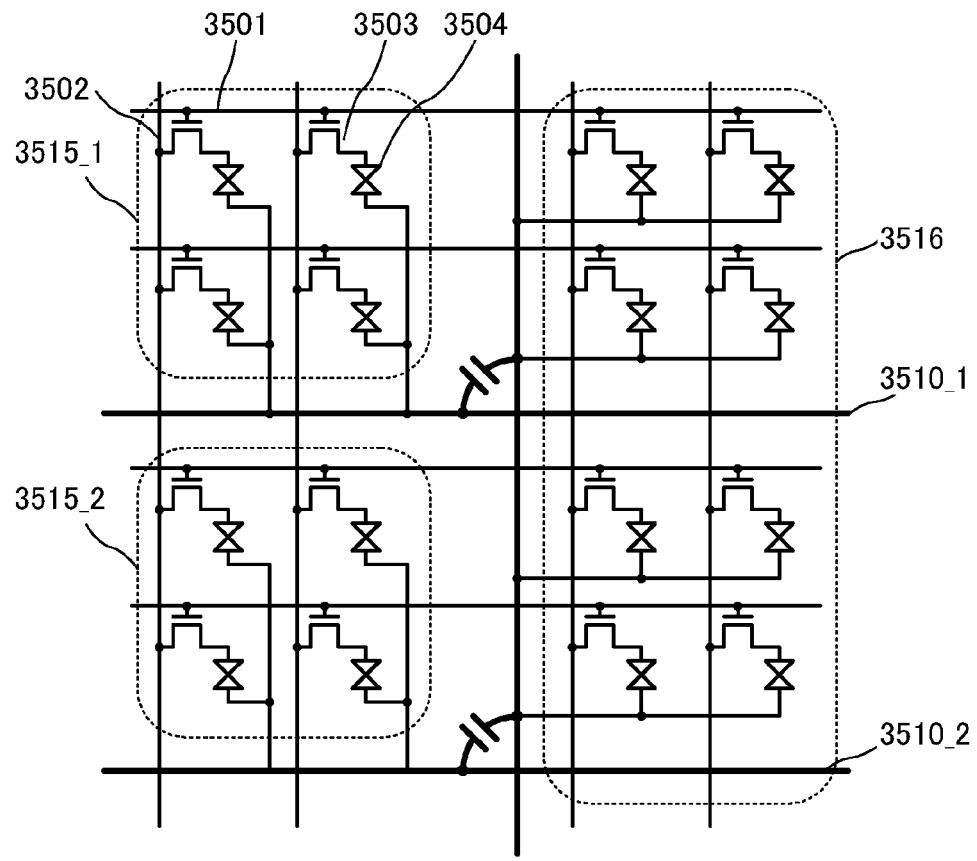
FIGS. 20A and 20B each illustrate a pixel provided with a touch sensor.

FIG. 20A is an equivalent circuit diagram of part of a pixel circuit provided in the display portion of the touch panel described in this structure example.

Each pixel includes at least a transistor 3503 and a liquid crystal element 3504. A gate of the transistor 3503 is electrically connected to a wiring 3501, and one of a source and a drain of the transistor 3503 is electrically connected to a wiring 3502.

The pixel circuit includes a plurality of wirings extending in the X direction (e.g., a wiring 3510_1 and a wiring 3510_2) and a plurality of wirings extending in the Y direction (e.g., wirings 3511). These wirings are provided to intersect with each other, and capacitance is formed therebetween.

Among the pixels provided in the pixel circuit, ones of electrodes of the liquid crystal elements of some pixels adjacent to each other are electrically connected to each other to form one block. The block is classified into two types: an island-shaped block (e.g., a block 3515_1 or a block 3515_2) and a linear block (e.g., a block 3516) extending in the Y direction. Note that although only part of the pixel circuit is illustrated in FIG. 20A, units each including these two kinds of blocks are continuously arranged in the X direction and the Y direction in an actual pixel circuit.

The wiring 3510_1 (or 3515_2) extending in the X direction is electrically connected to the island-shaped block 3515_1 (or the block 3515_2). Although not illustrated, the wiring 3510_1 extending in the X direction is electrically connected to a plurality of island-shaped blocks 3515_1 which are provided discontinuously along the X direction with the linear blocks therebetween. Further, the wiring 3511 extending in the Y direction is electrically connected to the linear block 3516.

Figure 20B:
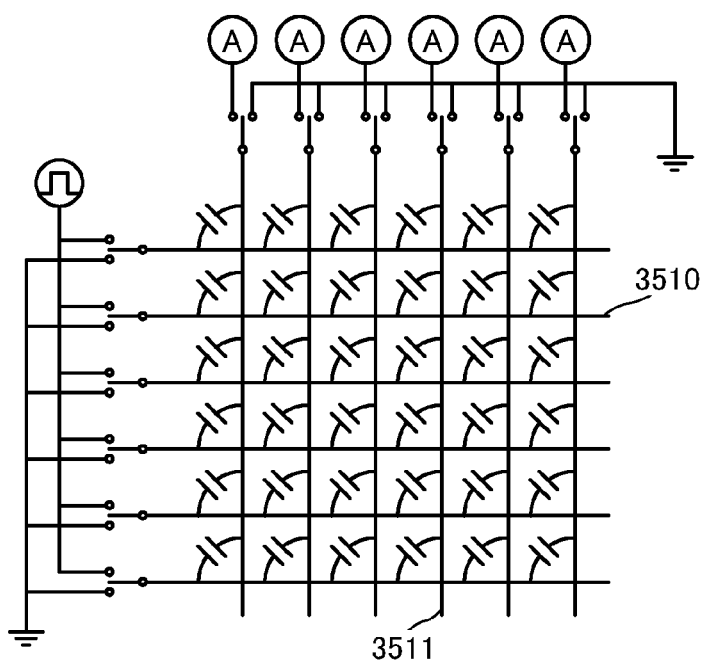

FIG. 20B is an equivalent circuit diagram illustrating the connection between a plurality of wirings 3510 extending in the X direction and the plurality of wirings 3511 extending in the Y direction. Input voltage or a common potential can be input to each of the wirings 3510 extending in the X direction. Further, a ground potential can be input to each of the wirings 3511 extending in the Y direction, or the wirings 3511 can be electrically connected to the detection circuit.

[Operation Example of Touch Panel]

Operation of the above-described touch panel is described below with reference to FIGS. 21A to 21C.

Figure 21A:
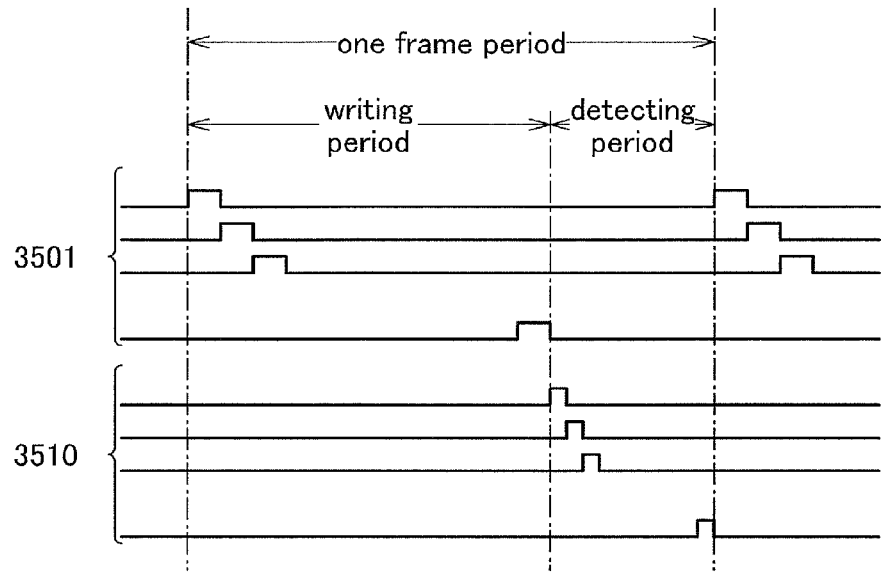
FIGS. 21A to 21C each illustrate the operation of touch sensors and pixels.

As illustrated in FIG. 21A, one frame period is divided into a writing period and a detecting period. The writing period is a period in which image data is written to a pixel, and the wirings 3510 (also referred to as gate lines) are sequentially selected. On the other hand, the detecting period is a period in which sensing is performed by a touch sensor, and the wirings 3510 extending in the X direction are sequentially selected and input voltage is input.

Figure 21B:
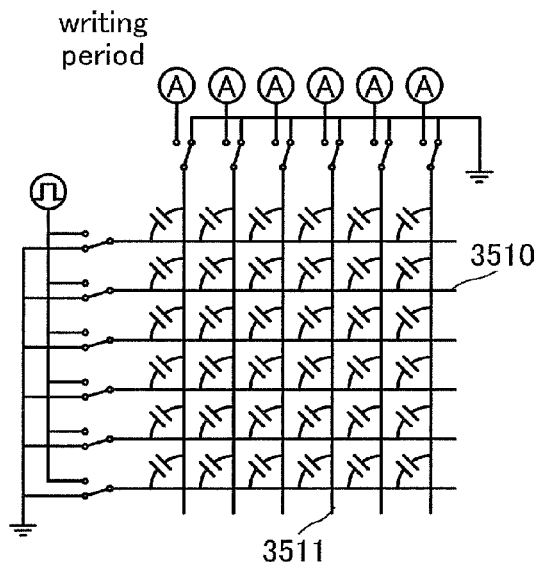

FIG. 21B is an equivalent circuit diagram in the writing period. In the wiring period, a common potential is input to both the wiring 3510 extending in the X direction and the wiring 3511 extending in the Y direction.

Figure 21C:
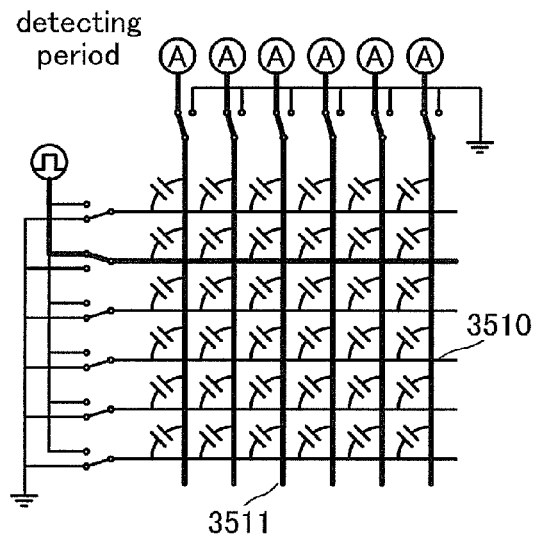

FIG. 21C is an equivalent circuit diagram at some point in time in the detection period. In the detection period, each of the wirings 3511 extending in the Y direction is electrically connected to the detection circuit. Input voltage is input to the wirings 3510 extending in the X direction which are selected, and a common potential is input to the wirings 3510 extending in the X direction which are not selected.

It is preferable that a period in which an image is written and a period in which sensing is performed by a touch sensor be separately provided as described above. Thus, a decrease in the sensitivity of the touch sensor caused by noise generated when data is written to a pixel can be suppressed.

[Structure Example of Pixel]

Structure examples of a pixel which can be used for the above touch panel are described below.

Figure 22A:
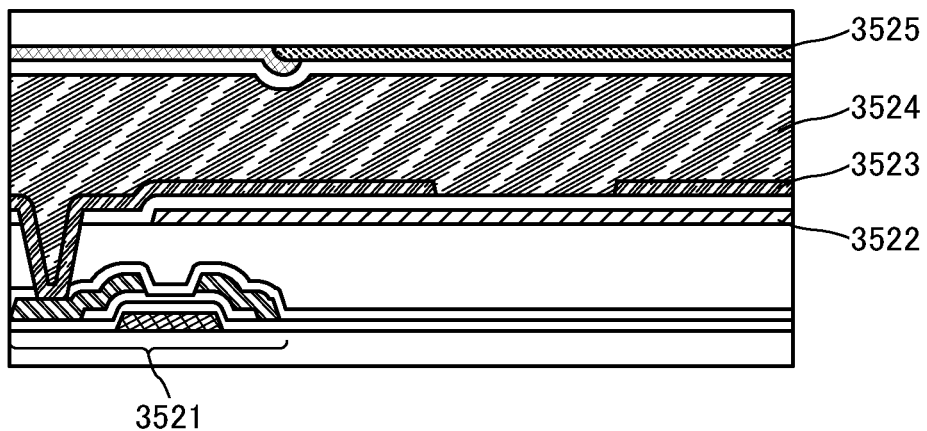
FIGS. 22A to 22C each illustrate structures of a pixel.

FIG. 22A is a cross-sectional view illustrating part of a pixel having a fringe field switching (FFS) mode.

The pixel includes a transistor 3521, an electrode 3522, an electrode 3523, a liquid crystal 3524, and a color filter 3525. The electrode 3523 having an opening is electrically connected to one of a source and a drain of the transistor 3521. The electrode 3523 is provided over the electrode 3522 with an insulating layer therebetween. The electrode 3523 and the electrode 3522 can each function as one electrode of a liquid crystal element. By applying voltage therebetween, alignment of liquid crystals can be controlled.

For example, the electrode 3522 is electrically connected to the above-described wiring 3510 or wiring 3511; thus, the pixel of the above-described touch panel can be formed.

Note that the electrode 3522 can be provided over the electrode 3523. In that case, the electrode 3522 may have an opening and may be provided over the electrode 3523 with an insulating layer therebetween.

Note that the electrode 3522 can be provided over the electrode 3523. In that case, the electrode 3522 may have an opening and may be provided over the electrode 3523 with an insulating layer provided therebetween.

Figure 22B:
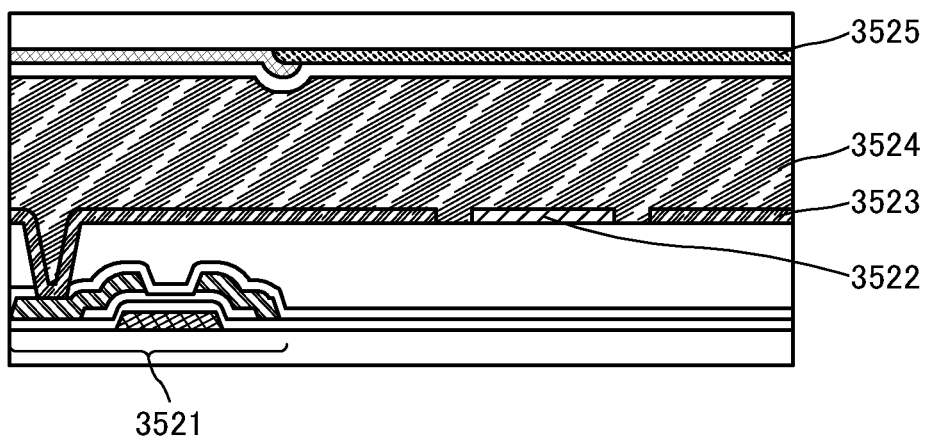

FIG. 22B is a cross-sectional view illustrating part of a pixel having an in-plane-switching (IPS) mode.

The electrode 3523 and electrode 3522 provided in the pixel each have a comb-like shape and are provided on the same plane so as to engage with each other and be apart from each other.

Figure 22C:
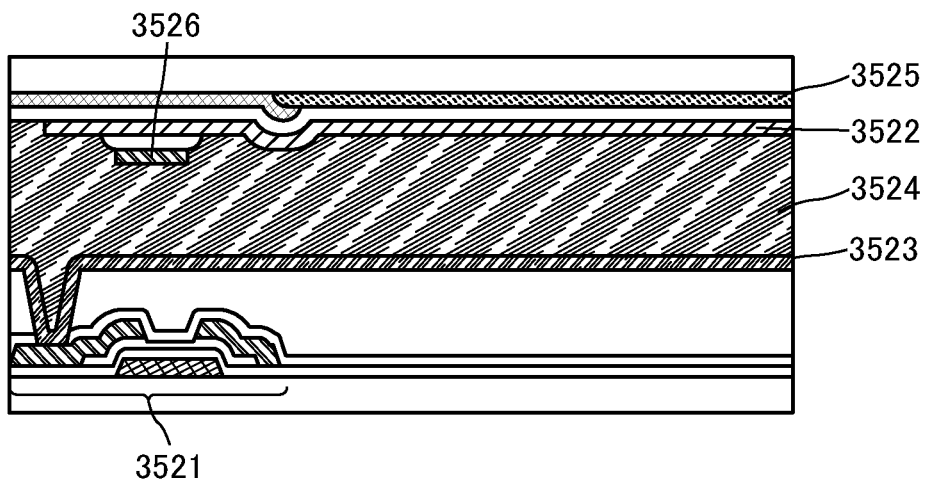

For example, the electrode 3522 is electrically connected to the above-described wiring 3510 or wiring 3511; thus, the pixel of the above-described touch panel can be formed FIG. 22C is a cross-sectional view illustrating part of a pixel having a vertical alignment (VA) mode.

The electrode 3522 is provided so as to face the electrode 3523 with the liquid crystal 3524 therebetween. A wiring 3526 is provided on the electrode 3522. For example, the wiring 3526 can be provided to electrically connect the block including the pixel illustrated in FIG. 22C and blocks different from the block including the pixel illustrated in FIG. 22C.

For example, the electrode 3522 is electrically connected to the above-described wiring 3510 or wiring 3511; thus, the pixel of the above-described touch panel can be formed.

This embodiment can be combined with any of the other embodiments disclosed in this specification as appropriate.

(Embodiment 5)

The display device which is one embodiment of the present invention can be applied to a variety of electronic devices (including game machines). Examples of electronic devices include a television device (also referred to as television or television receiver), a monitor of a computer or the like, a digital camera, a digital video camera, a digital photo frame, a mobile phone, a portable game machine, a portable information terminal, an audio reproducing device, a game machine (e.g., a pachinko machine or a slot machine), and a game console. Examples of such electronic devices are illustrated in FIGS. 23A to 23C.

Figure 23A:
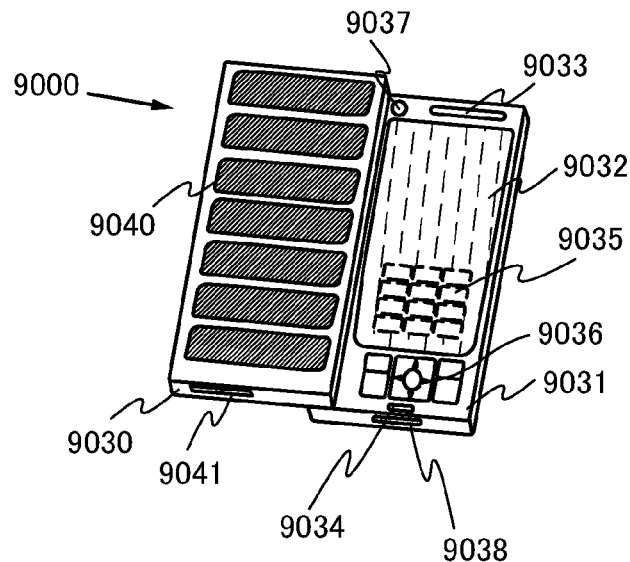
FIGS. 23A to 23C illustrate examples of electronic devices.
Figure 23B:
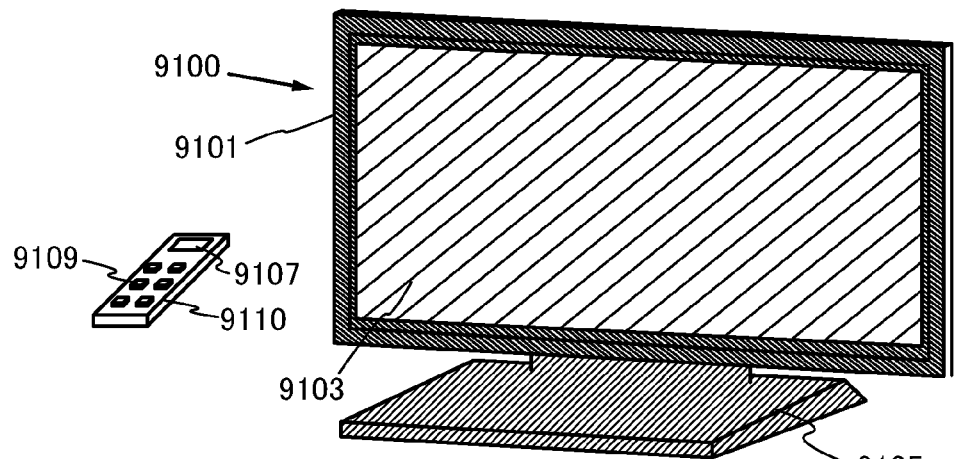
Figure 23C:
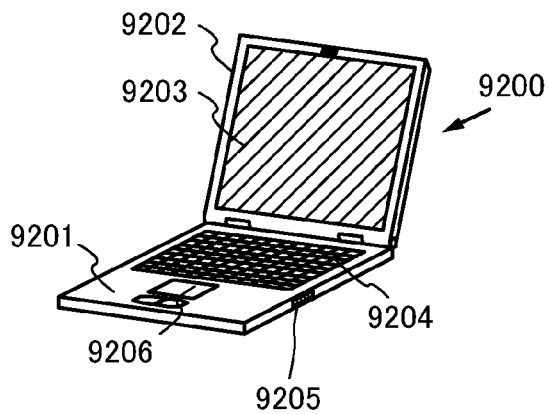

FIG. 23A illustrates an example of a mobile phone 9000. The mobile phone 9000 includes two housings 9030 and 9031. The housing 9031 includes a display panel 9032, a speaker 9033, a microphone 9034, a pointing device 9036, a camera lens 9037, an external connection terminal 9038, and the like. In addition, the housing 9030 includes a solar cell 9040 having a function of charge of the portable information terminal, an external memory slot 9041, and the like. In addition, an antenna is incorporated in the housing 9031. The display device described in the above embodiments is used for the display panel 9032, whereby the display quality of the mobile phone can be improved.

The display panel 9032 is provided with a touch panel. A plurality of operation keys 9035 which is displayed as images is illustrated by dashed lines in FIG. 23A. Note that a boosting circuit by which a voltage output from the solar cell 9040 is increased to be sufficiently high for each circuit is also included.

In the display panel 9032, the display direction can be appropriately changed depending on a usage pattern. Further, the mobile phone is provided with the camera lens 9037 on the same surface as the display panel 9032, and thus it can be used as a video phone. The speaker 9033 and the microphone 9034 can be used for videophone calls, recording and playing sound, and the like as well as voice calls. Moreover, the housings 9030 and 9031 in a state where they are developed as illustrated in FIG. 23A can shift by sliding so that one is lapped over the other; therefore, the size of the mobile phone can be reduced, which makes the mobile phone suitable for being carried.

The external connection terminal 9038 can be connected to an AC adapter and various types of cables such as a USB cable, and charging and data communication with a personal computer or the like are possible. Moreover, a large amount of data can be stored by inserting a storage medium into the external memory slot 9041 and can be moved.

FIG. 23B illustrates a television device 9100. In the television device 9100, a display portion 9103 is incorporated in a housing 9101 and an image can be displayed on the display portion 9103. Note that the housing 9101 is supported by a stand 9105 here.

The television device 9100 can be operated with an operation switch of the housing 9101 or a separate remote controller 9110. Channels and volume can be controlled with an operation key 9109 of the remote controller 9110 so that an image displayed on the display portion 9103 can be controlled. Furthermore, the remote controller 9110 may be provided with a display portion 9107 for displaying data output from the remote controller 9110.

The television device 9100 illustrated in FIG. 23B is provided with a receiver, a modem, and the like. With the receiver, general television broadcasts can be received in the television device 9100. Further, when the television device 9100 is connected to a communication network by wired or wireless connection via the modem, one-way (from a transmitter to a receiver) or two-way (between a transmitter and a receiver or between receivers) data communication can be performed.

Any of the display devices described in the above embodiments can be used for the display portions 9103 and 9107. Thus, the television device can have high display quality.

FIG. 23C illustrates a computer 9200. The computer 9200 includes a main body 9201, a housing 9202, a display portion 9203, a keyboard 9204, an external connection port 9205, a pointing device 9206, and the like.

Any of the display devices described in the above embodiments can be used for the display portion 9203. Thus, a computer can have high display quality.

The display portion 9203 has a touch-input function. When a user touches the keyboard 9204 which are displayed on the display portion 9203 of the computer 9200 with his/her fingers or the like, the user can carry out operation of the screen and input of information. Further, when the table may be made to communicate with home appliances or control the home appliances, the display portion 9203 may function as a control device which controls the home appliances by operation on the screen. For example, with the use of the touch panel described in the above embodiment, the display portion 9203 can have a touch-input function.

Figure 24:
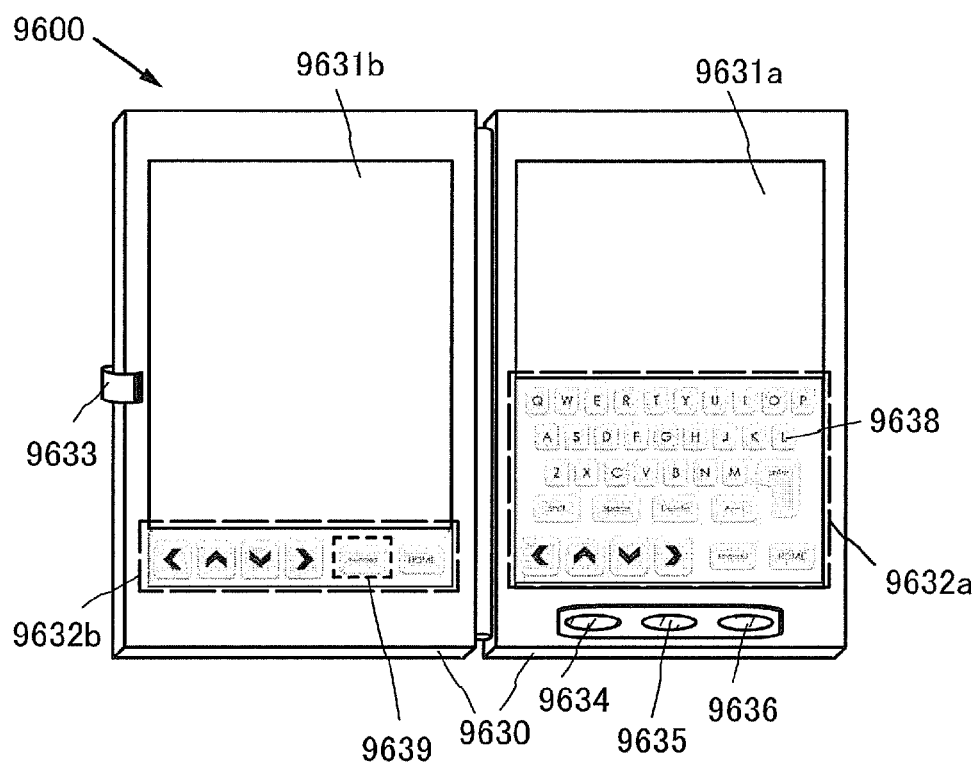
FIG. 24 illustrates an example of an electronic device.

FIG. 24 illustrates a foldable tablet terminal 9600. In FIG. 24, the tablet terminal 9600 is opened and includes a housing 9630, a display portion 9631a, a display portion 9631b, a display-mode switching button 9634, a power button 9635, a power-saving-mode switching button 9636, and a clip 9633.

Any of the display devices described in the above embodiments can be used for the display portion 9631a and the display portion 9631b. Thus, the display quality of the tablet terminal 9600 can be improved.

Part of the display portion 9631a can be a touch panel region 9632a and data can be input when a displayed operation key panel 9638 is touched. Although a structure in which a half region in the display portion 9631a has only a display function and the other half region also has a touch panel function is illustrated as an example, the structure of the display portion 9631a is not limited thereto. The whole area of the display portion 9631a may have a touch panel function. For example, the whole area of the display portion 9631a can display keyboard buttons and serve as a touch panel while the display portion 9631b can be used as a display screen.

Like the display portion 9631a, part of the display portion 9631b can be a touch panel region 9632b. When a keyboard display switching button 9639 displayed on the touch panel is touched with a finger, a stylus, or the like, a keyboard can be displayed on the display portion 9631b.

Touch input can be performed concurrently on the touch panel regions 9632a and 9632b.

The display-mode switching button 9634 can switch display orientation (e.g., between landscape mode and portrait mode) and select a display mode (switch between monochrome display and color display), for example. The power-saving-mode switching button 9636 can control display luminance in accordance with the amount of external light in use of the tablet terminal 9600 detected by an optical sensor incorporated in the tablet terminal 9600. The tablet terminal 9600 may include another detection device such as a sensor for detecting orientation (e.g., a gyroscope or an acceleration sensor) in addition to the optical sensor.

Although the display portion 9631a and the display portion 9631b have the same display area in FIG. 24, one embodiment of the present invention is not limited to this example. The display portion 9631a and the display portion 9631b may have different areas or different display quality. For example, one of them may be a display panel that can display higher-definition images than the other.

This embodiment can be combined with any of the other embodiments disclosed in this specification as appropriate.

(Embodiment 6)

In this embodiment, an example of a semiconductor device (memory device) which includes a transistor of one embodiment of the present invention, which can retain stored data even when not powered, and which has an unlimited number of write cycles is described with reference to drawings.

Figure 25A:
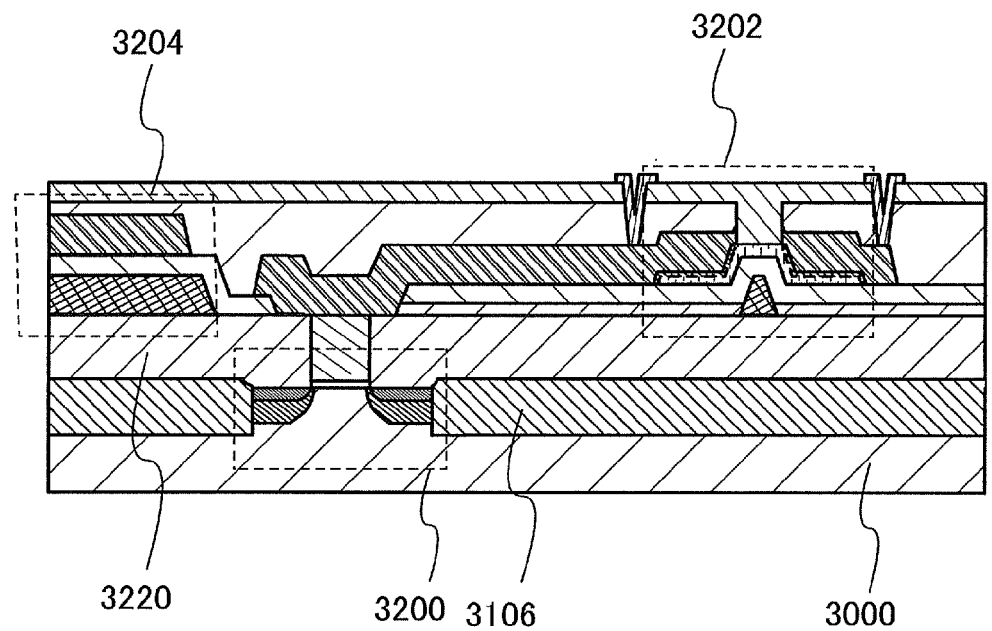
FIGS. 25A and 25B are a cross-sectional view and a circuit diagram of a semiconductor device.
Figure 25B:
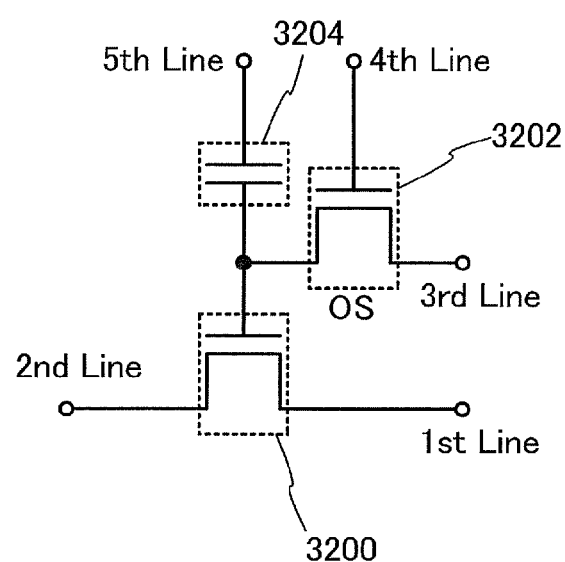

FIG. 25A is a cross-sectional view of the semiconductor device, and FIG. 25B is a circuit diagram of the semiconductor device.

The semiconductor device illustrated in FIGS. 25A and 25B includes a transistor 3200 including a first semiconductor material in a lower portion, and a transistor 3202 including a second semiconductor material and a capacitor 3204 in an upper portion. As the transistor 3202, any of the transistors described in the above embodiments can be used, and an example in which the transistor 150 described in Embodiment 1 with reference to FIGS. 1A to 1C is applied to the transistor 3202 is described in this embodiment. One electrode of the capacitor 3204 is formed using the same material as a gate electrode of the transistor 3202, the other electrode of the capacitor 3204 is formed using the same material as a source electrode and a drain electrode of the transistor 3202, and a dielectric of the capacitor 3204 is formed using the same material as a gate insulating film of the transistor 3202; thus, the capacitor 3204 can be formed at the same time as the transistor 3202.

Here, the first semiconductor material and the second semiconductor material are preferably materials having different band gaps. For example, the first semiconductor material may be a semiconductor material (such as silicon) other than an oxide semiconductor, and the second semiconductor material may be the oxide semiconductor described in Embodiment 1. A transistor including, for example, crystalline silicon as a material other than an oxide semiconductor can operate at high speed easily. On the other hand, a transistor including an oxide semiconductor enables charge to be held for a long time owing to its electrical characteristics, that is, the small off-state current.

Although both of the above transistors are n-channel transistors in the following description, it is needless to say that p-channel transistors can be used. The specific structure of the semiconductor device, such as the material used for the semiconductor device and the structure of the semiconductor device, is not necessarily limited to that described here as long as the transistor described in Embodiment 1, which is formed using an oxide semiconductor for storing data, is used.

The transistor 3200 in FIG. 25A includes a channel formation region provided in a substrate 3000 including a semiconductor material (such as crystalline silicon), impurity regions provided such that the channel formation region is provided therebetween, intermetallic compound regions provided in contact with the impurity regions, a gate insulating film provided over the channel formation region, and a gate electrode layer provided over the gate insulating film. Note that a transistor whose source electrode layer and drain electrode layer are not illustrated in a drawing may also be referred to as a transistor for the sake of convenience. Further, in such a case, in description of a connection of a transistor, a source region and a source electrode layer may be collectively referred to as a source electrode layer, and a drain region and a drain electrode layer may be collectively referred to as a drain electrode layer. That is, in this specification, the term "source electrode layer" might include a source region.

Further, an element isolation insulating layer 3106 is formed on the substrate 3000 so as to surround the transistor 3200, and an oxide insulating film 3220 is formed so as to cover the transistor 3200. Note that the element isolation insulating layer 3106 can be formed by an element isolation technique such as local oxidation of silicon (LOCOS) or shallow trench isolation (STI).

For example, the transistor 3200 formed using a crystalline silicon substrate can operate at high speed. Thus, when the transistor is used as a reading transistor, data can be read at high speed. As treatment prior to formation of the transistor 3202 and the capacitor 3204, CMP treatment is performed on the oxide insulating film 3220 covering the transistor 3200, whereby the oxide insulating film 3220 is planarized and, at the same time, an upper surface of the gate electrode layer of the transistor 3200 is exposed.

The transistor 3202 is provided over the oxide insulating film 3220, and one of the source electrode and the drain electrode thereof is extended so as to function as the other electrode of the capacitor 3204.

The transistor 3202 in FIG. 25A is a top-gate transistor in which a channel is formed in an oxide semiconductor layer. Since the off-state current of the transistor 3202 is small, stored data can be retained for a long period owing to such a transistor. In other words, refresh operation becomes unnecessary or the frequency of the refresh operation in a semiconductor memory device can be extremely low, which leads to a sufficient reduction in power consumption.

Further, an electrode 3150 overlaps with the transistor 3202 with the oxide insulating film 3220 provided therebetween. By supplying an appropriate potential to the electrode 3150, the threshold voltage of the transistor 3202 can be controlled. In addition, long-term reliability of the transistor 3202 can be improved.

The transistor 3200 and the transistor 3202 can be formed so as to overlap with each other as illustrated in FIG. 25A, whereby the area occupied by them can be reduced. Accordingly, the degree of integration of the semiconductor device can be increased.

An example of a circuit configuration corresponding to FIG. 25A is illustrated in FIG. 25B.

In FIG. 25B, a first wiring (1st Line) is electrically connected to a source electrode layer of the transistor 3200. A second wiring (2nd Line) is electrically connected to a drain electrode layer of the transistor 3200. A third wiring (3rd Line) is electrically connected to the one of the source electrode layer and the drain electrode layer of the transistor 3202, and a fourth wiring (4th Line) is electrically connected to the gate electrode layer of the transistor 3202. The gate electrode layer of the transistor 3200 and the other of the source electrode layer and the drain electrode layer of the transistor 3202 are electrically connected to the one electrode of the capacitor 3204. A fifth wiring (5th Line) is electrically connected to the other electrode of the capacitor 3204.

The semiconductor device in FIG. 25B utilizes a characteristic in which the potential of the gate electrode layer of the transistor 3200 can be held, and thus enables writing, storing, and reading of data as follows.

Writing and storing of data are described. First, the potential of the fourth wiring is set to a potential at which the transistor 3202 is turned on, so that the transistor 3202 is turned on. Accordingly, the potential of the third wiring is supplied to the gate electrode layer of the transistor 3200 and the capacitor 3204. That is, a predetermined charge is supplied to the gate electrode layer of the transistor 3200 (writing). Here, one of two kinds of charges providing different potential levels (hereinafter referred to as a low-level charge and a high-level charge) is supplied. After that, the potential of the fourth wiring is set to a potential at which the transistor 3202 is turned off, so that the transistor 3202 is turned off. Thus, the charge supplied to the gate electrode layer of the transistor 3200 is held (holding).

Since the off-state current of the transistor 3202 is extremely small, the charge of the gate electrode layer of the transistor 3200 is held for a long time.

Next, reading of data is described. By supplying an appropriate potential (a reading potential) to the fifth wiring while supplying a predetermined potential (a constant potential) to the first wiring, the potential of the second wiring varies depending on the amount of charge held in the gate electrode layer of the transistor 3200. This is because in general, when the transistor 3200 is an n-channel transistor, an apparent threshold voltage $V_{th\_H}$ in the case where the high-level charge is given to the gate electrode layer of the transistor 3200 is lower than an apparent threshold voltage $V_{th\_L}$ in the case where the low-level charge is given to the gate electrode layer of the transistor 3200. Here, an apparent threshold voltage refers to the potential of the fifth wiring which is needed to turn on the transistor 3200. Thus, the potential of the fifth wiring is set to a potential $V_0$ which is between $V_{th\_H}$ and $V_{th\_L}$, whereby charge supplied to the gate electrode layer of the transistor 3200 can be determined For example, in the case where the high-level charge is supplied in writing, when the potential of the fifth wiring is $V_0$ ($>V_{th\_H}$), the transistor 3200 is turned on. In the case where the low-level charge is supplied in writing, even when the potential of the fifth wiring is $V_0$ ($<V_{th\_L}$), the transistor 3200 remains off. Therefore, the data stored in the gate electrode layer can be read by determining the potential of the second wiring.

Note that in the case where memory cells are arrayed, it is necessary that only data of a desired memory cell be able to be read. The fifth wiring in the case where data is not read may be supplied with a potential at which the transistor 3200 is turned off regardless of the state of the gate electrode layer, that is, a potential lower than $V_{th\_H}$. Alternatively, the fifth wiring may be supplied with a potential at which the transistor 3200 is turned on regardless of the state of the gate electrode layer, that is, a potential higher than $V_{th\_L}$.

When including a transistor having a channel formation region formed using an oxide semiconductor and having an extremely small off-state current, the semiconductor device described in this embodiment can retain stored data for an extremely long period. In other words, refresh operation becomes unnecessary or the frequency of the refresh operation can be extremely low, which leads to a sufficient reduction in power consumption. Moreover, stored data can be retained for a long period even when power is not supplied (note that a potential is preferably fixed).

Further, in the semiconductor device described in this embodiment, high voltage is not needed for writing data and there is no problem of deterioration of elements. For example, unlike a conventional nonvolatile memory, it is not necessary to inject and extract electrons into and from a floating gate, and thus a problem such as deterioration of a gate insulating film does not arise at all. That is, the semiconductor device according to the disclosed invention does not have a limitation on the number of times data can be rewritten, which is a problem of a conventional nonvolatile memory, and the reliability thereof is drastically improved. Furthermore, data is written depending on the on state and the off state of the transistor, whereby high-speed operation can be easily achieved.

As described above, a miniaturized and highly-integrated semiconductor device having high electrical characteristics and a method for manufacturing the semiconductor device can be provided.

Note that this embodiment can be combined as appropriate with any of the other embodiments and examples in this specification.

(Embodiment 7)

In this embodiment, a semiconductor device including a transistor of one embodiment of the present invention, which can retain stored data even when not powered, which does not have a limitation on the number of write cycles, and which has a structure different from that described in Embodiment 6, is described.

Figure 26A:
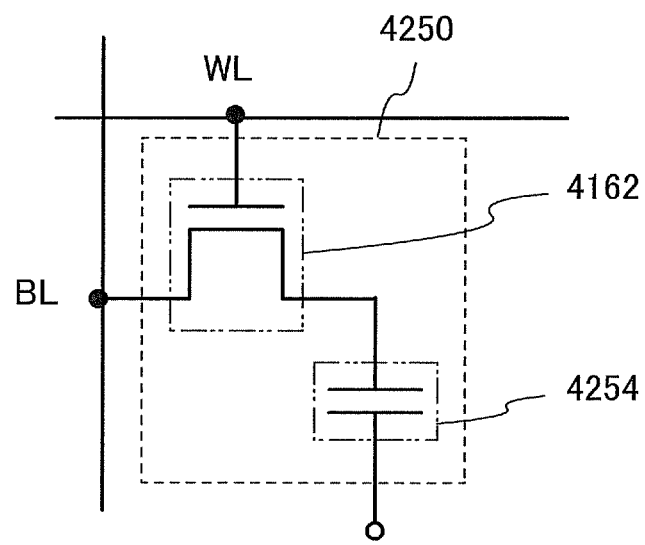
FIGS. 26A and 26B are a circuit diagram and a perspective view of a semiconductor device.
Figure 26B:
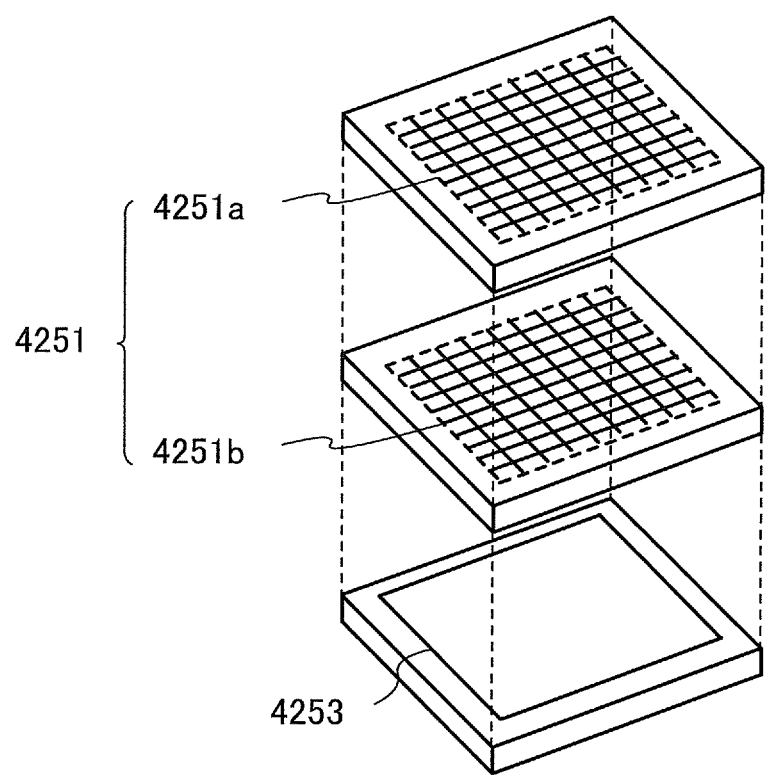

FIG. 26A illustrates an example of a circuit configuration of the semiconductor device, and FIG. 26B is a conceptual diagram illustrating an example of the semiconductor device. As a transistor 4162 included in the semiconductor device, any of the transistors described in the above embodiments can be used. A capacitor 4254 can be formed through the same process and at the same time as the transistor 4162 in a manner similar to that of the capacitor 3204 described in Embodiment 5.

In the semiconductor device illustrated in FIG. 26A, a bit line BL is electrically connected to a source electrode of the transistor 4162, a word line WL is electrically connected to a gate electrode of the transistor 4162, and a drain electrode of the transistor 4162 is electrically connected to one of terminals of the capacitor 4254.

Next, writing and storing of data in the semiconductor device (a memory cell 4250) illustrated in FIG. 26A are described.

First, the potential of the word line WL is set to a potential at which the transistor 4162 is turned on, and the transistor 4162 is turned on. Accordingly, the potential of the bit line BL is supplied to the one of the terminals of the capacitor 4254 (writing). After that, the potential of the word line WL is set to a potential at which the transistor 4162 is turned off, so that the transistor 4162 is turned off. Thus, the potential of the one of the terminals of the capacitor 4254 is held (holding).

In addition, the transistor 4162 including an oxide semiconductor has an extremely small off-state current. For that reason, the potential of the first terminal of the capacitor 4254 (or a charge accumulated in the capacitor 4254) can be held for an extremely long time by turning off the transistor 4162.

Next, reading of data is described. When the transistor 4162 is turned on, the bit line BL which is in a floating state and the capacitor 4254 are electrically connected to each other, and the charge is redistributed between the bit line BL and the capacitor 4254. As a result, the potential of the bit line BL is changed. The amount of change in potential of the bit line BL varies depending on the potential of the first terminal of the capacitor 4254 (or the charge accumulated in the capacitor 4254).

For example, the potential of the bit line BL after charge redistribution is $(C_B \times V_{B0}+C \times V)/(C_B+C)$, where V is the potential of the first terminal of the capacitor 4254, C is the capacitance of the capacitor 4254, $C_B$ is the capacitance component of the bit line BL (hereinafter also referred to as bit line capacitance), and $V_{B0}$ is the potential of the bit line BL before the charge redistribution. Therefore, it can be found that assuming that the memory cell 4250 is in either of two states in which the potentials of the first terminal of the capacitor 4254 are $V_1$ and $V_0$ ($V_1 > V_0$), the potential of the bit line BL in the case of holding the potential $V_1$ ($=(C_B \times V_{B0}+C \times V_1)/(C_B+C)$) is higher than the potential of the bit line BL in the case of holding the potential $V_0$ ($=(C_B \times V_{B0}+C \times V_0)/(C_B+C)$).

Then, by comparing the potential of the bit line BL with a predetermined potential, data can be read.

As described above, the semiconductor device illustrated in FIG. 26A can hold charge that is accumulated in the capacitor 4254 for a long time because the off-state current of the transistor 4162 is extremely small. In other words, refresh operation becomes unnecessary or the frequency of the refresh operation can be extremely low, which leads to a sufficient reduction in power consumption. Moreover, stored data can be retained for a long period even when power is not supplied.

Next, the semiconductor device illustrated in FIG. 26B is described.

The semiconductor device illustrated in FIG. 26B includes a memory cell array 4251 (memory cell arrays 4251a and 4251b) including the plurality of memory cells 4250 illustrated in FIG. 26A as memory circuits in the upper portion, and a peripheral circuit 4253 in the lower portion, which is necessary for operating the memory cell array 4251. Note that the peripheral circuit 4253 is electrically connected to the memory cell array 4251.

In the structure illustrated in FIG. 26B, the peripheral circuit 4253 can be provided under the memory cell arrays 4251a and 4251b. Thus, the size of the semiconductor device can be reduced.

It is preferable that a semiconductor material of the transistor provided in the peripheral circuit 4253 be different from that of the transistor 4162. For example, silicon, germanium, silicon germanium, silicon carbide, or gallium arsenide can be used, and a single crystal semiconductor is preferably used. Alternatively, an organic semiconductor material or the like may be used. A transistor including such a semiconductor material can operate at sufficiently high speed. Thus, the transistor enables a variety of circuits (e.g., a logic circuit and a driver circuit) which need to operate at high speed to be favorably obtained.

Note that FIG. 26B illustrates, as an example, the semiconductor device in which the memory cell array 4251 has a stack of the memory cell array 4251a and the memory cell array 4251b; however, the number of stacked memory cell arrays is not limited to two. For the memory cell array 4251, a stack of three or more memory cell arrays may be used, or only one memory cell array may be used.

The transistor 4162 is formed using an oxide semiconductor, and any of the transistors described in the above embodiments can be used as the transistor 4162. Since the off-state current of the transistor including an oxide semiconductor is small, stored data can be retained for a long period. In other words, the frequency of refresh operation can be extremely low, which leads to a sufficient reduction in power consumption.

A semiconductor device having a novel feature can be obtained by being provided with both a peripheral circuit which includes the transistor including a material other than an oxide semiconductor (in other words, a transistor capable of operating at sufficiently high speed) and a memory circuit which includes the transistor including an oxide semiconductor (in a broader sense, a transistor whose off-state current is sufficiently small). In addition, with a structure where the peripheral circuit and the memory circuit are stacked, an increase in the degree of integration of the semiconductor device can be achieved.

As described above, a miniaturized and highly-integrated semiconductor device having high electrical characteristics can be provided.

Note that this embodiment can be combined as appropriate with any of the other embodiments and examples in this specification.

(Embodiment 8)

In this embodiment, examples of an electronic device and an electric device which can use any of the transistors described in the above embodiments are described.

Any of the transistors described in the above embodiments can be applied to a variety of electronic devices (including game machines). Examples of the electronic devices include display devices of televisions, monitors, and the like, lighting devices, desktop personal computers and notebook personal computers, word processors, image reproduction devices which reproduce still images or moving images stored in recording media such as digital versatile discs (DVDs), portable compact disc (CD) players, radio receivers, tape recorders, headphone stereos, stereos, cordless phone handsets, transceivers, mobile phones, car phones, portable game machines, calculators, portable information terminals, electronic notebooks, e-book readers, electronic translators, audio input devices, cameras such as video cameras and digital still cameras, electric shavers, IC chips, high-frequency heating apparatuses such as microwave ovens, electric rice cookers, electric washing machines, electric vacuum cleaners, air-conditioning systems such as air conditioners, dishwashers, dish dryers, clothes dryers, futon dryers, electric refrigerators, electric freezers, electric refrigerator-freezers, freezers for preserving DNA, radiation counters, medical equipment such as dialyzers, alarm devices such as smoke detectors, gas alarm devices, and security alarm devices, industrial equipment such as guide lights, traffic lights, belt conveyors, elevators, escalators, industrial robots, and power storage systems. In addition, moving objects and the like driven by oil engines and electric motors using power from non-aqueous secondary batteries are also included in the category of electronic devices. Examples of the moving objects include electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats or ships, submarines, helicopters, aircrafts, rockets, artificial satellites, space probes, planetary probes, and spacecrafts. Specific examples of these electronic devices are illustrated in FIG. 27, FIG. 28, FIGS. 29A to 29C, and FIGS. 30A to 30C.

First, as an example of the alarm device, a structure of a fire alarm is described with reference to FIG. 27. A fire alarm in this specification refers to any device which raises an alarm over fire occurrence instantly, and for example, a residential fire alarm, an automatic fire alarm system, and a fire detector used for the automatic fire alarm system are included in its category.

Figure 27:
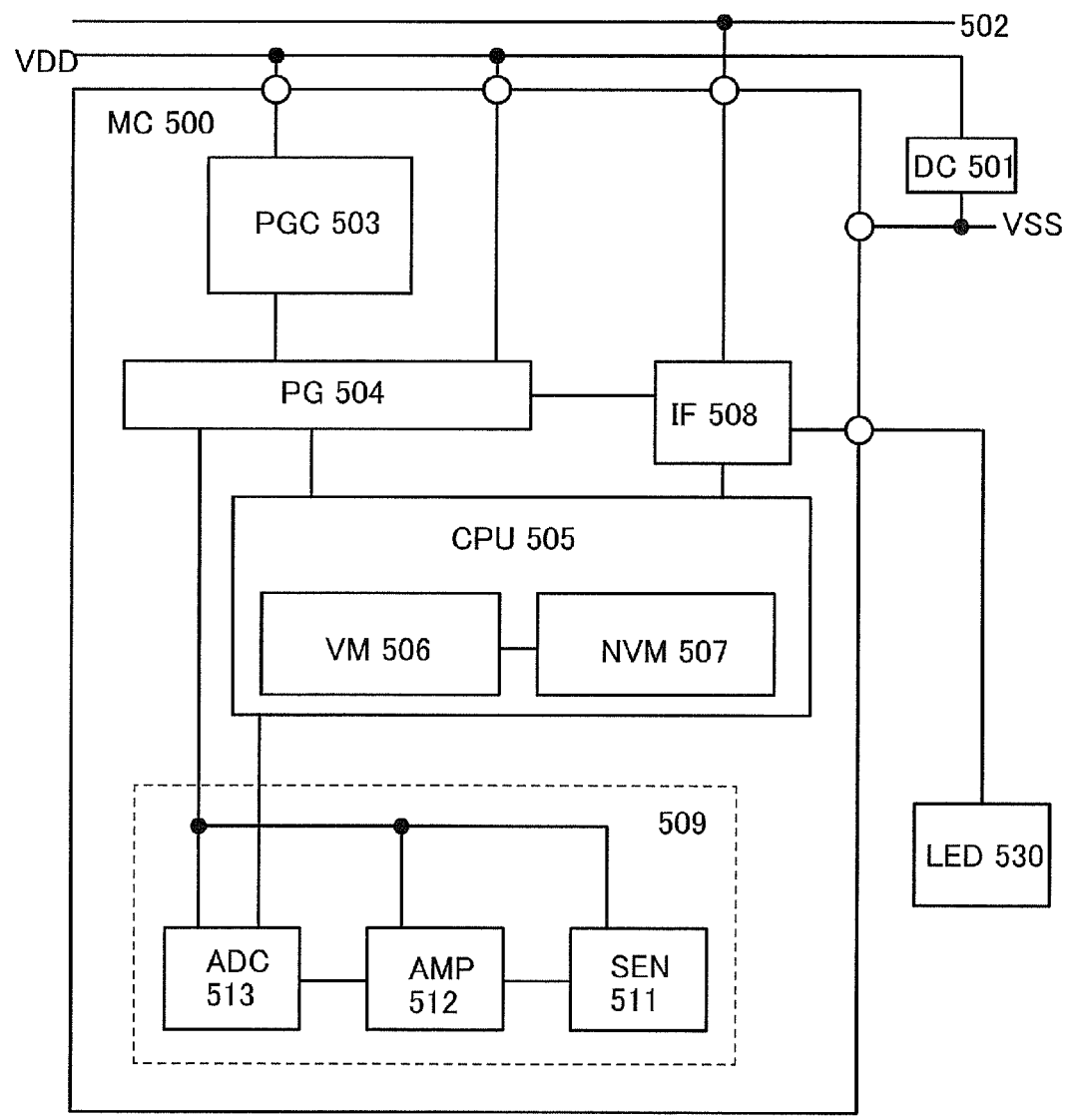
FIG. 27 is a block diagram of a semiconductor device.

An alarm device illustrated in FIG. 27 includes at least a microcomputer 500. Here, the microcomputer 500 is provided in the alarm device. The microcomputer 500 includes a power gate controller 503 electrically connected to a high potential power supply line VDD, a power gate 504 electrically connected to the high potential power supply line VDD and the power gate controller 503, a CPU (central processing unit) 505 electrically connected to the power gate 504, and a sensor portion 509 electrically connected to the power gate 504 and the CPU 505. Further, the CPU 505 includes a volatile memory portion 506 and a nonvolatile memory portion 507.

The CPU 505 is electrically connected to a bus line 502 through an interface 508. The interface 508 as well as the CPU 505 is electrically connected to the power gate 504. As a bus standard of the interface 508, an I²C bus can be used, for example. A light-emitting element 530 electrically connected to the power gate 504 through the interface 508 is provided in the alarm device described in this embodiment.

The light-emitting element 530 is preferably an element which emits light with high directivity, and for example, an organic EL element, an inorganic EL element, or a light-emitting diode (LED) can be used.

The power gate controller 503 includes a timer and controls the power gate 504 with the use of the timer. The power gate 504 allows or stops supply of power from the high potential power supply line VDD to the CPU 505, the sensor portion 509, and the interface 508, in accordance with the control by the power gate controller 503. Here, as an example of the power gate 504, a switching element such as a transistor can be given.

With the use of the power gate controller 503 and the power gate 504, power is supplied to the sensor portion 509, the CPU 505, and the interface 508 in a period during which the amount of light is measured, and supply of power to the sensor portion 509, the CPU 505, and the interface 508 can be stopped during an interval between measurement periods. The alarm device operates in such a manner, whereby a reduction in power consumption of the alarm device can be achieved compared with that of the case where power is continuously supplied to the above structures.

In the case where a transistor is used as the power gate 504, it is preferable to use a transistor which has an extremely small off-state current and is used for the nonvolatile memory portion 507, for example, a transistor including an oxide semiconductor. With the use of such a transistor, leakage current can be reduced when supply of power is stopped by the power gate 504, so that a reduction in power consumption of the alarm device can be achieved.

A direct-current power source 501 may be provided in the alarm device described in this embodiment so that power is supplied from the direct-current power source 501 to the high potential power supply line VDD. An electrode of the direct-current power source 501 on a high potential side is electrically connected to the high potential power supply line VDD, and an electrode of the direct-current power source 501 on a low potential side is electrically connected to a low potential power supply line VSS. The low potential power supply line VSS is electrically connected to the microcomputer 500. Here, the high potential power supply line VDD is supplied with a high potential H. The low potential power supply line VSS is supplied with a low potential L, for example, a ground potential (GND).

In the case where a battery is used as the direct-current power source 501, for example, a battery case including an electrode electrically connected to the high potential power supply line VDD, an electrode electrically connected to the low potential power supply line VSS, and a housing which can hold the battery may be provided in a housing. Note that the alarm device described in this embodiment does not necessarily include the direct-current power source 501 and may have, for example, a structure in which power is supplied from an alternate-current power source provided outside the alarm device through a wiring.

As the above battery, a secondary battery such as a lithium ion secondary battery (also called a lithium ion storage battery or a lithium ion battery) can be used. Further, a solar battery is preferably provided so that the secondary battery can be charged.

The sensor portion 509 measures a physical quantity relating to an abnormal situation and transmits a measurement value to the CPU 505. A physical quantity relating to an abnormal situation depends on the usage of the alarm device, and in an alarm device functioning as a fire alarm, a physical quantity relating to a fire is measured. Accordingly, the sensor portion 509 measures the amount of light as a physical quantity relating to a fire and senses smoke.

The sensor portion 509 includes an optical sensor 511 electrically connected to the power gate 504, an amplifier 512 electrically connected to the power gate 504, and an AD converter 513 electrically connected to the power gate 504 and the CPU 505. The optical sensor 511, the amplifier 512, and the AD converter 513 which are provided in the sensor portion 509, and the light-emitting element 530 operate when the power gate 504 allows supply of power to the sensor portion 509.

Figure 28:
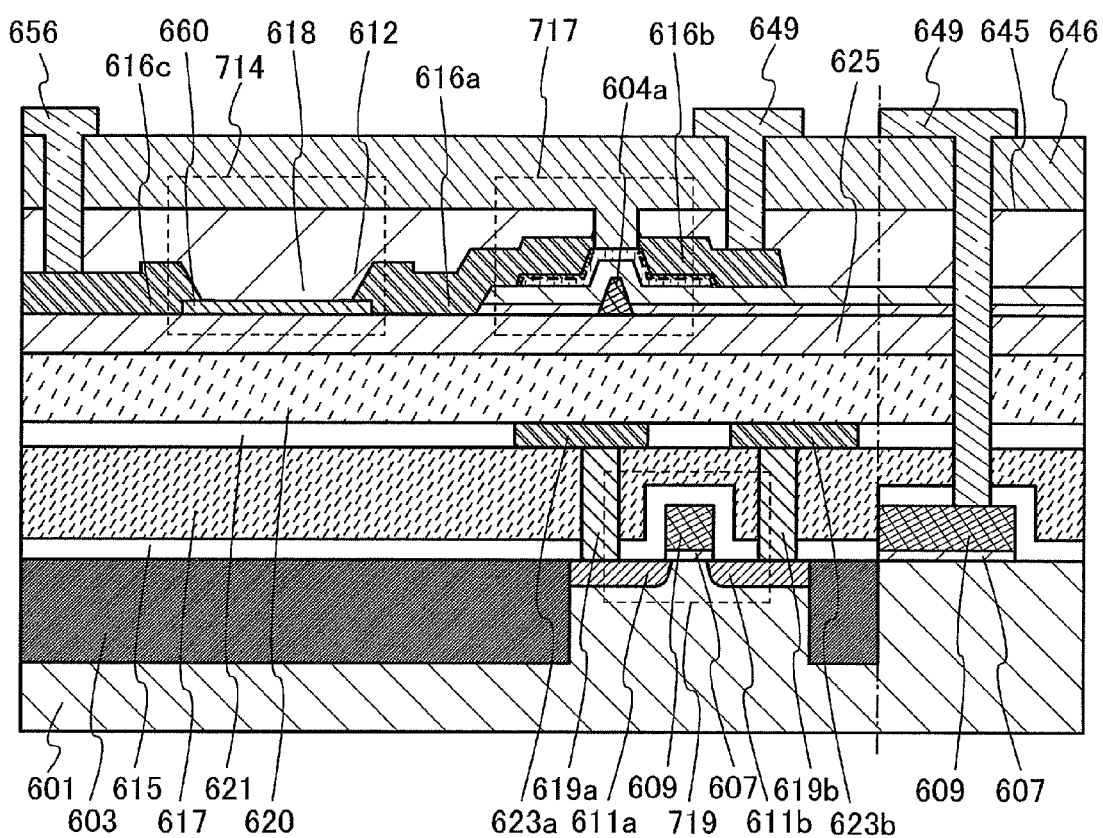
FIG. 28 is a cross-sectional view of a semiconductor device.

Here, FIG. 28 illustrates part of the cross section of the alarm device illustrated in FIG. 27. In the alarm device, element isolation regions 603 are formed in a p-type semiconductor substrate 601, and an n-channel transistor 719 including a gate insulating film 607, a gate electrode layer 609, n-type impurity regions 611a and 611b, an insulating film 615, and an insulating film 617 is formed. Here, the n-channel transistor 719 is formed using a semiconductor other than an oxide semiconductor, such as single crystal silicon, so that the n-channel transistor 719 can operate at sufficiently high speed. Accordingly, a volatile memory portion of a CPU that can achieve high-speed access can be formed.

In addition, contact plugs 619a and 619b are formed in openings which are formed by partly etching the insulating films 615 and 617, and an insulating film 621 having groove portions is formed over the insulating film 617 and the contact plugs 619a and 619b.

Wirings 623a and 623b are formed in the groove portions of the insulating film 621, and an insulating film 620 formed by a sputtering method, a CVD method, or the like is provided over the insulating film 621 and the wirings 623a and 623b.

An oxide insulating film 625 formed by a sputtering method, a CVD method, or the like is provided over the insulating film 620, and a second transistor 717 and a photoelectric conversion element 714 are provided over the oxide insulating film 625.

As the second transistor 717, the transistor 150 described in Embodiment 1 can be used.

In this embodiment, the second transistor 717 is in contact with a wiring 649 through a drain electrode layer 616b.

Although the transistor 150 described in Embodiment 1 is used as the second transistor 717 here, the present invention is not limited to this and any of the transistors described in the other embodiments can be used.

The optical sensor 511 includes the photoelectric conversion element 714, a capacitor, a first transistor, the second transistor 717, a third transistor, and the n-channel transistor 719. As the photoelectric conversion element 714, a photodiode can be used here, for example.

One of terminals of the photoelectric conversion element 714 is electrically connected to the low potential power supply line VSS, and the other of the terminals thereof is electrically connected to one of a source electrode layer 616a and the drain electrode layer 616b of the second transistor 717.

A gate electrode layer 604a of the second transistor 717 is supplied with an electric charge accumulation control signal Tx, and the other of the source electrode layer 616a and the drain electrode layer 616b is electrically connected to one of a pair of electrodes of the capacitor, one of a source electrode and a drain electrode of the first transistor, and the gate electrode of the n-channel transistor 719 (hereinafter the node is referred to as a node FD in some cases).

The other of the pair of electrodes of the capacitor is electrically connected to the low potential power supply line VSS. A gate electrode of the first transistor is supplied with a reset signal Res, and the other of the source electrode and the drain electrode thereof is electrically connected to the high potential power supply line VDD.

One of a source electrode and a drain electrode of the n-channel transistor 719 is electrically connected to one of a source electrode and a drain electrode of the third transistor and the amplifier 512. The other of the source electrode and the drain electrode of the n-channel transistor 719 is electrically connected to the high potential power supply line VDD. A gate electrode of the third transistor is supplied with a bias signal Bias, and the other of the source electrode and the drain electrode thereof is electrically connected to the low potential power supply line VSS.

Note that the capacitor is not necessarily provided. For example, in the case where parasitic capacitance of the n-channel transistor 719 or the like is sufficiently large, a structure without the capacitor may be employed.

Further, as each of the first transistor and the second transistor 717, the transistor having an extremely small off-state current is preferably used. As the transistor having an extremely small off-state current, a transistor including an oxide semiconductor is preferably used. With such a structure, the potential of the node FD can be held for a long time.

In the structure in FIG. 28, the photoelectric conversion element 714 is electrically connected to the second transistor 717 and is provided over the oxide insulating film 625.

The photoelectric conversion element 714 includes a semiconductor film 660 provided over the oxide insulating film 625, and the source electrode layer 616a and an electrode 616c which are in contact with a top surface of the semiconductor film 660. The source electrode layer 616a is an electrode functioning as the source electrode or the drain electrode of the second transistor 717 and electrically connects the photoelectric conversion element 714 to the second transistor 717.

Over the semiconductor film 660, the source electrode layer 616a, and the electrode 616c, an insulating film 612 and an insulating film 646 are provided. Further, a wiring 656 is formed over the insulating film 646 and is in contact with the electrode 616c through an opening provided in the insulating film 612 and the insulating film 646.

The electrode 616c can be formed in steps similar to those of the source electrode layer 616a and the drain electrode layer 616b, and the wiring 656 can be formed in steps similar to those of the wiring 649.

As the semiconductor film 660, a semiconductor film which can perform photoelectric conversion is provided, and for example, silicon or germanium can be used. In the case of using silicon, the semiconductor film 660 functions as an optical sensor which senses visible light. Further, there is a difference, between silicon and germanium, in wavelengths of electromagnetic waves that can be absorbed. When the semiconductor film 660 includes germanium, a sensor which mainly senses an infrared ray can be obtained.

In the above manner, the sensor portion 509 including the optical sensor 511 can be incorporated into the microcomputer 500, so that the number of components can be reduced and the size of the housing of the alarm device can be reduced. Note that in the case where the place of the optical sensor or the photoelectric conversion element needs a high degree of freedom, the optical sensor or the photoelectric conversion element may be externally provided so as to be electrically connected to the microcomputer 500.

In the alarm device including the above-described IC chip, the CPU 505 in which a plurality of circuits including any of the transistors described in the above embodiments are combined and mounted on one IC chip is used.

Figure 29A:
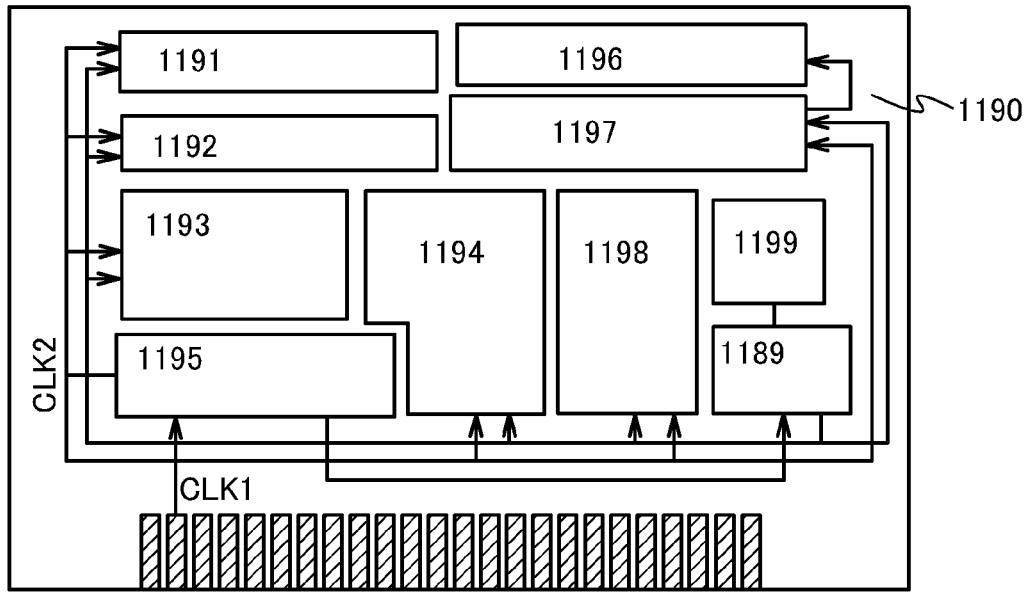
FIGS. 29A to 29C are block diagrams of a semiconductor device.
Figure 29B:
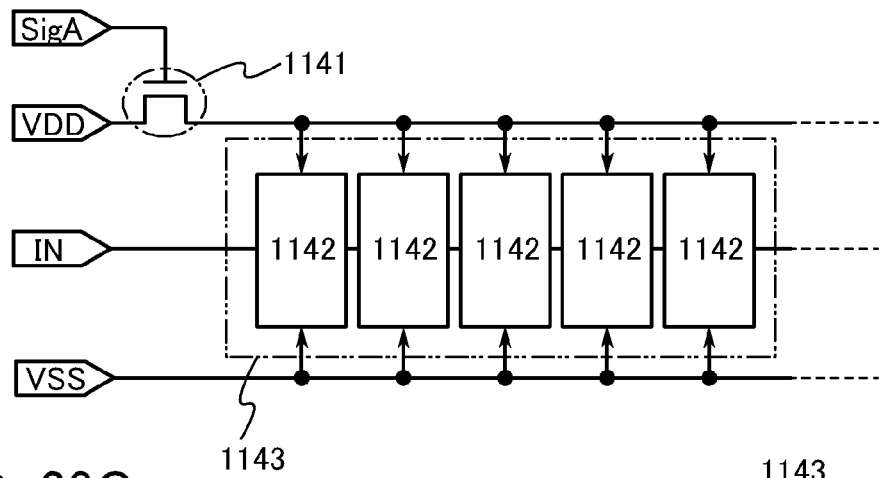
Figure 29C:
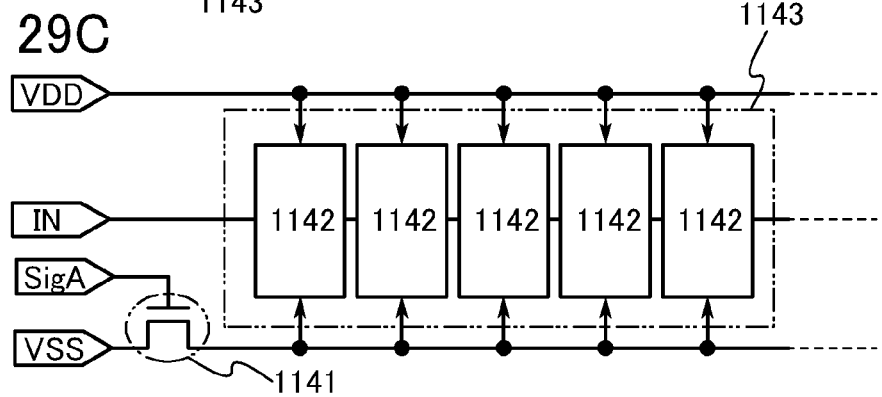

FIGS. 29A to 29C are block diagrams illustrating a specific configuration of a CPU at least partly including any of the transistors described in the above embodiments.

The CPU illustrated in FIG. 29A includes an arithmetic logic unit (ALU) 1191, an ALU controller 1192, an instruction decoder 1193, an interrupt controller 1194, a timing controller 1195, a register 1196, a register controller 1197, a bus interface 1198 (BUS I/F), a rewritable ROM 1199, and an ROM interface (ROM I/F) 1189 over a substrate 1190. A semiconductor substrate, an SOI substrate, a glass substrate, or the like is used as the substrate 1190. The ROM 1199 and the ROM interface 1189 may be provided over a separate chip. Needless to say, the CPU in FIG. 29A is just an example in which the configuration has been simplified, and an actual CPU may have various configurations depending on the application.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register

1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the internal clock signal CLK2 to the above circuits.

In the CPU illustrated in FIG. 29A, a memory cell is provided in the register 1196. As the memory cell of the register 1196, any of the transistors described in the above embodiments can be used.

In the CPU illustrated in FIG. 29A, the register controller 1197 selects operation of storing data in the register 1196 in accordance with an instruction from the ALU 1191. That is, the register controller 1197 selects whether data is stored by a flip-flop or by a capacitor in the memory cell included in the register 1196. When data storing by the flip-flop is selected, a power supply voltage is supplied to the memory cell in the register 1196. When data storing by the capacitor is selected, the data is rewritten in the capacitor, and supply of power supply voltage to the memory cell in the register 1196 can be stopped.

The power supply can be stopped by a switching element provided between a memory cell group and a node to which a power supply potential VDD or a power supply potential VSS is supplied, as illustrated in FIG. 29B or FIG. 29C. Circuits illustrated in FIGS. 29B and 29C are described below.

FIGS. 29B and 29C each illustrate an example of the configuration of a memory circuit in which any of the transistors described in the above embodiments is used as a switching element which controls supply of a power supply potential to a memory cell.

The memory device illustrated in FIG. 29B includes a switching element 1141 and a memory cell group 1143 including a plurality of memory cells 1142. Specifically, as each of the memory cells 1142, any of the transistors described in the above embodiments can be used. Each of the memory cells 1142 included in the memory cell group 1143 is supplied with the high-level power supply potential VDD via the switching element 1141. Further, each of the memory cells 1142 included in the memory cell group 1143 is supplied with a potential of a signal IN and the low-level power supply potential VSS.

In FIG. 29B, any of the transistors described in the above embodiments is used as the switching element 1141, and the switching of the transistor is controlled by a signal SigA supplied to a gate electrode layer thereof.

Note that FIG. 29B illustrates the configuration in which the switching element 1141 includes only one transistor; however, without particular limitation thereon, the switching element 1141 may include a plurality of transistors. In the case where the switching element 1141 includes a plurality of transistors which function as switching elements, the plurality of transistors may be connected to each other in parallel, in series, or in combination of parallel connection and series connection.

Although the switching element 1141 controls the supply of the high-level power supply potential VDD to each of the memory cells 1142 included in the memory cell group 1143 in FIG. 29B, the switching element 1141 may control the supply of the low-level power supply potential VSS.

In FIG. 29C, an example of a memory device in which each of the memory cells 1142 included in the memory cell group 1143 is supplied with the low-level power supply potential VSS via the switching element 1141 is illustrated. The supply of the low-level power supply potential VSS to each of the memory cells 1142 included in the memory cell group 1143 can be controlled by the switching element 1141.

When a switching element is provided between a memory cell group and a node to which the power supply potential VDD or the power supply potential VSS is supplied, data can be stored even in the case where an operation of a CPU is temporarily stopped and the supply of the power supply voltage is stopped; accordingly, power consumption can be reduced. Specifically, for example, while a user of a personal computer does not input data to an input device such as a keyboard, the operation of the CPU can be stopped, so that the power consumption can be reduced.

Although the CPU is given as an example here, the transistor can also be applied to an LSI such as a digital signal processor (DSP), a custom LSI, or a field programmable gate array (FPGA).

Figure 30A:
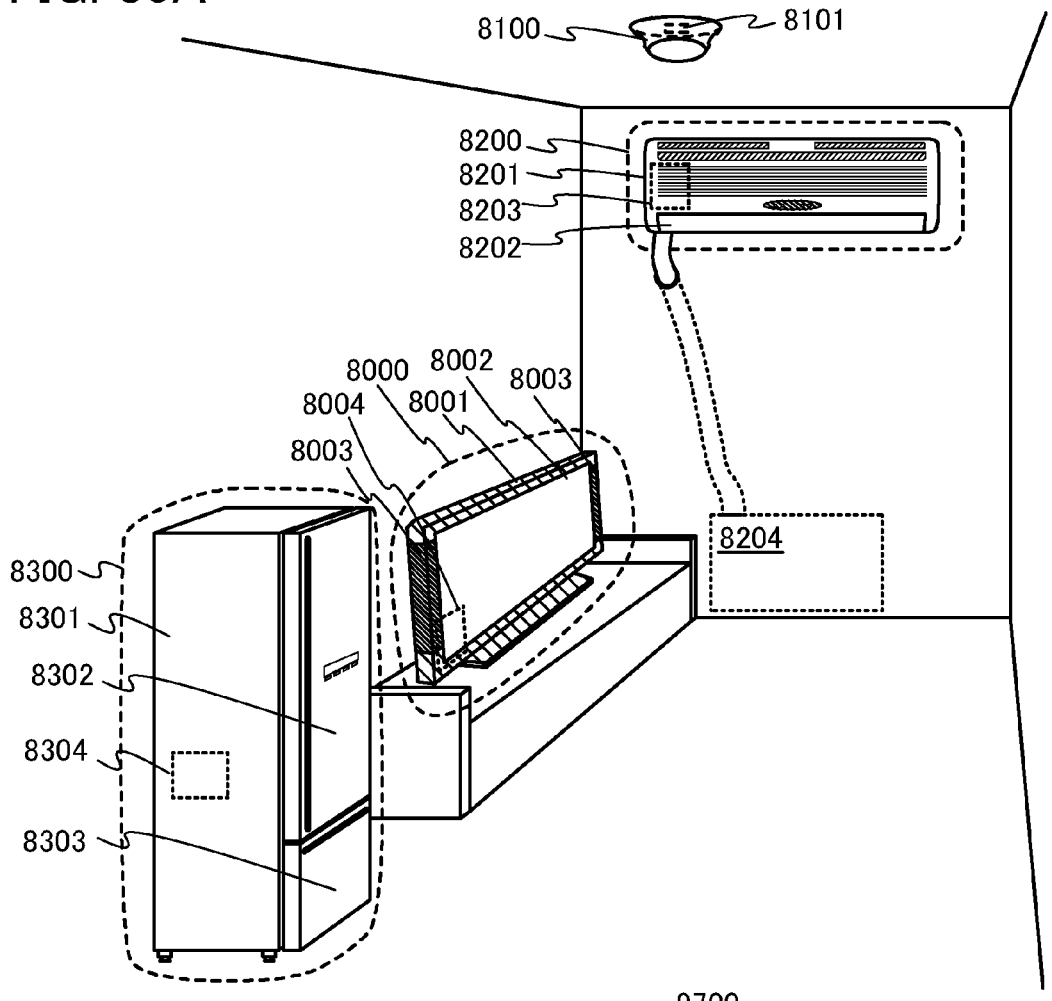
FIGS. 30A to 30C illustrate electronic devices to which semiconductor devices can be applied.

In a television device 8000 in FIG. 30A, a display portion 8002 is incorporated in a housing 8001. The display portion 8002 displays an image and a speaker portion 8003 can output sound. The above-described display device can be used as the display portion 8002.

The television device 8000 may be provided with a receiver, a modem, and the like. With the receiver, the television device 8000 can receive general television broadcasting. Furthermore, when the television device 8000 is connected to a communication network by wired or wireless connection via the modem, one-way (from a transmitter to a receiver) or two-way (between a transmitter and a receiver, between receivers, or the like) data communication can be performed.

In addition, the television set 8000 may include a CPU for performing information communication or a memory. The above-described memory or CPU can be used for the television set 8000.

In FIG. 30A, an alarm device 8100 is a residential fire alarm including a sensor portion and a microcomputer 8101. Note that the microcomputer 8101 is an example of an electric device including a CPU in which any of the transistors described in the above embodiments is used.

In FIG. 30A, an air conditioner which includes an indoor unit 8200 and an outdoor unit 8204 is an example of an electric device including the CPU in which any of the transistors described in the above embodiments is used. Specifically, the indoor unit 8200 includes a housing 8201, an air outlet 8202, a CPU 8203, and the like. Although the CPU 8203 is provided in the indoor unit 8200 in FIG. 30A, the CPU 8203 may be provided in the outdoor unit 8204. Alternatively, the CPU 8203 may be provided in both the indoor unit 8200 and the outdoor unit 8204. By using any of the transistors described in the above embodiments as the CPU in the air conditioner, a reduction in power consumption of the air conditioner can be achieved.

In FIG. 30A, an electric refrigerator-freezer 8300 is an example of an electric device including the CPU in which any of the transistors described in the above embodiments is used. Specifically, the electric refrigerator-freezer 8300 includes a housing 8301, a door for a refrigerator 8302, a door for a freezer 8303, a CPU 8304, and the like. In FIG. 30A, the CPU 8304 is provided in the housing 8301. When any of the transistors described in the above embodiments is used as the CPU 8304 of the electric refrigerator-freezer 8300, a reduction in power consumption of the electric refrigerator-freezer 8300 can be achieved.

Figure 30B:
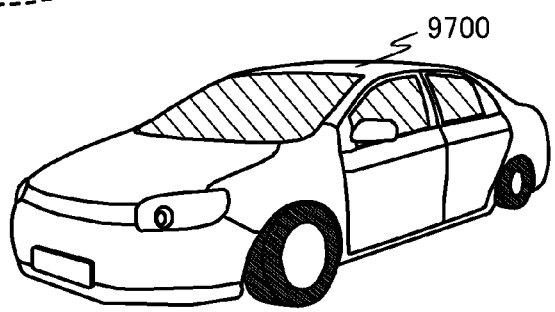
Figure 30C:
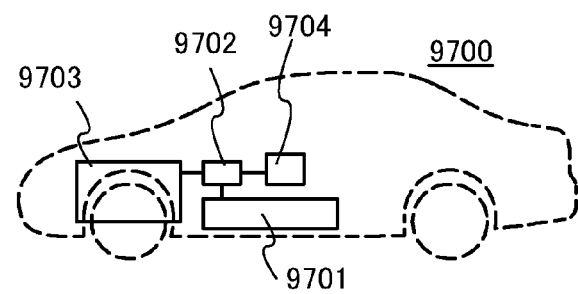

FIGS. 30B and 30C illustrate an example of an electric vehicle which is an example of an electric device. An electric vehicle 9700 is equipped with a secondary battery 9701. The output of the electric power of the secondary battery 9701 is adjusted by a control circuit 9702 and the electric power is supplied to a driving device 9703. The control circuit 9702 is controlled by a processing unit 9704 including a ROM, a RAM, a CPU, or the like which is not illustrated. When any of the transistors described in the above embodiments is used as the CPU in the electric vehicle 9700, a reduction in power consumption of the electric vehicle 9700 can be achieved.

The driving device 9703 includes a DC motor or an AC motor either alone or in combination with an internal-combustion engine. The processing unit 9704 outputs a control signal to the control circuit 9702 based on input data such as data of operation (e.g., acceleration, deceleration, or stop) by a driver or data during driving (e.g., data on an upgrade or a downgrade, or data on a load on a driving wheel) of the electric vehicle 9700. The control circuit 9702 adjusts the electric energy supplied from the secondary battery 9701 in accordance with the control signal of the processing unit 9704 to control the output of the driving device 9703. In the case where the AC motor is mounted, although not illustrated, an inverter which converts direct current into alternate current is also incorporated.

Note that this embodiment can be combined as appropriate with any of the other embodiments and examples in this specification.

This application is based on Japanese Patent Application serial No. 2013-010829 filed with Japan Patent Office on Jan. 24, 2013, the entire contents of which are hereby incorporated by reference.

What is claimed is:

1. A semiconductor device comprising:
   a gate electrode over and in contact with an insulating surface;
   a base insulating film over and in contact with the insulating surface;
   a gate insulating film over the gate electrode and the base insulating film;
   an oxide semiconductor film over the gate insulating film; and
   a source electrode and a drain electrode electrically connected to the oxide semiconductor film,
   wherein a part of the gate electrode protrudes from a top surface of the base insulating film, and
   wherein a thickness of the oxide semiconductor film is smaller than a thickness of the part of the gate electrode.

2. The semiconductor device according to claim 1, wherein at least one of the base insulating film and the gate insulating film comprises silicon oxide.

3. The semiconductor device according to claim 1, wherein the oxide semiconductor film has a depressed portion.

4. The semiconductor device according to claim 1, wherein the oxide semiconductor film is a multilayer film.

5. A semiconductor device comprising:
   a gate electrode over an insulating surface;
   a gate insulating film over the gate electrode;
   an oxide semiconductor film over the gate insulating film;
   a source electrode and a drain electrode electrically connected to the oxide semiconductor film; and
   a first insulating film over the source electrode and the drain electrode,
   wherein end portions of the first insulating film are aligned with an end portion of the source electrode and an end portion of the drain electrode.

6. The semiconductor device according to claim 5, wherein at least one of the gate insulating film and the first insulating film comprises silicon oxide.

7. The semiconductor device according to claim 5, wherein the oxide semiconductor film has a depressed portion.

8. The semiconductor device according to claim 5, wherein the oxide semiconductor film is a multilayer film.

9. The semiconductor device according to claim 5, further comprising a second insulating film over the first insulating film,
   wherein the second insulating film overlaps a channel formation region of the oxide semiconductor film.

10. A method for manufacturing a semiconductor device, comprising the steps of:
    forming a gate electrode over an insulating surface;
    forming a gate insulating film over the gate electrode;
    forming an oxide semiconductor film over the gate insulating film;
    forming a conductive film over the oxide semiconductor film;
    forming a first insulating film over the conductive film;
    planarizing the first insulating film to expose a region of the conductive film which overlaps with the gate electrode; and
    etching the conductive film using the first insulating film as a mask, so that a source electrode and a drain electrode are formed.

11. The method for manufacturing a semiconductor device according to claim 10, further comprising a step of adding an oxygen to the oxide semiconductor film.

12. The method for manufacturing a semiconductor device according to claim 10, further comprising a step of forming a second insulating film over the first insulating film.

13. The method for manufacturing a semiconductor device according to claim 10, further comprising a step of etching part of the oxide semiconductor film after the step of etching the conductive film.

14. The method for manufacturing a semiconductor device according to claim 10, further comprising a step of etching the planarized first insulating film.

15. A method for manufacturing a semiconductor device, comprising the steps of:
    forming a gate electrode over an insulating surface;
    forming a base insulating film over the insulating surface;
    forming a gate insulating film over the gate electrode and the base insulating film;
    forming an oxide semiconductor film over the gate insulating film;
    forming a conductive film over the oxide semiconductor film;
    forming a first insulating film over the conductive film;
    planarizing the first insulating film to expose a top surface of the conductive film; and
    etching the conductive film using the first insulating film as a mask, so that a source electrode and a drain electrode are formed.

16. The method for manufacturing a semiconductor device according to claim 15, wherein the base insulating film is formed by forming a first base insulating film over the insulating surface, planarizing the first base insulating film to expose the gate electrode, and etching the planarized first base insulating film.

17. The method for manufacturing a semiconductor device according to claim 15, further comprising a step of adding an oxygen to the oxide semiconductor film.

18. The method for manufacturing a semiconductor device according to claim 15, further comprising a step of forming a second insulating film over the first insulating film.

19. The method for manufacturing a semiconductor device according to claim 15, further comprising a step of etching part of the oxide semiconductor film after the step of etching the conductive film.

20. The method for manufacturing a semiconductor device according to claim 15, further comprising a step of etching the planarized first insulating film.

* * * * *